United States Patent
Mikawa et al.

(10) Patent No.: US 10,995,421 B2
(45) Date of Patent: May 4, 2021

(54) CRYSTAL OF NITRIDE OF GROUP-13 METAL ON PERIODIC TABLE, AND METHOD FOR PRODUCING THE SAME

(71) Applicant: Mitsubishi Chemical Corporation, Tokyo (JP)

(72) Inventors: Yutaka Mikawa, Ibaraki (JP); Hideo Namita, Ibaraki (JP); Hirotaka Ikeda, Ibaraki (JP); Kazunori Kamada, Ibaraki (JP); Hideo Fujisawa, Ibaraki (JP); Atsuhiko Kojima, Ibaraki (JP)

(73) Assignee: MITSUBISHI CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/296,899

(22) Filed: Mar. 8, 2019

(65) Prior Publication Data

US 2019/0203379 A1    Jul. 4, 2019

Related U.S. Application Data

(63) Continuation of application No. 15/841,985, filed on Dec. 14, 2017, now Pat. No. 10,309,038, which is a (Continued)

(30) Foreign Application Priority Data

Feb. 22, 2013  (JP) ................. 2013-033533
Feb. 22, 2013  (JP) ................. 2013-033534
Mar. 26, 2013  (JP) ................. 2013-064732

(51) Int. Cl.
*C30B 29/40* (2006.01)
*C30B 7/10* (2006.01)

(52) U.S. Cl.
CPC ............ *C30B 29/406* (2013.01); *C30B 7/105* (2013.01)

(58) Field of Classification Search
None
See application file for complete search history.

(56) References Cited

U.S. PATENT DOCUMENTS

2002/0011599 A1  1/2002  Motoki et al.
2006/0174815 A1  8/2006  Butcher
(Continued)

FOREIGN PATENT DOCUMENTS

EP  2 690 204   1/2014
JP  11-251253   9/1999
(Continued)

OTHER PUBLICATIONS

Suzuki et al.; Positron Annihilation Spectroscopy on Nitride-Based Semiconductors; Japanese Journal of Applied Physics; 52; 2013.*
(Continued)

*Primary Examiner* — Guinever S Gregorio
(74) *Attorney, Agent, or Firm* — Oblon, McClelland, Maier & Neustadt, L.L.P.

(57) ABSTRACT

An object of the present invention is to provide a crystal of a nitride of a Group-13 metal on the Periodic Table which has good crystallinity and has no crystal strain, and to provide a production method for the crystal. The crystal of a nitride of a Group-13 metal on the Periodic Table of the present invention, comprises oxygen atom and hydrogen atom in the crystal and has a ratio of a hydrogen concentration to an oxygen concentration therein of from 0.5 to 4.5.

9 Claims, 7 Drawing Sheets

Related U.S. Application Data continuation of application No. 14/832,348, filed on Aug. 21, 2015, now Pat. No. 9,890,474, which is a continuation of application No. PCT/JP2014/054037, filed on Feb. 20, 2014.

(56) References Cited

U.S. PATENT DOCUMENTS

| | | |
|---|---|---|
| 2008/0067523 A1 | 3/2008 | Dwilinski et al. |
| 2008/0156254 A1 | 7/2008 | Dwilinski et al. |
| 2008/0303032 A1 | 12/2008 | Dwilinski et al. |
| 2010/0148212 A1 | 6/2010 | Fujito et al. |
| 2011/0108852 A1 | 5/2011 | Fujiwara et al. |
| 2011/0163326 A1 | 7/2011 | Matsumoto |
| 2012/0000415 A1 | 1/2012 | D'Evelyn et al. |
| 2012/0251431 A1 | 10/2012 | Fujisawa et al. |
| 2012/0319129 A1 | 12/2012 | Matsumoto |
| 2013/0119401 A1 | 5/2013 | D'Evelyn et al. |
| 2014/0065360 A1 | 3/2014 | D'Evelyn |
| 2014/0147650 A1* | 5/2014 | Jiang ............ H01L 21/0237 428/220 |
| 2015/0311068 A1 | 10/2015 | Tsukada et al. |

FOREIGN PATENT DOCUMENTS

| | | |
|---|---|---|
| JP | 2000-044400 | 2/2000 |
| JP | 2003-277182 | 10/2003 |
| JP | T-2005-529484 | 9/2005 |
| JP | A-2007-134741 | 5/2007 |
| JP | 2007-184379 | 7/2007 |
| JP | 2008-521737 | 6/2008 |
| JP | 2009-263229 | 11/2009 |
| JP | 2010-13351 | 1/2010 |
| JP | 2010-515655 | 5/2010 |
| JP | A-2010-222247 | 10/2010 |
| JP | 2011-230955 | 11/2011 |
| JP | 2011-230966 | 11/2011 |
| JP | 2012-1432 | 1/2012 |
| JP | 2013-32278 | 2/2013 |
| JP | 2013-35711 | 2/2013 |
| JP | 2013-079187 | 5/2013 |
| JP | A-2014-111527 | 6/2014 |
| WO | WO2008/086000 | 7/2008 |
| WO | WO 2008/143166 | 11/2008 |
| WO | WO-A1-2009-069286 | 6/2009 |
| WO | WO 2012/128263 | 9/2012 |
| WO | WO-A1-2012-140844 | 10/2012 |

OTHER PUBLICATIONS

International Search Report dated Apr. 1, 2014 in PCT/JP2014/054037 filed Feb. 20, 2014.
R Kucharski et al. "Non-polar and semi-polar ammonothermal GaN substrates" Semicond. Sci. Techno. 27 (2012) 024007 (15pp).
Akira Uedono et al. "Characterization of Open Spaces in High -κ Materials by Monoenergetic Positron Beams" Surface Chemistry vol. 26, No. 5, pp. 268-273 (2005) (with English Abstract).
Saarinen et al.; Direct Evidence of Impurity of Ga Vacancies in GaN from Positron Annihilation Spectroscopy; Physical Review B 73, 193301; 2006.
Japanese Office Action issued in Patent Application No. 2018-088328 dated Jan. 29, 2019 w/machine translation.
R. Dwilinski, et al., "Recent achievements in AMMONO-bulk method", Journal of Crystal Growth 312 (2010) 2499 (4pp.).
JP-OA-2014-031212 issued in Patent Application No. 2014-031212 dated Oct. 3, 2017 (with machine translation), 10 pages.
Office Action as received in the corresponding JP patent application No. 2019-169413 w/English Translation, 4 pages.

* cited by examiner

CRYSTAL OF NITRIDE OF GROUP-13 METAL ON PERIODIC TABLE, AND METHOD FOR PRODUCING THE SAME

CROSS REFERENCE TO RELATED APPLICATIONS

The present application is a continuation application of U.S. patent application Ser. No. 15/841,985, filed on Dec. 14, 2017, the entire disclosure of which is incorporated herein by reference and which is a continuation application of U.S. patent application Ser. No. 14/832,348, filed on Aug. 21, 2015, the entire disclosure of which is incorporated herein by reference and which is a continuation application of PCT/JP2014/054037, filed on Feb. 20, 2014, the entire disclosure of which is incorporated herein by reference and which claims priority to Japanese Patent Application Nos. JP 2013-033533, filed on Feb. 22, 2013, the entire disclosure of which is incorporated herein by reference; JP 2013-033534, filed on Feb. 22, 2013, the entire disclosure of which is incorporated herein by reference; and JP 2013-064732, filed on Mar. 26, 2013, the entire disclosure of which is incorporated herein by reference.

TECHNICAL FIELD

The present invention relates to a crystal of a nitride of a Group-13 metal on the Periodic Table, and to a method for producing the same. Specifically, the present invention relates to a crystal of a nitride of a Group-13 metal on the Periodic Table that has an extremely good crystallinity, and to a method for producing the same.

BACKGROUND ART

Heretofore, a crystal of a nitride of a Group-13 metal on the Periodic Table such as a gallium nitride (GaN) compound or the like has a wide band gap and has a direct interband transition, and is therefore used as a semiconductor material, and the crystal is used in various semiconductor devices such as light-emitting elements falling in a relatively short wavelength range, for example, UV, blue or the like light-emitting diodes, semiconductor lasers and others, as well as other electronic elements, semiconductor sensors, etc.

Recently, a crystal of a nitride of a Group-13 metal on the Periodic Table has become used also for power semiconductor device (power devices) in addition to use thereof for light-emitting devices. Consequently, development of a crystal of a nitride of a Group-13 metal on the Periodic Table that is resistant to high voltage and large current is being promoted.

In addition, these devices are desired to be formed of a material of the same type and are desired to be produced using a high-quality semiconductor substrate (self-sustainable substrate) with few crystal defects, and production techniques for a crystal of a nitride of a Group-13 metal on the Periodic Table that can be such a semiconductor substrate have become studied actively.

As a production method for a crystal of a nitride of a Group-13 metal on the Periodic Table, there are known a vapor-phase growth method such as a hydride vapor-phase epitaxial (HVPE) method or the like, and a liquid-phase growth method such as an ammonothermal method, etc.

The HVPE method is a method where a Ga chloride and a hydride of a Group-5 element on the Periodic Table ($NH_3$) are introduced into a furnace in a hydrogen stream atmosphere and thermally decomposed therein, and the crystal formed through the thermal decomposition is deposited on a substrate (for example, see PTL 1).

On the other hand, the ammonothermal method is a method for producing a desired crystal material through dissolution-precipitation reaction of a feedstock, using a nitrogen-containing solvent such as ammonia or the like that is in a supercritical state and/or a subcritical state. In application to crystal growth, a supersaturated state is generated owing to the temperature difference using the temperature dependence of the feedstock solubility in the nitrogen-containing solvent such as ammonia or the like, and a crystal is precipitated out. Concretely, a feedstock crystal and a seed crystal are put into a pressure-tight chamber such as an autoclave or the like, then sealed up, and heated with a heater or the like to thereby form a high-temperature zone and a low-temperature zone inside the pressure-tight chamber, while, on one hand, the feedstock is dissolved with crystal growth on the other side to thereby produce a crystal (see PTL 2).

The ammonothermal method is more efficient in material utilization than the HVPE method, and is therefore advantageous in that the production cost can be reduced. In addition, the ammonothermal method makes it possible to increase the quality and the size of the crystal of a nitride of a Group-13 metal on the Periodic Table to be produced, and therefore, recently, practical applications of the method are being promoted. However, it is known that the crystal of a nitride of a Group-13 metal on the Periodic Table produced according to the ammonothermal method contains relatively large quantities of crystal defects and impurities, and such crystal defects and impurities are to be a factor of worsening the crystal quality. Consequently, for example, in NPL 1 and PTL 3 and 4, it has been proposed to improve the crystallinity of a crystal of a nitride of a Group-13 metal on the Periodic Table by controlling the physical properties of the crystal under specific conditions, for example, by controlling the dislocation density of the crystal and control the concentration of impurities therein.

On the other hand, a substrate of a crystal of a nitride of a Group-13 metal on the Periodic Table may be produced by processing, for example, by slicing the bulk crystal thereof having grown on the main plane of various types of crystals according to the above-mentioned method. However, according to a heretofore-known bulk crystal growing method, there occurs a problem in that the crystal defects and the warpage existing in the seed crystal are directly given to the bulk crystal as they are. As one method for solving the problem, there is known an ELO (epitaxial lateral overgrowth) method. The ELO method is a crystal growth method where a mask layer is formed on the main plane of a seed crystal and the crystal is laterally grown on the mask from the opening according to a vapor-phase growth method, and in the method, the dislocation is stopped owing to the lateral growth, and therefore, it is known that a layer with few crystal defects can be formed (for example, see PTL 5).

As still another method, for example, PTL 6 describes a technique of preventing dislocation that may propagate in the growth direction, by making a tabular crystal grow in the +c-axial direction from the side face of the seed crystal having a +C plane as the main plane, according to a vapor-phase growth method.

CITATION LIST

Patent Literature

PTL 1: JP-A 2000-44400
PTL 2: JP-A 2003-277182

PTL 3: JP-T 2010-515655
PTL 4: WO2012/128263
PTL 5: JP-A 11-251253
PTL 6: WO2008/143166

Non-Patent Literature

NPL 1: Semicond. Sci. Techno. 27 (2012) 024007 (p. 15)

SUMMARY OF INVENTION

Technical Problem

As described above, the crystal of a nitride of a Group-13 metal on the Periodic Table obtained according to an ammonothermal method contains relatively large quantities of crystal defects and impurities, and which has heretofore been considered to provide a risk of worsening the crystallinity of the nitride crystal. On the other hand, the impurity concentration in the crystal of a nitride of a Group-13 metal on the Periodic Table produced according to an HVPE method is extremely low, and it has been considered that the crystal would be theoretically close to a complete crystal and would have good crystal quality. However, in fact, the X-ray crystallographic crystallinity of the crystal of a nitride of a Group-13 metal on the Periodic Table is not always good, and the investigations made by the present inventors have revealed that the crystal orientation fluctuates and the crystal has strain generated therein.

To that effect, the strain generated in the crystal of a nitride of a Group-13 metal on the Periodic Table provides various problems in that not only the quality of the entire crystal is worsened owing to increase in the crystal defects such as dislocation and the like in the crystal, but also the stability of the crystal itself is worsened. In addition, in a case where the crystal is used as a semiconductor substrate, the crystallinity thereof would be worsened through heat treatment or the like, therefore providing another problem in that the quality of the crystal layer of the device structure to be laminated on the substrate would thereby be worsened.

On the other hand, also in the crystal of a nitride of a Group-13 metal on the Periodic Table produced according to an ammonothermal method, the crystal defects and the content of the impurities are tried to be reduced to thereby improve the crystallinity. However, it could not be said that the X-ray crystallographic crystallinity of the nitride crystal would be satisfactory, and further improvement has been desired.

Given the situation, the present inventors assiduously studied the liquid-phase growth method as typified by an ammonothermal method and, as a result, have found that, in a case where a bulk crystal is made to grow on the main plane of a seed crystal, not only the crystal defects and the warpage propagate from the seed crystal to the growing layer but also the growing layer is cracked owing to the propagation of the crystal defects and the warpage thereto, and after all, there occur another problem in that it is difficult to obtain a large-size and good-quality crystal. Further, in a case where the bulk crystal that has been produced according to the method is processed by slicing, polishing or the like for producing a semiconductor substrate, the crystal is cracked during the processing, therefore providing still another problem in that it is difficult to produce a semiconductor substrate at a good yield.

Consequently, for solving the prior-art problems as above, the present inventors have further investigated for the purpose of obtaining a crystal of a nitride of a Group-13 metal on the Periodic Table which has good crystallinity, which is excellent in crystal orientation, and which is free from crystal strain, and for obtaining a crystal of a nitride of a Group-13 metal on the Periodic Table which does not lose still the stability of the crystal itself even after thermal treatment, etc.

In addition, the present invention also provides a method for producing a crystal of a nitride of a Group-13 metal on the Periodic Table according to a liquid-phase growth method, which realizes production of a crystal of a nitride of a Group-13 metal on the Periodic Table having few crystal defects, warpage and cracks and capable of being prevented from cracking during processing treatment.

Solution to Problem

The present inventors have assiduously studied for the purpose of solving the above-mentioned problems and, as a result, have succeeded in producing a crystal of a nitride of a Group-13 metal on the Periodic Table in which the ratio of the oxygen concentration to the hydrogen concentration contained in the crystal falls within a specific range. Surprisingly, with that, by specifically defining the ratio of the oxygen concentration to the hydrogen concentration in the crystal, the present inventors have found that a crystal of a nitride of a Group-13 metal on the Periodic Table having extremely good crystallinity with little strain in the crystal can be obtained.

In addition, the present inventors have succeeded in producing a crystal of a nitride of a Group-13 metal on the Periodic Table of which the S-parameter in a positron annihilation spectroscopy falls within a specific range, and have found that point crystals have been introduced into the nitride crystal in a specific ratio therein. With that, surprisingly, the present inventors have further found that the crystal of a nitride of a Group-13 metal on the Periodic Table having point defects in a specific range has extremely good crystallinity with little crystal strain as compared with the crystal thereof having few point defects.

Furthermore, the present inventors have found that, when at least a part of the main plane of a seed crystal is covered with a growth-inhibiting material and when a tabular crystal is grown according to a liquid-phase growth method in the direction vertical to the main plane from the non-covered opening, then a crystal of a nitride of a Group-13 metal on the Periodic Table which has few crystal defects, warpage and cracks and which can be prevented from cracking during processing operation can be produced.

Concretely, the present invention has the following constitution.

[1] A crystal of a nitride of a Group-13 metal on the Periodic Table, comprising oxygen atom and hydrogen atom in the crystal and having a ratio of a hydrogen concentration to an oxygen concentration therein of from 0.5 to 4.5.

[2] The crystal of a nitride of a Group-13 metal on the Periodic Table according to the [1] above, wherein the hydrogen concentration is from $1.0 \times 10^{17}$ to $1.0 \times 10^{20}$ atoms/cm$^3$.

[3] The crystal of a nitride of a Group-13 metal on the Periodic Table according to the [1] or [2] above, wherein the oxygen concentration is from $1.0 \times 10^{17}$ to $5.0 \times 10^{19}$ atoms/cm$^3$.

[4] The crystal of a nitride of a Group-13 metal on the Periodic Table according to any one of the [1] to [3] above, wherein a S-parameter as measured according to a positron annihilation spectroscopy is 0.448 or more.

[5] The crystal of a nitride of a Group-13 metal on the Periodic Table according to the [4] above, wherein a positron diffusion length is from 15 to 50 nm.

[6] The crystal of a nitride of a Group-13 metal on the Periodic Table according to any one of the [1] to [5] above, wherein a dislocation density (DSD) is $5 \times 10^5$ cm$^{-2}$ or less, and a stacking fault density (SFD) is $8 \times 10$ cm$^{-1}$ or less.

[7] A substrate of a nitride of a Group-13 metal on the Periodic Table, which is formed of the crystal of a nitride of a Group-13 metal on the Periodic Table according to any one of the [1] to [6] above.

[8] A method for producing a crystal of a nitride of a Group-13 metal on the Periodic Table, comprising:

a preparation step of preparing a seed crystal, where at least a part of the main plane is covered with a growth-inhibiting material, and a growth step for performing a crystal growth of a tabular crystal of a nitride of a Group-13 metal on the Periodic Table, from a linear opening not covered with the growth-inhibiting material in the main plane of the seed crystal, in the direction vertical to the main plane of the seed crystal, according to a liquid-phase growth method.

[9] The method for producing a crystal of a nitride of a Group-13 metal on the Periodic Table according to the [8] above, wherein a width $W_1$ of the linear opening and a minimum width $W_2$ of the tabular crystal in the direction parallel to the main plane of the seed crystal satisfy a relationship of $W_2 > W_1$.

[10] The method for producing a crystal of a nitride of a Group-13 metal on the Periodic Table according to the [8] or [9] above, wherein a ratio of a minimum length $L_2$ of the tabular crystal in the direction parallel to the main plane of the seed crystal, to a length $L_1$ of the linear opening is 0.5 or more.

[11] The method for producing a crystal of a nitride of a Group-13 metal on the Periodic Table according to any one of the [8] to [10] above, wherein the ratio of the maximum height H of the tabular crystal in the direction vertical to the main plane of the seed crystal, to the length $L_1$ of the linear opening is 0.1 or more.

[12] The method for producing a crystal of a nitride of a Group-13 metal on the Periodic Table according to any one of the [8] to [11] above, wherein the seed crystal has plural linear openings, and in the growth step, the tabular crystal of a nitride of a Group-13 metal on the Periodic Table is grown in the direction vertical to the main plane from each of the plural linear openings.

[13] The method for producing a crystal of a nitride of a Group-13 metal on the Periodic Table according to the [12] above, wherein in the growth step, the crystal growth is performed, so that the tabular crystals of a nitride of a Group-13 metal on the Periodic Table having grown from the plural linear openings bond to each other at the side end faces thereof.

[14] The method for producing a crystal of a nitride of a Group-13 metal on the Periodic Table according to any one of the [8] to [13] above, wherein the main plane of the seed crystal is a nitrogen plane.

[15] The method for producing a crystal of a nitride of a Group-13 metal on the Periodic Table according to any one of the [8] to [14] above, which comprises a regrowth step of using the tabular crystal obtained in the growth step as a seed crystal to perform a crystal growth on the main surface thereof.

Advantageous Effects of Invention

According to the present invention, there can be obtained a crystal of a nitride of a Group-13 metal on the Periodic Table having extremely good crystallinity. Specifically, in the present invention, there can be obtained a good-quality crystal having few dislocations and stacking faults, excellent in crystal orientation and having few crystal strains. In addition, according to the present invention, there can be obtained a crystal of a nitride of a Group-13 metal on the Periodic Table of which the crystal stability is not lost even in a case where the crystal of a nitride of a Group-13 metal on the Periodic Table is processed for thermal treatment, etc.

To that effect, in the present invention, there can be obtained a crystal of a nitride of a Group-13 metal on the Periodic Table having good quality and excellent in crystal stability.

Further, according to the present invention, there can be obtained a crystal of a nitride of a Group-13 metal on the Periodic Table having extremely good crystallinity, and therefore there can also be obtained a substrate of a crystal of a nitride of a Group-13 metal on the Periodic Table excellent in semiconductor characteristics. Accordingly, the substrate of a crystal of a nitride of a Group-13 metal on the Periodic Table of the present invention is favorably used not only for light-emitting devices but also for power semiconductor device (power devices).

Further, according to the present invention, there can be provided a production method for a crystal of a nitride of a Group-13 metal on the Periodic Table according to a liquid-phase growth method, or that is, there can be provided a production method for a crystal of a nitride of a Group-13 metal on the Periodic Table which has few crystal defects, warpage and cracks and which can be prevented from cracking during processing operation.

DESCRIPTION OF EMBODIMENTS

Figure 1:
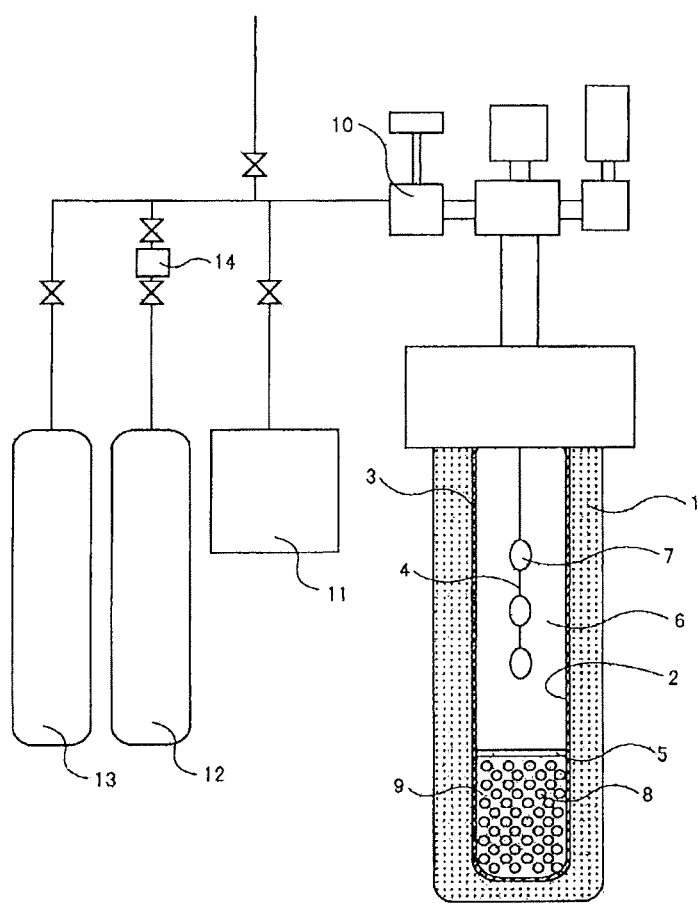
FIG. 1 is a schematic view of a crystal production apparatus usable in the present invention.

The crystal of a nitride of a Group-13 metal on the Periodic Table of the present invention and the production method for the crystal of a nitride of a Group-13 metal on the Periodic Table of the present invention are described in detail hereinunder. The Periodic Table means the Long Periodic Table of elements defined by the International Union of Pure and Applied Chemistry (IUPAC).

The explanation of the constituent features described below may be made on the basis of some typical embodiments or specific examples; however, the present invention is not limited to such embodiments.

(Definition)

In this specification, the numerical range expressed by the wording "a number to another number" means the range that falls between the former number indicating the lowermost limit of the range and the latter number indicating the uppermost limit thereof. Also in this specification, wtppm means ppm by weight.

Regarding the Miller index in the present application, the negative index is expressed by a symbol minus given the index. Further in the present specification, the expression of < . . . > is a set representation for direction; and the expression of [ . . . ] is an individual representation for direction. Contrary to these, the expression of { . . . } is a set representation for plane, and the expression of ( ) is an individual representation for plane.

First described is a relationship between the axis and the plane of a hexagonal crystal structure. A compound to be a material for the crystal of a nitride of a Group-13 metal on the Periodic Table (hereinafter this may be referred to as Group-13 metal nitride crystal) of the present invention has a hexagonal crystal structure.

In this specification, "off angle" is an angle that expresses the displacement from the index plane of a certain plane.

In this specification, the "main plane" of a ground substrate, a seed crystal or a Group-13 metal nitride crystal indicates the widest plane of the seed crystal or the Group-13 metal nitride crystal generally for crystal growth.

In this specification, "C-plane" is a plane equivalent to the {0001} plane in a hexagonal crystal structure (Wurtzite-type crystal structure), and is a polar plane. For example, this indicates a (0001) plane and a (000-1) plane that is an opposite plane thereto, and in gallium nitride (GaN), this corresponds to the Ga-plane or the N-plane.

In this specification, "M-plane" is a nonpolar plane comprehensively expressed as a {1-100} plane, and is a plane perpendicular to the m-axis. Concretely, the plane means a (1-100) plane, a (01-10) plane, a (-1010) plane, a (-1100) plane, a (0-110) plane, or a (10-10) plane. [M-plane] is generally a cleavage face.

In this specification, "A-plane" is a nonpolar plane comprehensively expressed as a {2-1-10} plane, and is a plane perpendicular to the a-axis. Concretely, the plane means a (11-20) plane, a (2-1-10) plane, a (-12-10) plane, a (-1-120) plane, a (-2110) plane, or a (1-210) plane.

In this specification, "c-axis", "m-axis" and "a-axis" each mean axes vertical to a C-plane, an M-plane and an A-plane, respectively. In this specification, "nonpolar plane" means a plane in which both a metal element of a Group-13 on the Periodic Table and a nitrogen element exist in the surface thereof and the abundance ratio thereof is 1/1. Concretely, the plane includes an M-plane and an A-plane.

In this specification, "semipolar plane" is a plane of such that, for example, in a case where the crystal of a nitride of a Group-13 metal on the Periodic Table is a hexagonal crystal and where the main plane thereof is expressed as (hklm), at least two of h, k and l are not 0 and m is not 0. In addition, the semipolar plane is a plane inclined relative to the C-plane, or that is, relative to the {0001} plane, in which both or one alone of a metal element of a Group-13 on the Periodic Table and a nitrogen element exist in the surface thereof and in which the abundance ratio of the elements is not 1/1. Preferably, h, k, l and m each are independently an integer of from −5 to 5, more preferably an integer of from −3 to 3, and preferred is a low-index plane. Concretely, for example, there are mentioned low-index planes such as a {20-21} plane, a {20-2-1} plane, a {30-31} plane, a {30-3-1} plane, a {10-11} plane, a {10-1-1} plane, a {10-12} plane, a {10-1-2} plane, a {11-22} plane, a {11-2-2} plane, a {11-21} plane, a {11-2-1} plane, etc.

In this specification, in a case where a C-plane, an M-plane, an A-plane and any other specific index plane are referred to, this includes a plane within a range having an off angle of 10° or less from each crystal axis to be measured on an accuracy level of ±0.01°. Preferably, the off angle is 5° or less, more preferably 3° or less.

(Crystal of Nitride of Group-13 Metal on Periodic Table)

As the crystal of a nitride of a Group-13 metal on the Periodic Table, for example, there is mentioned a Group-13 metal nitride crystal as typified by GaN. Further, as the nitride of a Group-13 metal on the Periodic Table includes AlN, InN, and mixed crystals thereof, in addition to GaN. The mixed crystals include AlGaN, InGaN, AlInN, AlInGaN, etc. Above all, preferred are GaN and mixed crystals containing Ga, and more preferred is GaN.

The crystal of a nitride of a Group-13 metal on the Periodic Table of the present invention can be produced through epitaxial growth of a Group-13 metal nitride crystal on a ground substrate. As the ground substrate, usable here is a crystal layer differing from the Group-13 metal nitride crystal to be epitaxially grown, but preferably, a crystal layer of the same type of crystal is used as the ground substrate. For example, in a case where the Group-13 metal nitride crystal to be epitaxially grown is a GaN crystal, it is desirable that the ground substrate is also a GaN substrate.

The crystal of a nitride of a Group-13 metal on the Periodic Table of the present invention contains oxygen atoms and hydrogen atoms in the crystal. (In this specification, the oxygen atoms and the hydrogen atoms contained in the Group-13 metal nitride crystal may be referred to simply as oxygen or hydrogen.) The ratio of oxygen to hydrogen in the crystal falls within a specific range, and the ratio of the hydrogen concentration to the oxygen concentration is from 0.5 to 4.5. Specifically, when the oxygen concentration in the crystal is referred to as O concentration, and the hydrogen concentration in the crystal is as H concentration, (H concentration/O concentration) is from 0.5 to 4.5. In the present invention, the impurity concentration in the crystal, such as the oxygen concentration, the hydrogen concentration and the like therein is an atom number concentration expressed as the number of atoms in a volume of 1 $cm^3$, and (H concentration/O concentration) indicates the atom number concentration ratio of the atoms. (H concentration/O concentration) may be 0.5 or more, and is preferably 0.7 or more, more preferably 0.8 or more, especially more preferably 1.0 or more. (H concentration/O concentration) may be 4.5 or less, and is preferably 4.0 or less, more preferably 3.5 or less, and even more preferably 2.5 or less. When the ratio of the hydrogen concentration to the oxygen concentration is defined to fall within the above range, then the crystallinity of the Group-13 metal nitride crystal can be increased and the crystal can be prevented from having strain therein. In addition, in the case, the stability of the Group-13 metal nitride crystal can also be improved. This is considered to be because, by controlling the proportion of the oxygen concentration and the hydrogen concentration in the crystal to fall within a specific range, the charges inside the crystal can be well balanced and therefore the orientation fluctuation in the alignment of the Group-13 element and the nitrogen element could be thereby reduced. The hydrogen concentration and the oxygen concentration may be measured through SIMS analysis.

The hydrogen concentration in the crystal of a nitride of a Group-13 metal on the Periodic Table of the present invention is preferably $1.0 \times 10^{17}$ atoms/$cm^3$ or more, more preferably $5.0 \times 10^{17}$ atoms/cm$^3$ or more, even more preferably $1.0 \times 10^{18}$ atoms/cm$^3$ or more. Also preferably, the hydrogen concentration is $1.0 \times 10^{20}$ atoms/cm$^3$ or less, more preferably $8.0 \times 10^{19}$ atoms/cm$^3$ or less, even more preferably $5.0 \times 10^{19}$ atoms/cm$^3$ or less.

The oxygen concentration in the crystal of a nitride of a Group-13 metal on the Periodic Table of the present invention is preferably $1.0 \times 10^{17}$ atoms/cm$^3$ or more, more preferably $5.0 \times 10^{17}$ atoms/cm$^3$ or more, even more preferably $1.0 \times 10^{18}$ atoms/cm$^3$ or more. Also preferably, the oxygen concentration is $5.0 \times 10^{19}$ atoms/cm$^3$ or less, more preferably $3.0 \times 10^{19}$ atoms/cm$^3$ or less, even more preferably $1.0 \times 10^{19}$ atoms/cm$^3$ or less. Oxygen in the Group-13 metal nitride crystal acts as a dopant, and therefore it is desirable that the oxygen concentration therein is controlled depending on the carrier concentration necessary for the Group-13 metal nitride crystal.

When oxygen is introduced into the Group-13 metal nitride crystal to have a desired concentration, the Group-13 metal on the Periodic Table such as Ga or the like is missed to form a vacancy (point defect), owing to the charge balance and the atom arrangement. This is considered to be because, through the oxygen introduction, the Group-13 metal on the Periodic Table comes to be unnecessary by the increased negative charge so that the point defect such as a Ga vacancy or the like could be formed for adjusting charge balance. To that effect, it is considered that, by the oxygen taken in the Group-13 metal nitride crystal, the vacancy (point defect) could be formed in the Group-13 metal nitride crystal. The vacancy (point defect) acts to buffer the strain such as the residual stress or the like occurring in the Group-13 metal nitride crystal and to reduce the crystal orientation distribution as typified by the off angle distribution, and as a result, the crystallinity of the Group-13 metal nitride crystal can be thereby kept good and the stability of the crystal can be increased.

In addition, it is also considered that, by introducing hydrogen into the Group-13 metal nitride crystal to have a desired concentration, the charge of the point defect such as the Ga vacancy as mentioned above can be compensated. Hydrogen is stably taken in the point defects (vacancies) and exhibits the function of charge compensation, but does not clog the point defect (vacancy) in the Group-13 metal nitride crystal, and therefore, it is considered that, while the charge is balanced in the entire crystal, the strain to occur in the crystal could be reduced. To that effect, by adjusting the oxygen content and the hydrogen content, the Group-13 metal nitride crystal of the present invention has good charge balance in the entire crystal and good crystallinity, and thereby shows excellent semiconductor characteristics.

Of the crystal of a nitride of a Group-13 metal on the Periodic Table of the present invention, the S-parameter as measured according to a positron annihilation spectroscopy is preferably 0.448 or more. The S-parameter of the Group-13 metal nitride crystal is more preferably 0.449 or more, even more preferably 0.450 or more. Also preferably, the S-parameter is 0.460 or less, more preferably 0.458 or less.

In the crystal of a nitride of a Group-13 metal on the Periodic Table of the present invention, the positron diffusion length is preferably 15 nm or more, more preferably 20 nm or more, even more preferably 25 nm or more. Also preferably, the positron diffusion length is 50 nm or less, more preferably 45 nm or less, even more preferably 40 nm or less.

Further, the positron lifetime of the crystal of a nitride of a Group-13 metal on the Periodic Table is characterized by including the lifetime $\tau 1$ in interstitial positron annihilation and, in addition thereto, the lifetime $\tau 2$ in the case where vacancy-type defects exist in the crystal and the positrons are trapped therein and annihilated. Here, $\tau 1$ is preferably from 130 ps to 140 ps, and $\tau 2$ is preferably from 210 ps to 220 ps.

As described below, the S-parameter, the positron diffusion length and the positron lifetime in a positron annihilation spectroscopy are the index relating to vacancy-type point defects in the crystal, and when these indices each fall within the above-mentioned range, it may be said that the crystal can contain vacancy-type point defects in a specific range.

From the value of the S-parameter, the positron diffusion length or the positron lifetime, the density of the vacancy-type point defects in the crystal can be calculated. When the value of the S-parameter, the positron diffusion length or the positron lifetime is defined to fall within the above-mentioned range, the density of the vacancy-type defects to be contained in the Group-13 metal nitride crystal that is estimated from the value of the S-parameter, the positron diffusion length or the positron lifetime can be favorably controlled to fall from $5 \times 10^{16}$ to $5 \times 10^{20}$ atoms/cm$^3$. The density of the vacancy-type point defects can be calculated by the math formula to be mentioned below.

Heretofore, it has been considered that, in a case of a crystal that is close to a so-called complete crystal and has high crystallinity, there exists no vacancy-type point defect in the crystal, and therefore such point defects would have some negative influence on the characteristics of semiconductors, and thus, it has been considered that the point defect density must be reduced as much as possible for increasing crystallinity. However, in the present invention, it has been found that, of the Group-13 metal nitride crystal that contains point defects in the above-mentioned range, the X-ray rocking curve half-value width is significantly reduced, and therefore the X-ray crystallographic crystallinity is extremely high. This is considered to be because, the vacancy-type point defects contained in the Group-13 metal nitride crystal in a predetermined amount would exhibit an action of buffering the residual stress given to the entire crystal, such as the strain generated in the Group-13 metal nitride crystal, and also buffering the crystal orientation distribution or the like. With that, the present inventors have found the possibility of retarding the generation of defects such as stacking faults that are presumed to be generated by dissolving residual stress and the like. Namely, the present inventors have known that the Group-13 metal nitride crystal containing point defects in the range mentioned above has better crystallinity and are more excellent in semiconductor characteristics thereof, as compared with the Group-13 metal nitride crystal containing few point defects.

On the other hand, however, when the content of the point defects is too large, then the entire crystal would lose the balance, and therefore the buffer action becomes difficult to occur. Consequently, in the present invention, it is more desirable that the point defect density is controlled to fall within a range of from $1 \times 10^{17}$ to $1 \times 10^{18}$ atoms/cm$^3$.

The density of vacancy-type point defects can be calculated using the math formula to be mentioned hereinunder.
(Positron Annihilation Spectroscopy)

The above-mentioned S-parameter, positron diffusion length and positron lifetime are values calculated according to a positron annihilation measurement method and a positron lifetime measurement method. These measurement methods are described below.

A positron is an antimatter to electron, and has the same static mass ($m_0$) as that of electron, but the charge thereof is positive. When injected into a crystal, a positron loses energy and then pair-annihilates with electron, and in this stage, the mass is converted into energy, and mainly two photons are emitted in opposite directions. The energy of one photon is $m_0c^2$ (511 keV), and corresponds to a γ-ray region. Here, c indicates the light speed.

Since the momentum is stored before and after annihilation, the energy of the γ-ray (Eγ) is given by the Doppler effect as $E\gamma=m_0c^2\pm\Delta E\gamma$. Here, $\Delta E\gamma=cp_L/2$, in which $p_L$ represents the momentum distribution of electron in the γ-ray emission direction.

In the crystal, the positron receives a repulsive force from the ion shell and exists in the interstitial site. However, in a case where vacancy-type point defects exist in the crystal, the positron may be trapped by the vacancy-type point defects. The momentum distribution of electron in the vacancy-type point defect differs from that of the electron in the interstitial site, and therefore in the case where the positron is trapped by the vacancy-type point defect, there may appear a change in the Doppler width (ΔEγ). Accordingly, it is possible to determine whether a positron has annihilated in bulk or has annihilated in vacancies, based on the Doppler width of γ-ray. In many cases, when a positron is trapped by a vacancy-type point defect, ΔFγ may reduce and the Doppler width may sharpen.

For obtaining a positron, often used is a radioactive isotope. A few types of isotopes capable of emitting a positron are known, and among them, $^{22}$Na is used as a β⁺-decaying radioactive isotope.

<S-Parameter>

The change in Doppler width is evaluated by the energy distribution sharpness, S-parameter (sharpness parameter). The S-parameter is calculated by dividing the count in the center part of the Doppler width spectrum by all counts. When a positron is trapped by a vacancy-type point defect and annihilates, then the value of S increases. In other words, when the vacancy density is higher, then the S-parameter increases more. The S-parameter is calculated in accordance with the description in Hyomen Kagaku (Journal of the Surface Science Society of Japan), Vol. 26 (2005), No. 5, pp. 268-273 (Special Issue on the Characterization of Gate Dielectric/Si Interface)

The S-parameter varies depending on the type, the number and the size of the vacancy-type point defects. For example, when the size of the point defect is larger, then the S-parameter becomes larger. The vacancy-type point defects include those where one atom alone has simply defected, or adjacent two or more atoms have defected. The defective parts may be accompanied by some impurities such as oxygen, etc.

<Positron Lifetime>

The electron density in a substance having vacancy-type point defects is lower than the electron density in a substance not having a point defect. Consequently, the positron lifetime injected into the crystal is longer. The positron lifetime can be calculated by measuring the difference between the time at which the positron is injected into a substance, and the time at which a y-ray of 511 keV, which is emitted through pair-annihilation between the positron and the electron in a crystal, is emitted from the substance.

Through β⁺-decay of $^{22}$Na followed by positron emission, 99% or more $^{22}$Na transfers into an excited state. Next, transition from the state to the ground state occurs, accompanying the emission of a γ-ray of 1.28 MeV in a lifetime of $3\times10^{-12}$ (s). The time of positron injection into the substance is determined with the γ-ray of 1.28 MeV as a signal that indicates the injection of a positron into a substance.

<Positron Diffusion Length>

The positron diffusion length may be determined by analyzing the one-dimensional diffusion equation of a positron relative to the positron implantation energy dependence of the observed S-parameter (SE plot).

The positron to be emitted through β⁺-decay of $^{22}$Na can be thermalized after having passed through a moderating material. Next, the positron is transported in vacuum given a solenoidal magnetic field, and a positron beam is thereby injected into a solid while the accelerating voltage is changed from 0 to a few tens keV. As a result, the S-parameter energy dependence of S (E) can be measured to a depth of a few μm.

The positron implantation profile widens more when the positron implantation energy is higher, and after implanted, the positron tends to diffuse in the surface direction. Consequently, for obtaining an accurate defect distribution, it is necessary to analyze the S-E plot using a model for which the positron diffusion and implantation profile are taken into consideration.

Taking into consideration that the Doppler width does not depend on time, a positron drift can be ignored in a solid and a positron is trapped by a vacancy-type point defect, a one-dimensional diffusion equation not depending on time like the following equation can be obtained with regard to a positron diffusion in a solid.

$$D + \frac{d^2}{dz^2}n(z) - \kappa_{eff}(z)n(z) + P(z, E) = 0 \qquad (1)$$

In the equation, $D_+$ represents the diffusion coefficient of positron, n(z) represents the probability density of positron at the position z from the surface, $\kappa_{eff}(z)$ represents the effective trapping rate when positron is trapped by the defect, P(z,E) represents the implantation profile function corresponding the positron energy. In the equation (1), $\kappa_{eff}(z)$ is represented by the following equation.

$$\kappa_{eff}(z)=\lambda_b+\kappa_d(z)=\lambda_b+\mu C_d(z) \qquad (2)$$

In the equation, $\lambda_b$ represents the positron annihilation rate in a bulk crystal with no defect, $\kappa_d(z)$ represents the trapping rate in a defect, and the trapping rate and the defect concentration $C_d(z)$ are in a proportional relation. μ represents trapping capability. The observed S-E plot may be analyzed using A. van Veen et al's VEPFIT (variable energy positron fit) program or the like. For the analysis, the site is divided into some regions i's in the depth direction from the surface (multilayer structure), and a boundary condition is given to every region to solve the equation (1) and, as a result, the positron probability density $n_i(z)$ in the region i may be determined as follows.

$$n_i(z)=A_i e^{r_i z}+B_i e^{-r_i z}+p_i/r_i^2 \qquad (3)$$

In the above, $A_i$ and $B_i$ each represent a constant, and $p_i$ represents the ratio of positrons implanted in the i'th region. When the positron diffusion length is represented by $L_d(z)$, then $\Gamma_i^2=1/L_d(z)$, and $L_d(z)$ is given the following equation.

$$L_d(z)=\sqrt{D_+/\kappa_{eff}(z)} \qquad (4)$$

Next, in a case where the energy-dependent S-parameter S(E) is considered to be linear superposition of positron states, the parameter may be as follows.

$$S(E) = S_S F_S(E) + \sum_i S_i F_i(E) \quad (5)$$

$$F_S(E) + \sum_i F_i(E) = 1 \quad (6)$$

In the above, $F_S(E)$ and $F_i(E)$ each represents the positron annihilation rate in the surface and the positron annihilation rate in the i'th region from the surface, respectively, and each is a function including the positron annihilation rate $L_b$ and the trapping rate $\kappa_d(z)$, respectively, in a bulk with no defect. $S_S$ and $S_i$ each represent the S-parameter in the surface and the S-parameter in the i'th region from the surface, respectively. The observed S-E plot is fitted in the equation (5) to give the positron diffusion length of the equation (4).

(Relationship between S-Parameter and Positron Diffusion Length)

When positrons are trapped in the vacancy-type point defects in a crystal, the S-parameter of the crystal increases. On the other hand, from the equation (2) and the equation (4), when positrons are trapped in the point defects, the positron diffusion length shortens. There is a possibility that the diffusing positrons would be scattered by the impurities existing in the interstitial site or in the substitutional site or by the positively-charged vacancy-type point defects. Consequently, the vacancy-type point defects would have some influence on the positron diffusion length.

On the other hand, there is a low possibility that impurities or positive point defects could trap positrons. In this case, these defects would have few influences on the S-parameter. Using the difference between the S-parameter and the positron diffusion length, it may be possible to obtain some deeper information relating to the point defects in a crystal.

(Relationship Between Vacancy-Type Point Defect Density and S-Parameter)

The S-parameter is represented by the following equation (7).

$$S = S_f f_f = S_1 f_1 \quad (7)$$

In the above, $S_1$ represents the S-parameter of a vacancy-type point defect, $S_f$ represents the S-parameter in a case where the positron is in a free state (defective-free sample), $f_f$ represents the ratio of annihilation of the positrons trapped in a vacancy-type point defect (ratio of the positrons trapped in a vacancy-type point defect), and $f_1$ represents the ratio of annihilation of free-state positrons. In other words, $f_f + f_1 = 1$.

Consequently, in a case where $S_f$ and $S_1$ are known in the equation (7), then $f_1$ can be calculated. Here, $f_1$ is represented by the following equation (8).

$$f_1 = \int_0^\infty \lambda_1 n_1(t) dt = \frac{\kappa_1}{\Gamma} \quad (8)$$

$\Gamma$ is represented by the following equation (9).

$$\Gamma = \lambda_f + \kappa_1 \quad (9)$$

In the above, $\lambda_f$ represents the reciprocal of the lifetime of the positron in a sample not having any vacancy-type point defect. The positron lifetime of GaN with no vacancy-type point defect is 165 ps.

$$\kappa_1 = \mu + C \quad (10)$$

In the above, represents the trapping capability, and is from $1\times10^{14}$ to $1\times10^{15}$ s$^{-1}$. $\kappa_1$ represents the trapping rate, and can be obtained through measurement of the positron lifetime. Accordingly, the vacancy-type point defect density C can be thereby calculated.

In the present embodiment, used is a "monochromatic positron annihilation" technique, in which a high-energy positron beam radiated from $^{22}$Na is decelerated to around E=0 using a moderator, and thereafter an accelerating voltage is given for injection to a desired depth in a crystal.

(Detection Limit of Vacancy-Type Point Defect Density)

The detection limit of a Ga atom vacancy density may be presumed from the lower detection limit of the vacancy density in a case of Si. It is well known that the lower detection limit of the neutral vacancy-type point defect in Si is $10^{16}$ cm$^{-3}$ or so. Here, when the point defect is negatively charged by one charge (−1), then the positron having a positive charge is drawn to the point defect by the coulombic attraction, and therefore the detection sensitivity increases by 10 times or so. On the other hand, the Ga atom vacancy is often charged by −3, and therefore the detection sensitivity could increase by 10 times or more. On the other hand, in a strongly-ionic material, it is considered that the positron would be often influenced by the effect of phonon diffusion, and therefore there is a possibility that the positron diffusion length would be shorter than that in Si or metal. For example, when the positron diffusion length in Si or metal is from 150 to 200 nm, and when the positron diffusion length in GaN is from 100 to 150 nm or so, then the lower limit of the space where positrons could move in GaN would be $(100/200)3=0.125$, as compared with that in Si. When this numeral value and the detection sensitivity presumed from Si are taken into consideration, the detection limit of the Ga atom vacancy density would be about $10^{16}$ cm$^{-3}$ or so.

(Evaluation of Physical Properties of Crystal of Nitride of Group-13 Metal on Periodic Table)

Figure 4A:
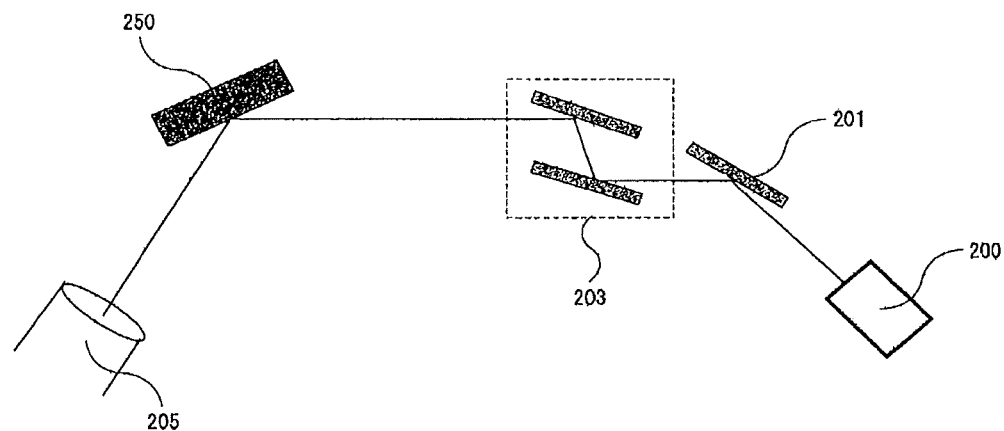
FIG. 4A and FIG. 4B are schematic views each showing the outline of a measurement apparatus for an X-ray rocking curve (XRC).
Figure 4B:
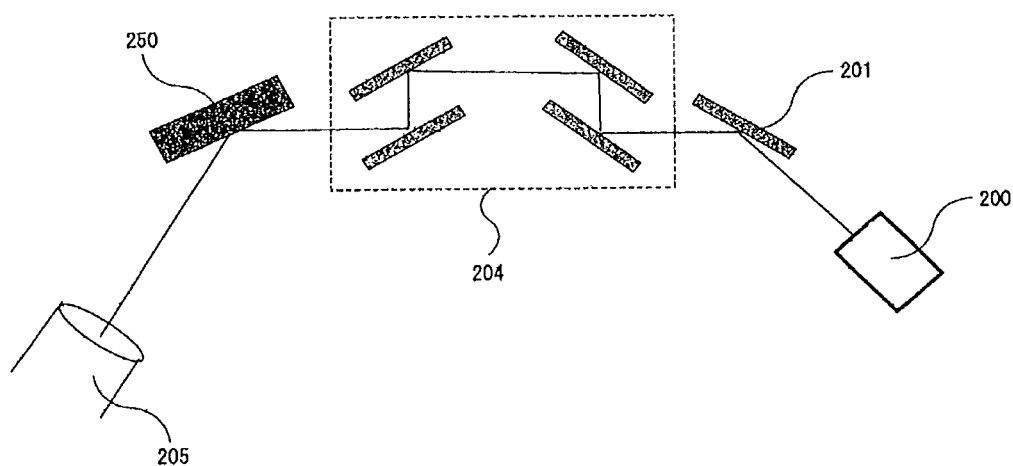

The X-ray rocking curve (XRC) is measured with an X-ray diffractometer generally as shown in FIG. 4A and FIG. 4B, in which the sample to be analyzed is irradiated with a Cu-Kα (emission) line from the X-ray source 200, while on the incident side, an X-ray mirror 201 and a Ge (220) double crystal hybrid monochromator 203 (FIG. 4A) or a Ge (440) four-crystal monochromator 204 (FIG. 4B) are arranged, and on the detector side, an open detector 205 is arranged for the measurement. Using the optical system, XRC measurement is carried out for (100) reflection or (200) reflection, and the half-value width thereof is calculated to thereby evaluate the distribution of the crystal orientation in the tilt direction of the crystal 250. On the other hand, XRC measurement is carried out for (102) reflection and the half-value width thereof is calculated to thereby evaluate the distribution of the crystal orientation in the twist direction of the crystal 250. Here, (100), (200) and (102) indicate X-ray diffraction planes.

In general, the resolution for the half-value width of GaN (100) reflection in the for Ge (220) doublet crystal hybrid monochromator 203 in FIG. 4A is 25 arcsec or so. As opposed to this, the Ge (440) four-crystal monochromator 204 in FIG. 4 has a resolution of 5.3 arcsec for the half-value width of GaN (200) reflection. Accordingly, it is desirable that the X-ray crystallographic evaluation of the GaN crystal having a half-value width of 25 arcsec or less is carried out according to the latter method. In this specification, the half-value width of the X-ray rocking curve as measured using a Ge (220) double crystal hybrid monochromator 203 is referred to as "X-ray rocking curve (XRC) half-value width", and the half-value width of the X-ray rocking curve as measured using a Ge (440) four-crystal monochromator 204 is referred to as "high-resolution X-ray rocking curve (XRC) half-value width", and the two are thus differentiated here.

The main plane of the crystal of a nitride of a Group-13 metal on the Periodic Table of the present invention may be the C-plane, the A-plane, the M-plane or the semipolar plane thereof, and the main plane is preferably the M-plane. In a case where the main plane of the Group-13 metal nitride crystal is the M-plane, it is desirable that the XRC half-value width in (100) reflection is 30 arcsec or less, more preferably 25 arcsec or less. Further, it is desirable that the high-resolution XRC half-value width in (200) reflection of the Group-13 metal nitride crystal of the present invention is 15 arcsec or less, more preferably 10 arcsec or less. When the X-ray rocking curve (XRC) half value is defined to be not more than the above-mentioned upper limit value, then there can be obtained a Group-13 metal nitride crystal having a low dislocation density and having extremely good crystallinity. Further, the Group-13 meta nitride crystal of the type is also excellent in semiconductor characteristics, and can be therefore favorably used for various types of electronic devices.

In general, the half-value width of the X-ray rocking curve (XRC) to be measured with an X-ray diffractometer is a parameter that indicates the distribution of the crystal orientation in the direction vertical to the substrate surface, and can be used for detecting the distribution of the crystal orientation in the tilted direction or the twisted direction in accordance with the reflection plane to be analyzed. In a case where the crystal orientation is diffused as influenced by the dislocations or the stacking faults contained in the crystal, the crystal orientation distribution increases and therefore the XRC half-value width therefore increases. On the other hand, when the XRC half-value width is smaller, the crystal orientation distribution is smaller, and the case means that the crystal has few dislocations. The same shall apply also to the high-resolution XRC half-value width in this specification. In the present invention, the XRC half-value width is defined to be not higher than the above-mentioned upper limit value, and therefore a crystal of a nitride of a Group-13 metal on the Periodic Table having few dislocations and excellent in crystal orientation can be obtained. Accordingly, the crystal can have good crystallinity and excellent semiconductor characteristics.

The dislocation density (DSD) is a parameter to indicate the degree of the number of the dislocations such as the edge dislocations and the screw dislocations in the crystal, and in general, the value of the density of the dark spots observed on a CL image is expressed as the dislocation density (DSD). In the present invention, the dislocation density (DSD) in the crystal is preferably $5\times10^5$ cm$^{-2}$ or less, more preferably $2\times10^5$ cm$^{-2}$ or less, further more preferably $1\times10^5$ cm$^{-2}$ or less, even more preferably $7\times10^4$ cm$^{-2}$ or less, still more preferably $5\times10^4$ cm$^{-2}$ or less.

On the other hand, the stacking fault density (SFD) is a parameter to indicate the degree of planar faults that show a stacking structure. It is considered that a crystal having a larger stacking fault density (SFD) value would have more displacements and defects in the stacking structure thereof, and therefore the stacking faults would have occurred in the crystal owing to the generation of strain in the entire crystal. In the present invention, the stacking fault density (SFD) is preferably $1\times10^2$ cm$^{-1}$ or less, more preferably $8\times10^1$ cm$^{-1}$ or less, even more preferably $5\times10^1$ cm$^{-1}$ or less, still more preferably $1\times10^1$ cm$^{-1}$ or less, and most preferably $5\times10^0$ cm$^{-1}$ or less. In particular, in a case where, in one and the same plane of a crystal, the stacking fault density is measured at 4 or more points arranged in line at intervals of 5 mm, and the in-plane average stacking fault density is calculated, it is preferably $1\times10^2$ cm$^{-1}$ or less, more preferably $8\times10^1$ cm$^{-1}$ or less, even more preferably $5\times10^1$ cm$^{-1}$ or less.

As described above, when the upper limit of the dislocation density (DSD) or the stacking fault density (SFD) is defined to fall within the above-mentioned range, then there can be obtained a crystal having few crystal defects, having an extremely good crystal structure and having good crystallinity.

By measuring the radius of curvature of a crystal, the distribution of the crystal orientation can also be evaluated. In particular, by evaluating the radius of curvature, it becomes possible to evaluate the macroscopic crystal orientation of the entire crystal. The radius of curvature may be measured using a high-resolution X-ray diffractometer by PANalytical that has a monoaxial stage (x-axis) or biaxial stage (x-y) high-definition cradle. Concretely, the sample to be analyzed is moved in the monoaxial direction (x-direction) at intervals of from 0.5 to 5 mm, and the X-ray rocking curve is determined at every point. From the found data, the ω-value that gives the maximum intensity is calculated, and the ω-value is plotted relative to the moving distance x. According to the least-square method, the inclination k of the graph is calculated. From the inclination k, the radius of curvature R(m) can be calculated according to the following equation.

$$R=1/k\times180\times\pi/1000$$

Of the Group-13 metal nitride crystal of the present invention, the radius of curvature in the a-axis direction is preferably 5 m or more, more preferably 10 m or more. Also preferably, the radius of curvature in the c-axis direction is 5 m or more, more preferably 10 m or more, In a crystal having a larger radius of curvature, the crystal lattices could align evenly, and it may be said that the crystal of the type is a good crystal not having defects such as dislocations and cracks, etc. In addition, in a case where the Group-13 metal nitride crystal of the present invention is post-treated through annealing or the like, it is desirable that the radius of curvature of the crystal does not still change before and after the treatment.

By measuring the lattice spacing of a specific crystal plane of a crystal, it is possible to evaluate the strain such as residual stress in the crystal. In a case of evaluating the Group-13 metal nitride crystal of which the M-plane is the main plane, concretely, the lattice constant expansion and contraction may be measured as follows, The lattice spacing $d_{300}$ of the (300) plane, the lattice spacing $d_{120}$ of the (120) plane and the lattice spacing $d_{20\text{-}3}$ of the (20-3) plane are measured at plural points in one direction of the a-axis or the c-axis. In this case, the measurement range is preferably 4 mm or more, and the number of the measurement points is preferably 10 or more. Also preferably, the points are spaced from each other via a constant distance therebetween. From these values, and using the relational equation mentioned below of the lattice spacing d and the lattice constants a and c in a hexagonal crystal, the lattice constant in the direction vertical or horizontal to the main plane can be calculated. Here, h, k and l each represent the Miller index of the lattice plane.

$$1/d^2=4/3((h^2+hk+k^2)/a^2)1^2/c^2$$

The lattice constant in the normal direction to the main plane is calculated as the lattice constant $a\perp$ of a virtual a-axis. Further, the lattice constant of the a-axis in the direction parallel to the main plane, $a_{//}$, and the lattice constant of the c-axis in the direction parallel to the main plane, $c_{//}$, are also calculated individually.

The lattice constant expansion and contraction is, for example, in a case of the normal direction to the main plane, calculated from the mean value $a\perp_{ave}$ of all the lattice constant values $a\perp$ in the measurement range, as $\Delta a\perp/a\perp_{ave}=|1-a\perp/a\perp_{ave}|$. Additionally, $\Delta a_{//}/a_{//ave}$ and $\Delta c_{//}/c_{//ave}$ are also calculated similarly.

By reducing the lattice constant expansion and contraction, the residual stress in the crystal may be reduced and the strain that the crystal has may be thereby reduced. Regarding the lattice constant expansion and contraction of the Group-13 metal nitride crystal of the present invention, the maximum value of $\Delta a\perp/a\perp_{ave}$ and the maximum value of $\Delta a_{//}/a_{//ave}$ each are preferably $1.5\times10^{-5}$ or less, and the standard deviation thereof is preferably $6.0\times10^{-6}$ or less. The maximum value of $\Delta c_{//}/c_{//ave}$ is preferably $5.0\times10^{-6}$ or less, and the standard deviation thereof is preferably $3.0\times10^{-6}$ or less.

(Crystal Growth According to Ammonothermal Method)

The crystal of a nitride of a Group-13 metal on the Periodic Table of the present invention is formed according to an ammonothermal method. The ammonothermal method is a method for producing the desired material using a solvent in a supercritical state and/or a subcritical state and using dissolution-precipitation reaction of the feedstock. Preferably, the crystal of a nitride of a Group-13 metal on the Periodic Table is formed on a ground substrate through crystal growth using at least the M-plane as the growth plane. Accordingly, it is desirable to use a ground substrate of which the M-plane is the main plane, and the main plane in the case may be an M-plane having an off angle. The range of the off angle is preferably within ±15°, more preferably within ±10°, and even more preferably within ±5°.

The ground substrate, the mineralizer, the solvent and the feedstock usable in the crystal growth method in the present invention are described below.

(Ground Substrate)

Not specifically limited, the type of the ground substrate for use for crystal growth of a crystal of a nitride of a Group-13 metal on the Periodic Table may be any known one. Usable here is the same type as that of the intended crystal of a nitride of a Group-13 metal on the Periodic Table, including gallium nitride (GaN), indium gallium nitride (InGaN), aluminium gallium nitride (AlGaN), etc. In addition, also usable are metal oxides such as sapphire ($Al_2O_3$), zinc oxide (ZnO), etc.; silicon-containing substances such as silicon carbide (SiC), silicon (Si), etc.; as well as gallium arsenide (GaAs), etc. However, preferred is use of a ground substrate having size parameters of a lattice constant and a crystal lattice that are the same as or compatible with those of the intended crystal of a nitride of a Group-13 metal on the Periodic Table, or use of a ground substrate formed of a monocrystalline material piece or a polycrystalline material piece that is so designed as to secure heteroepitaxy (or that is, some conformity in crystallographic position of atoms).

As the ground substrate for use for crystal growth for the crystal of a nitride of a Group-13 metal on the Periodic Table of the present invention, preferred is use of a single crystal formed according to an ammonothermal method or a crystal prepared by cutting the crystal. The crystal formed according to an ammonothermal method has little strain and therefore a good nitride crystal can be grown thereon, and accordingly, the crystal of the type is favorably used as a ground substrate herein. Using the crystal formed according to an ammonothermal method as a ground substrate makes it possible to introduce hydrogen and oxygen into the grown crystal so that the crystal can contain them in a desired concentration ratio, and therefore the grown crystal can be excellent in crystallinity. Further, using the crystal formed according to an ammonothermal method as a ground substrate makes it possible to introduce a desired degree of point defects into the grown crystal, and therefore the grown crystal can also be excellent in crystallinity.

The plane orientation of the main plane of the ground substrate is not specifically limited, but from the viewpoint of efficiently producing a crystal of a nitride of a Group-13 metal on the Periodic Table of which the M-plane is the main plane, it is desirable to select a ground substrate for use herein that has the M-plane as the main plane in accordance with the intended crystal of a nitride of a Group-13 metal on the Periodic Table. In addition, from the viewpoint of reducing the residual strain in the Group-13 metal nitride crystal, it is also desirable to use, as the ground substrate, a crystal grown according to an ammonothermal method in such a manner that the crystal plane corresponding to the main plane of a Group-13 metal nitride crystal extends to be the main plane of the ground substrate. In addition, a nitride crystal that is prevented from having residual strain therein can also be obtained by growing the crystal in such a manner that the crystal plane thereof corresponding to the main plane of a Group-13 metal nitride crystal extends in crystal growth on the ground substrate.

A specific growth method for growing a ground substrate in such a manner that the crystal plane thereof corresponding to the main plane of a Group-13 metal nitride crystal can extend includes (i) a method for lateral growth from the side face of a seed crystal of which the main crystal plane is nearly the same as the main crystal plane of a Group-13 metal nitride crystal, (ii) a method for growth from the main plane of a seed crystal of which the main crystal plane differs from the main crystal plane of a Group-13 metal nitride crystal, (iii) a method for growth from the side face of a seed crystal of which the main crystal plane differs from the main crystal plane of a Group-13 metal nitride crystal, etc.

More concretely, the method (i) for lateral growth from the side face of a seed crystal of which the main crystal plane is nearly the same as the main crystal plane of a Group-13 metal nitride crystal includes a method of using a seed (seed crystal) having plural growth starting planes (side faces), for example, a V-shaped seed, a U-shaped seed, a square-shaped seed, an L-shaped seed, an O-shaped seed, or a seed having any one or more holes; a method of providing a guide to surround the region for crystal growth, etc. The method (ii) for growth from the main plane of a seed crystal of which the main crystal plane differs from the main crystal plane of a Group-13 metal nitride crystal includes a method for crystal growth in which, from the exposed area of a seed (seed crystal) covered with a mask in a part of the main plane thereof, a crystal is grown in the axial direction that crosses the main plane of the seed so that the crystal plane differing from the main plane of the seed crystal can extend for crystal growth; a method for crystal growth in which, from a seed (seed crystal) combined with a tabular component attached to a part of the main plane of the seed crystal via the side face of the component, a crystal is grown in the axial direction that crosses the main plane of the seed so that the crystal plane differing from the main plane of the seed crystal can extend for crystal growth, etc. Further, the method (iii) for growth from the side face of a seed crystal of which the main crystal plane differs from the main crystal plane of a Group-13 metal nitride crystal includes a method for growth from the side face extending in the normal direction of the main plane, as in FIG. 4 in WO2008/143166, etc.

Preferably, the surface condition of the ground substrate is controlled so as to be smooth. Specifically, the ground substrate is preferably pre-treated. For example, as the pretreatment, the ground substrate may be processed for meltback (etchback) treatment, or the crystal growth surface of the ground substrate may be polished, or the ground substrate may be washed. By the pretreatment, the surface condition of the ground substrate may be smoothed, and the concentration ratio of hydrogen to oxygen may be controlled to fall within the desired range. Accordingly, the crystallinity of the Group-13 metal nitride crystal to grow on the ground substrate may be bettered.

The pretreatment of polishing the surface of the ground substrate for crystal growth may be carried out, for example, through chemical mechanical polishing (CMP), etc. Preferably, the surface roughness of the ground substrate is, for example, such that the root-mean-square roughness (Rms) thereof in atomic force microscope measurement is 1.0 nm or less, more preferably 0.5 nm or less, even more preferably 0.3 nm or less.

(Mineralizer)

Preferably, a mineralizer is used in growth of the Group-13 metal nitride crystal according to the ammonothermal method in the present invention. The solubility of the starting crystal material in a nitrogen-containing solvent such as ammonia or the like is not high, and therefore, for increasing the solubility, a halogen-based or alkali metal-based mineralizer may be used, but the type thereof is not specifically limited.

As the mineralizer, preferably used here is a mineralizer containing a fluorine element and at least one other halogen element selected from chlorine, bromine and iodine.

The combination of halogen elements to be contained in the mineralizer may be a combination of two elements, such as chlorine and fluorine, bromine and fluorine, or iodine and fluorine, or may also be a combination of three elements, such as chlorine, bromine and fluorine, chlorine, iodine and fluorine, bromine, iodine and fluorine, or may be a combination of four elements of chlorine, bromine, iodine and fluorine. Above all, preferred is a combination containing at least iodine and fluorine. Using a mineralizer that comprises a combination of iodine and fluorine realizes production of a Group-13 metal nitride crystal having extremely good X-ray crystallographic crystallinity. The combination and the concentration ratio (molar concentration ratio) of halogen elements to be contained in the mineralizer for use in the present invention may be suitably determined depending on the type, the shape and the size of the Group-13 metal nitride crystal to be grown, on the type, the shape and the size of the seed crystal, on the reactor to be used, and on the temperature condition and the pressure condition to be employed.

For example, in a case of a mineralizer containing iodine (I) and fluorine (F), the iodine concentration to the fluorine concentration, or that is, I/F is preferably 0.5 or more, more preferably 0.7 or more, even more preferably 1 or more. Also preferably, I/F is 10 or less, more preferably 8 or less, even more preferably 5 or less.

In general, when the fluorine concentration in the mineralizer is increased, the growth rate in the m-axis direction of the Group-13 metal nitride crystal tends to increase, and therefore, the growth in the c-axis direction and the growth in the direction vertical to the semipolar plane would tends to relatively lower. This means that, by varying the mineralizer concentration, the difference in the growth rate depending on the plane orientation can be controlled. Accordingly, the area in which the plane orientation with a high growth rate appears could be narrowed, and therefore the area in which the plane orientation with a low growth rate appears could be relatively controlled to broaden, whereby the high-quality region in the Group-13 metal nitride crystal of the present invention can be favorably broadened.

In addition, by controlling the growth direction, the concentration ratio of hydrogen and oxygen to be introduced into the crystal can be controlled to fall within a desired range, whereby a Group-13 metal nitride crystal more excellent in crystallinity can be obtained. Further, by controlling the growth direction, the point defect density to be introduced into the crystal can be controlled to fall within a desired range, whereby a Group-13 metal nitride crystal more excellent in crystallinity can be obtained. In a case where a semipolar plane is exposed out as the crystal growth plane, the growing crystal may readily take oxygen into it, and therefore it is desirable to control the crystal growth plane by controlling the growth condition.

Examples of the halogen element-containing mineralizer include ammonium halides, hydrogen halides, ammonium hexahalosilicates, hydrocarbylammonium fluoride; as well as alkylammonium salts such as tetramethylammonium halides, tetraethylammonium halides, benzyltrimethylammonium halides, dipropylammonium halides, isopropylammonium halides, etc.; alkyl metal halides such as sodium alkyl halides; alkaline earth metal halides, metal halides, etc. Of those, preferred are alkali halides, alkaline earth metal halides, metal halides, ammonium halides, hydrogen halides; more preferred are alkali halides, ammonium halides, halides of Group-13 metals on the Periodic Table, hydrogen halides; and even more preferred are ammonium halides, gallium halides, hydrogen halides.

Along with the halogen element-containing mineralizer, also usable here is a mineralizer not containing a halogen element. For example, the halogen element-containing mineralizer may be combined with an alkali metal amide such as $NaNH_2$, $KNH_2$, $LiNH_2$ or the like, for use herein. In the case where the halogen element-containing mineralizer such as an ammonium halide is combined with a mineralizer containing an alkali metal element or an alkaline earth metal element for use herein, it is desirable that the amount of the halogen element-containing mineralizer to be used is larger. Concretely, it is desirable that the amount of the mineralizer containing an alkali metal element or an alkaline earth metal element is from 50 to 0.01 parts by mass relative to 100 parts by mass of the halogen element-containing mineralizer, more preferably from 20 to 0.1 parts by mass, even more preferably from 5 to 0.2 parts by mass. Adding the mineralizer that contains an alkali metal element or an alkaline earth metal element could make it possible to further increase the ratio of the m-axis crystal growth rate relative to the c-axis crystal growth rate (m-axis/c-axis).

For preventing the growing Group-13 metal nitride crystal from being contaminated with impurities, it is desirable that the mineralizer is used after optionally purified and dried. The purity of the mineralizer is generally 95% or more, preferably 99% or more, more preferably 99.99% or more.

It is desirable that the amount of water and oxygen to be contained in the mineralizer is as small as possible, and preferably, the content of those substances is 1000 wtppm or less, more preferably 10 wtppm or less, even more preferably 1.0 wtppm or less. Controlling the oxygen concentration within the range makes it possible to control the concentration ratio of hydrogen and oxygen to be introduced into the crystal, within a desired range. Accordingly, the formed crystal can be prevented from having strain, and a Group-13 metal nitride crystal more excellent in crystallinity can be obtained here.

In crystal growth, an aluminium halide, a phosphorus halide, a silicon halide, a germanium halide, a zinc halide, an arsenic halide, a tin halide, an antimony halide, a bismuth halide or the like may be made to exist in the reactor.

The molar concentration of the halogen element contained in the mineralizer to the solvent is preferably 0.1 mol % or more, more preferably 0.3 mol % or more, even more preferably 0.5 mol % or more. The molar concentration of the halogen element contained in the mineralizer to the solvent is preferably 30 mol % or less, more preferably 20 mol % or less, even more preferably 10 mol % or less. When the concentration is too low, then the solubility may lower and the growth rate may tend to lower. On the other hand, when the concentration is too high, then spontaneous nucleation tends to increase due to too high solubility or crystal growth control tends to be difficult due to too high supersaturation degree.

(Solvent)

As the solvent for the ammonothermal method, usable is a solvent that contains nitrogen (nitrogen-containing solvent). The nitrogen-containing solvent is one not detracting from the stability of the Group-13 metal nitride single crystal to be grown. The solvent includes, for example, ammonia, hydrazine, urea, amines (for example, primary amines such as methylamine, secondary amines such as dimethylamine, tertiary amines such as trimethylamine, diamines such as ethylenediamine), melamine, etc. One alone or two or more of these solvents may be used here either singly or as combined.

It is desirable that the amount of water and oxygen to be contained in the solvent is as small as possible, and preferably, the content of those substances is 1000 wtppm or less, more preferably 10 wtppm or less, even more preferably 0.1 wtppm or less. In a case where ammonia is used as the solvent, the purity thereof is generally 99.9% or more, preferably 99.99% or more, more preferably 99.999% or more, even more preferably 99.9999% or more.

(Feedstock)

In the production step, used is a feedstock that contains an element to constitute the crystal of a nitride of a Group-13 metal on the Periodic Table to be grown through crystal growth on the ground substrate. For example, in a case where a crystal of a nitride of a Group-13 metal on the Periodic Table is desired to be grown, used is a feedstock that contains a Group-13 element on the Periodic Table.

Preferably, used here are a polycrystalline material of a crystal of a nitride of a Group-13 metal on the Periodic Table and/or a Group-13 metal on the Periodic Table, more preferably gallium nitride and/or metal gallium. The polycrystalline material is unnecessary to be a complete nitride, and may contain a metal component in a metal state of a Group-13 element on the Periodic Table (zero-valent metal) in accordance with conditions. For example, in a case where the Group-13 metal nitride crystal to be grown is gallium nitride, there may be mentioned a mixture of gallium nitride and metal gallium. The types of the crystal of a nitride of a Group-13 metal on the Periodic Table to be obtained in the present invention include GaN, InN, AlN, InGaN, AlGaN, AlInGaN, etc. Preferred are GaN, AlN, AlGaN and AlInGaN, and more preferred is GaN. Accordingly, as the feedstock for the crystal of a nitride of a Group-13 metal on the Periodic Table, usable here is the above-mentioned polycrystalline material for the crystal and/or a combination thereof with the metal of the material.

The production method for the polycrystalline material is not specifically limited. For example, in a reactor in which ammonia gas is made to flow, a metal or its oxide or hydroxide is reacted with ammonia and the resultant nitride polycrystal may be used. In addition, as a metal compound material having higher reactivity, also usable is a halide, an amide compound, an imide compound, or a compound having a covalent-bonding M-N bond such as garazan or the like. Further, a nitride polycrystal formed through high-temperature and high-pressure reaction of a metal such as Ga or the like with nitrogen.

It is desirable that the amount of water and oxygen to be contained in the polycrystalline material that is used as the feedstock in the present invention is as small as possible. Preferably, the oxygen content in the polycrystalline material is generally 250 wtppm or less, preferably 100 wtppm or less, more preferably 40 wtppm or less, even more preferably 20 wtppm or less. The easiness in contamination of the polycrystalline material with oxygen is related with the reactivity of the material with water or the water absorbability of the material. A polycrystalline material having worse crystallinity contains many active groups such as NH groups in the surface thereof, and these groups would react with water would partially produce oxides and hydroxides. Consequently, in general, it is desirable that the crystallinity of the polycrystalline material to be used here is as high as possible. The crystallinity may be estimated by the half-value width thereof in powdery X-ray diffraction. The half-value width of the (100) diffraction line (in hexagonal gallium nitride, $2\theta$=about 32.5°) is generally 0.25° or less, preferably 0.20° or less, more preferably 0.17° or less.

In the manner as above, by controlling the oxygen content to be in the crystal material, the concentration ratio of hydrogen and oxygen to be introduced into the crystal may be controlled to fall within a desired range, and the formed crystal can be prevented from having strain, (Production Apparatus)

Figure 2:
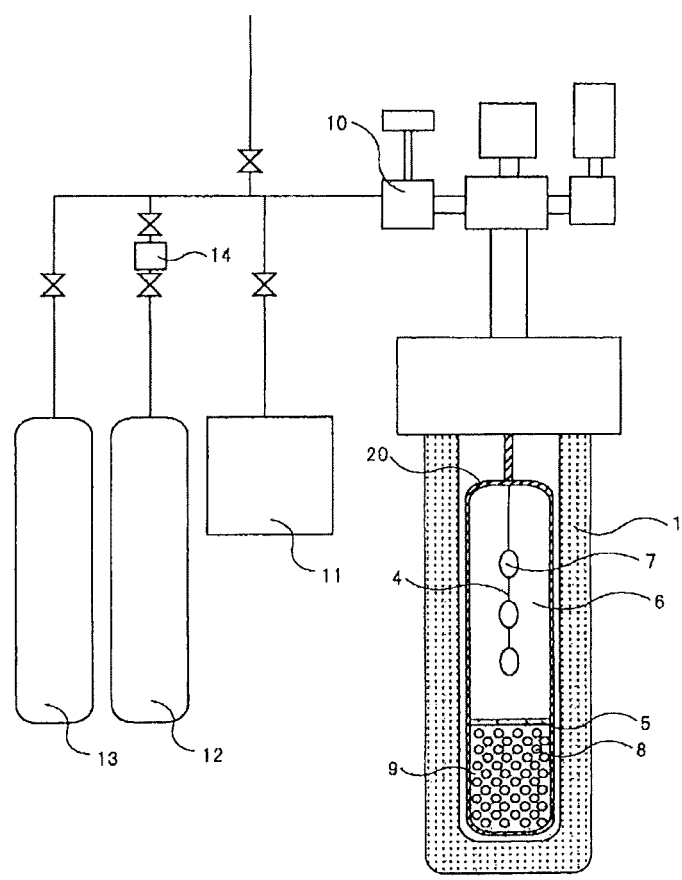
FIG. 2 is a schematic view of another crystal production apparatus usable in the present invention.

Specific examples of the crystal production apparatus usable for the production method for the crystal of a nitride of a Group-13 metal on the Periodic Table of the present invention are shown in FIG. 1 and FIG. 2. The crystal production apparatus for use in the present invention includes a reactor.

FIG. 1 is a schematic view of a crystal production apparatus usable in the present invention. In the crystal production apparatus shown in FIG. 1, the inside of the autoclave (pressure-tight vessel) 1 is lined, and the inner side of the lining 3 serves as a reactor for crystal growth. The inside of the autoclave 1 is composed of a feedstock dissolution zone 9 for dissolution of the feedstock, and a crystal growth zone 6 for growing a crystal. The arrangement of the other components may be the same as that in the crystal production apparatus of FIG. 2 to be described below.

FIG. 2 is a schematic view of another crystal production apparatus usable in the present invention. In the crystal production apparatus shown in FIG. 2, the crystal growth is carried out inside the capsule (inner cylinder) 20 loaded in the autoclave 1 (pressure-tight vessel) as a reactor. The capsule 20 is composed of a feedstock dissolution zone 9 for dissolution of the feedstock, and a crystal growth zone 6 for growing a crystal. In the feedstock dissolution zone 9, a solvent and a mineralizer may be put along with the feedstock 8. Inside the crystal growth zone 6, a ground substrate (or a seed crystal) 7 may be arranged as hung therein with a wire 4. Between the feedstock dissolution zone 9 and the crystal growth zone 6, there is arranged a baffle plate 5 that partitions the two zones.

The opening ratio of the baffle plate 5 is preferably from 2 to 60%, more preferably from 3 to 40%. The material of the surface of the baffle plate is preferably the same as the material of the capsule 20 which is the reactor. In addition, for making it resistant to corrosion and for making the crystal to grow therein have a higher purity, it is desirable that the surface of the baffle plate is formed of Ni, Ta, Ti, W, Mo, Ru, Nb, Pd, Pt, Au, Ir or pBN, more preferably formed of W, Mo, Ti, Pd, Pt, Au, Jr or pBN, even more preferably Pt, Mo or Ti.

The crystal production apparatus shown in FIG. 2 is so designed that the space between the inner wall of the autoclave 1 and the capsule 2 may be filled with a second solvent. The space may be filled with a nitrogen gas from the nitrogen gas cylinder 13 via the valve 10, or may be filled with ammonia as a second solvent from the ammonia gas cylinder 12 while the flow rate thereof is confirmed with the mass flow meter 14. If desired, any necessary pressure reduction may be attained via the vacuum pump 11. The crystal production apparatus to be used in carrying out the production method for the Group-13 metal nitride crystal of the present invention may not always be equipped with the valve, the mass flow meter, etc.

The oxygen concentration inside the reactor is preferably smaller. In particular, the oxygen concentration in the capsule 20 is preferably sufficiently smaller. The oxygen concentration in the reactor is preferably 10 wtppm or less, more preferably 5 wtppm or less, even more preferably 1 wtppm or less. By sufficiently reducing the oxygen concentration in the reactor to be not more than the above-mentioned upper limit, the concentration ratio of hydrogen and oxygen to be introduced into the crystal may fall within the desired range. Accordingly, the formed crystal may be prevented from having strain, and a nitride crystal having more excellent crystallinity can be thereby obtained.

Preferably, the reactor and the installation components are resistant to pressure and resistant to corrosion. For more improving the corrosion resistance of the reactor and the installation components, it is desirable to use the excellent corrosion resistance of a platinum group or platinum group alloy material. The reactor and the installation components themselves may be made of a platinum group or platinum group alloy material, or the inner wall of the reactor may be formed of a platinum group or platinum group alloy material.

Further, the reactor is preferably a pressure-tight vessel. In particular, in a case where the inner wall of the reactor is formed of a platinum group or platinum group alloy material, or where the surface of the reactor and the installation components is coated or lined with a platinum group or platinum group alloy material, it is desirable that the reactor secures the pressure resistance of itself by any other material that forms the reactor.

As the material having pressure resistance and corrosion resistance except platinum group materials, usable here are Ti, W, Ni, Mo, Ru, Nb and alloys thereof. Preferred are Mo, W and Ti.

The constituent material and the coating material for the reactor and the installation components preferably contain a platinum group or platinum group alloy material.

The platinum group includes Pt, Au, Ir, Ru, Rh, Pd and Ag. The platinum group alloy means an alloy that comprises the noble metal as the main ingredient thereof. Of the platinum group alloy, preferred is use of an alloy containing Pt or containing Pt and Ir especially excellent in corrosion resistance.

In a case where the inner wall of the reactor is formed of a platinum group or platinum group alloy material, or where the surface of the reactor and the installation components is coated with a platinum group or platinum group alloy material, it is desirable that the coating material to be used is an alloy containing Pt and Ga. More preferred is use of an alloy containing Ir. The alloy containing the platinum group element of the type is suitable for coating and can realize excellent corrosion resistance.

The Ir content in the alloy is preferably 30% by weight or less relative to the total weight of the alloy, more preferably 25% by weight or less. When the Ir content is defined to be not more than the upper limit, the reactor can realize excellent corrosion resistance.

As the lining material, preferred is at least one metal or element of Pt, Ir, Ag, Pd, Rh, Cu, Au and C, or an alloy or compound containing at least one such metal. Above all, for the reason of easiness in lining, preferred is use of at least one or more metals or elements of Pt, Ag, Cu and C, or an alloy or compound containing at least one or more such metals. For example, there are mentioned a Pt simple substance, a Pt–Ir alloy, an Ag simple substance, a Cu simple substance, graphite, etc.

(Production Step (Crystal Growth))

One example of crystal growth according to the production method for a crystal of a nitride of a Group-13 metal on the Periodic Table of the present invention is described. In carrying out the production method for a Group-13 metal nitride crystal of the present invention, first, a ground substrate (or a seed crystal), a nitrogen-containing solvent, a feedstock and a mineralizer are put into the reactor and sealed up.

Here, as the ground substrate, preferred is a ground substrate having an M-plane as the main plane therein. As described above, the ground substrate may be prepared according to (i) a method for lateral growth from the side face of a seed crystal of which the main crystal plane is nearly the same as the main crystal plane of a Group-13 metal nitride crystal, (ii) a method for growth from the main plane of a seed crystal of which the main crystal plane differs from the main crystal plane of a Group-13 metal nitride crystal, (iii) a method for growth from the side face of a seed crystal of which the main crystal plane differs from the main crystal plane of a Group-13 metal nitride crystal, etc. As described above, the ground substrate prepared according to these methods is preferred, as having few dislocations and, in addition, having little residual strain and excellent in crystal quality. Above all, the ground substrate produced according to the method (ii) is most preferred from the viewpoint of the crystal quality and the productivity.

As the seed crystal, used here is one at least a part of the main plane of which is covered with a growth inhibitor material. Once a tabular crystal has been made to grow on the seed crystal, and again the resultant crystal is used for further crystal growth, the growth inhibitor material may remain on the main surface of the seed crystal or may peel away therefrom.

In the production step in the present invention, it is desirable to provide a step for removing oxygen, oxide or water vapor existing in the reactor, prior to introducing materials into the reactor. For removing oxygen, oxide or water vapor existing in the reactor, there may be employed a method of vacuumizing the reactor after a nitride crystal material has been introduced into the reactor, or a method of filling the reactor with an inert gas after the introduction. In addition, by drying the reactor and various components contained in the reactor, oxygen, oxide or water vapor may be removed. As the drying method, there are mentioned a method of heating the reactor with a heater, a method of combining heating and vacuumizing, etc. Accordingly, the concentration ratio of hydrogen and oxygen to be introduced into the crystal may be controlled to fall within a desired range, and the formed crystal may be prevented from having strain, or that is, a nitride crystal having more excellent crystallinity can be thus obtained.

In the production step, a surface-adsorptive substance separation step may be further provided. The surface-adsorptive substance separation step is a step of fixation of oxygen, oxide or water vapor existing in the reactor. The surface-adsorptive substance separation step includes a step of coating or lining the surface of the reactor or the surface of various components installed in the reactor that contains oxygen, oxide or water vapor. Coating or lining the surface of the components makes it possible to prevent the surface-adsorptive substance from being exposed out and taken in the Group-13 metal nitride crystal formed in the reactor.

In introducing material into the reactor, an inert gas such as a nitrogen gas or the like may be made to run therein. In general, installation of a seed crystal in the reactor may be carried out during or after introduction of a feedstock and a mineralizer thereinto. After installation of the seed crystal, if desired, the container may be degasified by heating. The vacuum degree in degassing is preferably $1 \times 10^{-2}$ Pa or less, more preferably $5 \times 10^{-3}$ Pa or less, even more preferably $1 \times 10^{-3}$ Pa or less.

In a case where the production apparatus shown in FIG. 2 is used, a ground substrate (or a seed crystal) 7, a nitrogen-containing solvent, a feedstock and a mineralizer are put into the capsule 20 serving as a reactor, and sealed up and then the capsule 20 is loaded in the autoclave (pressure-tight vessel) 1, and preferably a second solvent is charged into the space between the pressure-tight vessel and the reactor, and the pressure-tight vessel is sealed up.

Subsequently, the whole is heated so that the inside of the reactor is made to be in a supercritical state and/or a subcritical state. In a supercritical state, in general, the viscosity of a substance becomes low and the substance may be diffused more easily than a liquid, but the substance in the state has the same solvation force as that of a liquid. The subcritical state means a state of a liquid having a density that is nearly the same as the critical density thereof at around the critical temperature. For example, in the feedstock dissolution zone, a supercritical state is reached to dissolve the feedstock, and in the crystal growth zone, the temperature is changed so that a subcritical state occurs and to realize crystal growth utilizing the solubility difference of the feedstock between in the supercritical state and in the subcritical state.

When kept in a supercritical state, in general, the reaction mixture is kept at a temperature higher than the critical point of the solvent. In a case where ammonia is used as the solvent, the critical point thereof is 132° C. as the critical temperature and 11.35 MPa as the critical pressure. When the material filling rate in a reactor is high relative to the volume of the reactor, the pressure therein could far higher than the critical pressure even at a temperature not higher than the critical temperature. In the present invention, "supercritical state" includes the state that is higher than the critical pressure. The reaction mixture is sealed up in the reactor having a predetermined volume, and therefore the temperature increase results in the increase in the fluid pressure. In general, when T>Tc (critical temperature of one solvent) and P>Pc (critical pressure of one solvent), then the fluid is in a supercritical state.

In the supercritical condition, a sufficient growth rate of the Group-13 metal nitride crystal could be realized, but in the present invention, it is desirable that the growth rate of the Group-13 metal nitride crystal is not higher than a predetermined rate. Preferably, the growth rate in the M-axial direction of the ground substrate is 350 µm/day or less, more preferably 300 µm/day or less, even more preferably 200 µm/day or less. Also preferably, the growth rate in the direction vertical to the main plane of the seed crystal is preferably 50 µm/day or more, more preferably 100 µm/day or more, even more preferably 200 µm/day or more.

The reaction time especially depends on the reactivity of the mineralizer and the thermodynamic parameters, or that is the numerical values of the temperature and the pressure. Consequently, it is desirable that, by controlling these conditions, the growth rate of the Group-13 metal nitride crystal is lowered. By controlling the growth rate of the Group-13 metal nitride crystal to be not higher than a predetermined level, the concentration ratio of hydrogen and oxygen to be introduced into the crystal can be controlled to fall within a desired range. In addition, by controlling the growth rate of the Group-13 metal nitride crystal to be not higher than a predetermined level, the degree of the point defect density to be introduced into the crystal may also be controlled to fall within a desired range. Accordingly, the formed crystal may be prevented from having strain, and a nitride crystal having more excellent crystallinity can be thus produced.

In addition, by controlling the growth rate of the crystal of a nitride of a Group-13 metal on the Periodic Table to be not higher than a predetermined level, a tabular crystal having a larger main plane area may tend to be produced.

During synthesis or growth of the Group-13 metal nitride crystal, the pressure inside the reactor is preferably 30 MPa or more, more preferably 60 MPa or more, even more preferably 100 MPa or more, from the viewpoint of the crystallinity and the productivity. In addition, from the viewpoint of safety, the pressure inside the reactor is preferably 700 MPa or less, more preferably 500 MPa or less, even more preferably 350 MPa or less, still more preferably 300 MPa or less. The pressure may be suitably determined depending on the temperature and on the filling rate of the solvent volume relative to the volume of the reactor. Naturally, the pressure inside the reactor could be determined unambiguously depending on the temperature and the filling rate, but in fact, may somewhat vary depending on the feedstock, the additives such as the mineralizer or the like, as well as on the unevenness of the temperature inside the reactor and the existence of a free volume therein.

Regarding the temperature range in the reactor, the lower limit of the temperature is preferably 320° C. or higher, more preferably 370° C. or higher, even more preferably 450° C. or higher from the viewpoint of the crystallinity and the productivity. From the viewpoint of safety, the upper limit is preferably 700° C. or lower, more preferably 650° C. or lower, even more preferably 630° C. or lower. In the production method for the Group-13 metal nitride crystal of the present invention, the temperature in the feedstock dissolution zone in the reactor is preferably higher than the temperature in the crystal growth zone. The temperature difference ($|\Delta T|$) is, from the viewpoint of the crystallinity and the productivity, preferably 5° C. or more, more preferably 10° C. or more, and is preferably 100° C. or less, more preferably 90° C. or less, even more preferably 80° C. or less. A suitable temperature and a suitable pressure inside the reactor may be suitably determined depending on the type and the amount of the mineralizer and other additives to be used in crystal growth.

The injection ratio, or that is, the filling rate of the solvent into the reactor for attaining the temperature range and the pressure range inside the reactor may be defined generally in a range of from 20 to 95%, preferably from 30 to 80%, more preferably from 40 to 70%, on the basis of the liquid density at the boiling point of the solvent having a volume that is equal to the free volume of the reactor, or that is, in a case where a crystal material and a seed crystal are used in the reactor, equal to the remaining volume to be calculated by subtracting the volume of the seed crystal and that of the structure to install the seed crystal, from the volume of the reactor, or in a case where a baffle plate is installed, equal to the remaining volume to be calculated by further subtracting the volume of the baffle plate from the volume of the reactor. In a case where the capsule 20 shown in FIG. 2 is used as the reactor, it is desirable that the solvent amount is suitably controlled so that the pressure inside and outside the capsule 20 could be well balanced in the supercritical state of the solvent.

In the reactor, the Group-13 metal nitride crystal is grown by heating the reactor with an electric furnace equipped with a thermocouple so that the solvent such as ammonia or the like in the reactor could be kept in a subcritical state or a supercritical state. The heating method and the heating rate up to the predetermined temperature are not specifically limited, but in general, the reactor may be heated over a few hours to a few days. If desired, the reactor may be heated in a multistage heating mode, or the heating rate may be changed in the temperature range. Also if desired, the reactor may be heated while partially cooled.

The above-mentioned "reaction temperature" may be measured using a thermocouple provided so as to be in contact with the outer surface of the reactor and/or a thermocouple inserted into the reactor through a hole with a predetermined depth from the outer surface of the reactor, and from the found data, the internal temperature inside the reactor could be presumed through conversion. The temperature data measured with these thermocouples may be averaged to give a mean value as a mean temperature. In general, a mean value of the temperature in the feedstock dissolution zone and the temperature in the crystal growth zone may be referred to as the mean temperature inside the reactor.

The reaction time after having reached a predetermined temperature may vary depending on the type of the Group-13 metal nitride crystal, the feedstock to be used, the type of the mineralizer, and the size and the amount of the crystal to be produced, but may be generally from a few hours to a few hundred days.

During the reaction, the reaction temperature may be kept constant or may be gradually elevated or lowered. After the reaction period of time needed for forming the desired crystal, the reaction temperature is lowered. The temperature-lowering method is not specifically limited. Heating with a heater may be stopped, or the reactor may be left as such in the furnace to be cooled, or the reactor may be taken out of the furnace and then cooled in air. If necessary, the reactor may be rapidly cooled using a coolant, and the mode is often preferred.

In the growth step for the nitride crystal in the present invention, preferably, the crystal growth plane is so controlled that too many facet faces are not exposed out.

For controlling the growth plane so that too many facet faces are not exposed out, it is desirable that the concentration of oxygen to be taken in the crystal is made to be not higher than a predetermined level. For this, the oxygen concentration in polycrystalline gallium nitride used as a feedstock is preferably $1 \times 10^{19}$ atoms/cm$^3$ or less, more preferably $8 \times 10^{18}$ atoms/cm$^3$ or less, even more preferably $5 \times 10^{18}$ atoms/cm$^3$ or less.

Further, in the nitride crystal growth step, preferably, the crystal growth is so controlled as to be in a predetermined growth direction. For controlling the crystal growth to be in a predetermined growth direction, it is desirable that the crystal growth plane is prevented from being uneven. The reason of the unevenness of the crystal growth plane is because of the shortage in the feedstock supply in the growth interface, and the trouble of plane unevenness could be prevented by securing the necessary and sufficient material supply. For securing the necessary and sufficient material supply, the opening ratio of the baffle is preferably 5% or more, more preferably 10% or more, even more preferably 20% or more. In a case where the growth direction could not be stabilized in a predetermined direction, the main plane of the Group-13 metal nitride crystal having grown from the main plane of the ground substrate that has been originally smooth and flat would be roughened. In such a case, the growth direction would deviate from the main plane in some positions, and therefore the point defect density would fluctuate from position to position in the Group-13 metal nitride crystal.

In order to control the crystal growth direction to be in a constant direction, for example, the type and the amount of the mineralizer may be selected or the surface condition of the ground substrate may be controlled.

As described above, by controlling the growth plane and the growth direction of the Group-13 metal nitride crystal, the concentration ratio of hydrogen and oxygen to be introduced into the crystal may be controlled to fall with a desired range. In addition, the point defect density in the crystal may also be controlled to fall within a desired range. Accordingly, the formed crystal may be prevented from having strain, and a Group-13 metal nitride crystal having more excellent crystallinity can be thereby obtained.

After the temperature of the outer surface of the reactor or the presumed temperature inside the reactor has reached a predetermined level or lower, the reactor is opened. The predetermined temperature in this stage is not specifically limited, and is generally from −80° C. to 200° C., preferably from −33° C. to 100° C. Here, a pipe line may be connected with the valve-pipe connection mouth attached to the reactor and the mouth may be connected with a tank filled with water or the like, and then in that condition, the valve may be opened. Further if necessary, the ammonia solvent may be fully removed from the reactor through purging for vacummization and then dried, and after the reactor is opened, the formed Group-13 metal nitride crystal as well as the unreacted material and the additives such as the mineralizer may be taken out.

In the crystal growth step in the production method of the present invention in case a tabular crystal is grown from each of the plural linear openings, the tabular crystals may coalesce with or may be in contact with each other at any other plane than the side end faces thereof; however, from the viewpoint of obtaining plural independent tabular crystals, preferably, the tabular crystals are so grown as to not coalesce with or in contact with each other at any other plane than the side end faces thereof.

After the crystal growth as above, a nitrogen-containing solvent, a feedstock and a mineralizer may be again introduced into the reactor and sealed up to thereby repeat plural times the crystal growth in the direction vertical to the main plane of the seed crystal. In this case, a crystal that comprises the seed crystal and the tabular crystal having grown thereon and integrated may be used as the seed crystal.

Also employable here is a re-growth step of using the tabular crystal obtained in the growth step as a seed crystal, and further growing another crystal thereon. Regarding the growth condition in this case, preferably employed is the condition hereinbefore exemplified for the growth step.

In a case of producing gallium nitride according to the production method for a Group-13 metal nitride crystal of the present invention, preferably referred to is Japanese patent publication JP-A 2009-263229 for details of materials, production conditions, production apparatus and processes except those described hereinabove. The entire disclosure in the patent publication is hereby incorporated by reference in the present specification.

In the production method for a Group-13 metal nitride crystal of the present invention, the growth of a Group-13 metal nitride crystal on a ground substrate may be followed by post-treatment. The type and the object of the post-treatment are not specifically limited. For example, in order to realize easy observation of crystal defects such as pits, dislocations and the like, the crystal surface may be melt (etched) back in the cooling step after the growth.

The crystal growth step in the production method of the present invention may be followed by any known processing steps such as a separation step of separating the tabular crystal from the seed crystal, a slicing step, a surface-polishing step, etc. In the slicing step, concretely, used is a wire slicing, an inner diameter blade slicing, etc. The surface-polishing step includes, for example, an operation of polishing the surface with abrasive grains such as diamond abrasive grains or the like, CMP (chemical mechanical polishing), or an operation for etching the damaged layer through RIE after mechanical polishing. A tabular crystal is grown in the growth step in the present invention, and therefore merely after the separation step of separating the tabular crystal from the seed crystal, a substrate of a nitride of a Group-13 metal on the Periodic Table can be obtained.

The Group-13 metal nitride crystal obtained according to the ammonothermal method is preferably annealed to activate the dopant therein. Through the annealing treatment, the dopant contained in the Group-13 metal nitride single crystal can be activated so that the carrier activation rate may be from 10 to 90% and, in addition, the mobility can also be sufficiently increased.

The annealing treatment time is not specifically limited, but is preferably 5.5 hours or more, more preferably 8 hours or more, even more preferably 10 hours or more, still more preferably 12 hours or more. Also preferably the time is 300 hours or less, more preferably 150 hours or less, even more preferably 120 hours or less, still more preferably 100 hours or less.

The annealing treatment temperature is preferably 750° C. or higher, more preferably 800° C. or higher, even more preferably 850° C. or higher, still more preferably 900° C. or higher. Also preferably, the annealing treatment temperature is 1250° C. or lower, more preferably 1200° C. or lower, even more preferably 1100° C. or lower, still more preferably 1050° C. or lower. When the temperature is 1250° C. or lower, the mass decrease in annealing treatment may be retarded. During the annealing treatment, the temperature may be kept constant, but may be varied stepwise or may be varied continuously. If desired, these may be suitably combined.

The annealing treatment is preferably carried out in an atmosphere where at least one or more selected from a group consisting of ammonia, nitrogen, oxygen and hydrogen exist. Preferred is an atmosphere where at least nitrogen exists. In this case, the nitrogen ratio is preferably 50% or more, more preferably 60% or more, even more preferably 70% or more. In a 100% nitrogen atmosphere, the treatment may also be carried out favorably.

It is desirable that various characteristics of the Group-13 metal nitride crystal mentioned above do not significantly vary before and after the annealing treatment.

<Crystal of Nitride of Group-13 Metal on Periodic Table>

According to the production method of the present invention described hereinabove, plural tabular crystals can be obtained from one seed crystal in a simplified manner. The shape of the tabular crystal is not specifically limited. Preferably, the area of the main plane of the crystal is 0.5 cm$^2$ or more, more preferably 1 cm$^2$ or more, even more preferably 1.5 cm$^2$ or more, and is generally 80 cm$^2$ or less. Preferably, the thickness of the tabular crystal is 50 µm or more, more preferably 100 µm or more, even more preferably 200 µm or more, still more preferably 500 µm or more. Having a thickness not less than the above-mentioned lower limit, the tabular crystal tends to be hardly broken when cut.

The main crystal plane of the tabular crystal is not specifically limited, for which, for example, there are preferably mentioned a {0001} plane, a {10-10} plane, a {11-20} plane, a {11-22} plane, a {20-21} plane, etc. Above all, preferred is a nonpolar plane such as a {10-10} plane or a {11-20} plane, or a semipolar plane such as a {20-21} plane or the like, and more preferred is a {10-10} plane. The other physical properties of the crystal of a nitride of a Group-13 metal on the Periodic Table produced according to the production method of the present invention are not specifically limited. Preferred properties of the crystal are mentioned below.

(Carrier Concentration)

The carrier concentration in the crystal of a nitride of a Group-13 metal on the Periodic Table is, in a case of a GaN crystal, generally $1.0 \times 10^{17}$ cm$^{-3}$ or more, preferably $5.0 \times 10^{17}$ cm$^{-3}$ or more, and is generally $1 \times 10^{19}$ cm$^{-3}$ or less, preferably $8.0 \times 10^{18}$ cm$^{-3}$ or less.

(Half-Value Width of Rocking Curve of X-Ray Diffraction Peak)

The half-value width of the rocking curve of the (100) diffraction peak in X-ray diffraction of the crystal of a nitride of a Group-13 metal on the Periodic Table is generally 50 arcsec or less, preferably 40 arcsec or less, more preferably 30 arcsec or less, even more preferably 25 arcsec or less.

(Radius of Curvature)

The radius of curvature of the crystal of a nitride of a Group-13 metal on the Periodic Table is generally 5 m or more, preferably 10 m or more, more preferably 20 m or more, even more preferably 50 m or more.

(Stacking Fault Density)

The stacking fault density of the crystal of a nitride of a Group-13 metal on the Periodic Table is generally 100 cm$^{-1}$ or less, preferably 50 cm$^{-1}$ or less, more preferably 20 cm$^{-1}$ or less.

The stacking fault density may be measured according to a cathode luminescence method (SEM-CL method), or may be estimated through low-temperature PL measurement.

<Production Method for Crystal of Nitride of Group-13 Metal on Periodic Table>

The production method for a crystal of a nitride of a Group-13 metal on the Periodic Table of the present invention is described concretely hereinunder.

The production method for a crystal of a nitride of a Group-13 metal on the Periodic Table of the present invention is characterized by comprising "a preparation step of preparing a seed crystal, of which at least a part of the main plane is covered with a growth-inhibiting material", and "a growth step for crystal growth of a tabular crystal of a nitride of a Group-13 metal on the Periodic Table, from the linear opening not covered with the growth-inhibiting material in the main plane of the seed crystal, in the direction vertical to the main plane of the seed crystal according to a liquid-phase growth method.

Figure 5A:
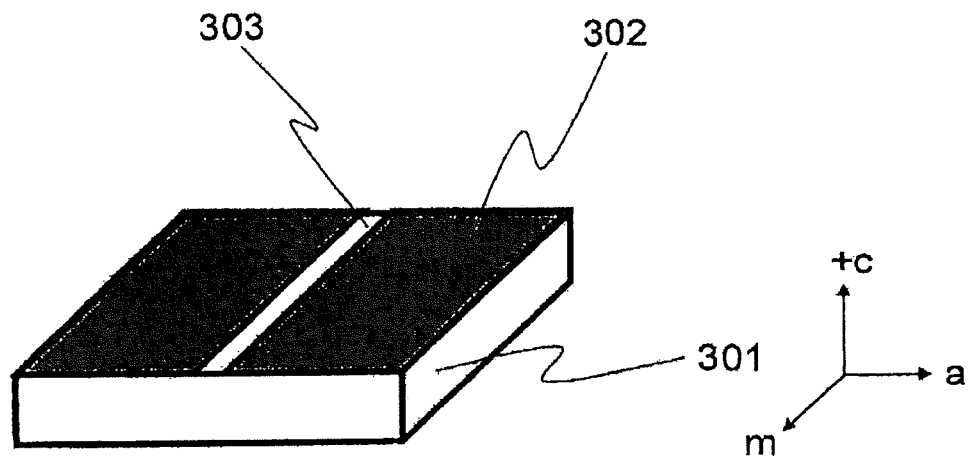
FIG. 5A and FIG. 5B are schematic views for explaining the growth step in the present invention.
Figure 5B:
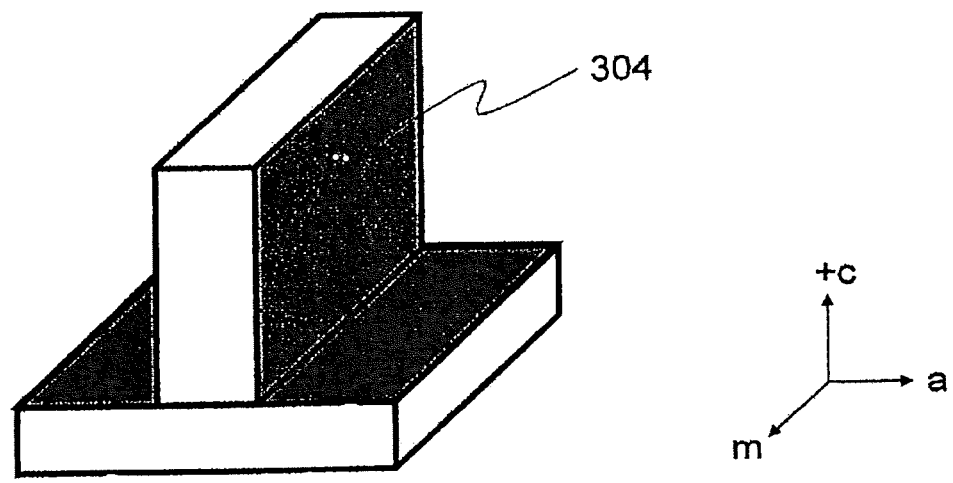

For example, as in FIG. 5A, a seed crystal 301 having a +C-plane as the main plane is used, and on the main plane thereof, formed are plural linear growth-inhibiting materials 302 of which the lengthwise direction is parallel to the m-axial direction, to thereby provide a linear opening 303 of which the lengthwise direction is parallel to the m-axial direction, in the part sandwiched between the growth-inhibiting materials. Next, using the opening 303 as a growth plane, a crystal of a nitride of a Group-13 metal on the Periodic Table is grown according to a liquid-phase growth method, thereby forming a tabular crystal 304 having an A-plane as the main plane, on the opening 303 as in FIG. 5B.

The tabular crystal formed according to the method has few crystal defects, warpage and cracks, and could be a crystal where cracking is retarded during processing treatment. Even in crystal growth according to a liquid-phase growth method, it is considered that, through crystal growth of a tabular crystal from the opening not covered with a growth-inhibiting material as in the above, lateral growth could be promoted in the initial growth stage so that crystal defects could be reduced. Further, it is also considered that, by thick crystal growth in such a degree as to provide a tabular crystal, the growing crystal could overcome the seed crystal so that the warpage propagation in the formed crystal could be prevented. In addition, because of the reason that a liquid-phase growth method requiring a severer growth condition as compared with a vapor-phase growth method is used as the crystal growth method, it would be difficult to firmly fix the growth-inhibiting material formed on the main surface of the seed crystal, still on the main surface thereof during the process of crystal growth so that the growth-inhibiting material would easily peel off owing to the stress or the like generated in the growing layer during the crystal growth. In other words, it is still considered that the stress generated during the crystal growth could be relaxed by the peeling of the growth-inhibiting material, whereby the internal stress remaining inside the growing layer could be reduced and, as a result, cracks to form owing to the stress could be thereby retarded, and further, even in a case where a load is given to the grown crystal in processing treatment thereof, cracking could be prevented.

Further, the main plane of the seed crystal is used as the crystal growth plane here, and therefore crystal growth control is more simplified. In particular, the crystal growth starts from the opening not covered with the growth-inhibiting material in the main plane of the seed crystal, and therefore, by merely adjusting or controlling the shape and the configuration of the opening in a suitable manner, the shape and the number of the tabular crystal to be produced can be readily controlled.

In the present invention, the tabular crystal means a crystal growing from the linear opening, and satisfying the condition of $H>W_2$, where H represents the maximum height of the crystal in the direction vertical to the main plane of the seed crystal, and $W_2$ represents the minimum width thereof in the direction parallel to the main plane of the seed crystal.

[Preparation Step]

The preparation step in the production method for a crystal of a nitride of a Group-13 metal on the Periodic Table of the present invention is a step of "preparing a seed crystal, of which at least a part of the main plane is covered with a growth-inhibiting material". The preparation step may be a step of covering at least a part of the main plane of a seed crystal with a growth-inhibiting material, or a step of getting a seed crystal of which at least a part of the main plane has been already covered with a growth-inhibiting material.

(Seed Crystal)

The seed crystal in the production step of the present invention includes, for example, a substrate of a nitride of a Group-13 metal on the Periodic Table as typified by GaN, or sapphire, Si, SiC, $Ga_2O_3$, GaAs, ZnO (zinc oxide) or the like, and is preferably at least one crystal selected from a group consisting of a nitride of a Group-13 metal on the Periodic Table, sapphire, GaAs, zinc oxide, Si and SiC. Of the nitride of a Group-13 metal on the Periodic Table, preferred is a crystal of the same type as that of the crystal of a nitride of a Group-13 metal on the Periodic Table that is to be grown thereon. For example, in a case where a GaN crystal is to be grown, it is desirable that the seed crystal is also a GaN substrate. As the crystal of a nitride of a Group-13 metal on the Periodic Table, further mentioned are AlN, InN and mixed crystals thereof, in addition to GaN. The mixed crystal includes AlGaN, InGaN, AlInN, AlInGaN, etc. Preferred are GaN and a mixed crystal containing Ga, and more preferred is GaN. In a case where a substrate containing a crystal that differs from the crystal of a nitride of a Group-13 metal on the Periodic Table to be grown thereon is used as the seed crystal, it is desirable to use a substrate having a crystal layer which is made of the same type crystal as the crystal of a nitride of a Group-13 metal on the Periodic Table to be grown thereon and is formed on the crystal of the different type (template substrate).

The shape of the main plane of the seed crystal is not specifically limited, for which there may be mentioned square, hexagonal, dodecagonal, circular, oval or the like form. Preferred is a square form since plural tabular crystals having nearly the same shape could be formed thereon.

The maximum diameter of the main plane of the seed crystal is preferably 10 mm or more, more preferably 15 mm or more, even more preferably 20 mm or more, and is generally 150 mm or less. When the maximum diameter is not less than the lower limit, the size of the main plane of the tabular crystal to be obtained could be larger. The maximum diameter of the main plane means, in a case where the shape of the main plane is a circle, the diameter of the circle, and, in a case where the shape of the main plane is any other than a circle, means the maximum length of the main plane.

The crystal plane of the main plane of the seed crystal is not specifically limited, for which, for example, preferably mentioned are a {0001} plane, a {10-10} plane, a {11-20} plane, a {11-22} plane, a {20-21} plane, etc. For example, in a case where the main plane of the seed crystal is a {0001} plane, the main plane of the tabular crystal to be obtained could be a plane vertical to the {0001} plane, concretely, a nonpolar plane or a semipolar plane, such as a {10-10} plane or a {11-20}. On the other hand, in a case where the main plane of the seed crystal is a {10-10} plane, the main plane of the tabular crystal to be obtained could be a plane vertical to the {10-10} plane, concretely, a {0001} plane, a {11-20} plane or a semipolar plane. In a case where the main plane of the seed crystal is a {11-20} plane, the main plane of the tabular crystal to be obtained could be a plane vertical to the {11-20} plane, concretely, a {0001} plane, a {10-10} plane, or a semipolar plane. In a case where an ammonothermal method is employed as the crystal growth method in the growth step to be described hereinunder, preferred is a nitrogen plane from the viewpoint of the rapid growth rate thereon.

The thickness of the seed crystal is not also specifically defined, but is preferably 100 μm or more, more preferably 200 μm or more.

The crystal growth method for the seed crystal is not defined at all. In a case where a crystal of a nitride of a Group-13 metal on the Periodic Table such as GaN or the like is used as the seed crystal, the crystal may be one having been grown according to a vapor-phase growth method such as a hydride vapor-phase epitaxial method (HVPE method), an organic metal chemical vapor deposition method (MOCVD method), an organic metal chloride vapor-phase growth method (MOC method), a molecular beam epitaxial method (MBE method), etc.; or may be one having been grown according to a liquid-phase growth method such as a liquid-phase epitaxial method (LPE method), a flux method, an ammonothermal method (in this specification, an ammonothermal method is classified as a liquid-phase growth method), etc. Of those, preferred is a crystal obtained according to an HVPE method from the viewpoint of using a seed crystal having a large main plane area, and also preferred is a crystal obtained according to an ammonothermal method from the viewpoint of improving the crystal quality of the tabular crystal to be obtained.

(Growth-Inhibiting Material)

The growth-inhibiting material in the production method of the present invention is a component functioning as a mask, and is provided for preventing the growth of a crystal of a nitride of a Group-13 metal on the Periodic Table, on the main plane of the seed crystal. The growth-inhibiting material is formed partially on the surface of the main plane of the seed crystal in such a manner that linear openings, in which the main plane surface of the seed crystal is exposed out, could remain therein. The growth-inhibiting material is not specifically limited so far as the material does not dissolve or decompose during the reaction, and includes, for example, Ca, Mg, Si, Al, W, Mo, Ti, Pt, Ir, Ag, Au, Ta, Ru, Nb, Pd, and alloys thereof, as well as oxides, nitrides and fluorides thereof.

Not specifically limited, the shape of the growth-inhibiting material may be any one capable of providing, in the main plane of the seed crystal, linear openings that are to be starting points for the growth of a tabular crystal. Preferably, the growth-inhibiting material has a linear part to be the side face in the lengthwise direction of the linear opening. More preferably, for example, the growth-inhibiting material has a polygonal shape, such as a triangle, square or hexagonal shape, and even more preferably has a stripe type shape.

Not specifically limited, the width $W_1$ of the linear opening is preferably 1 μm or more, more preferably 5 μm or more, even more preferably 10 μm or more, still more preferably 20 μm or more, and is preferably 5000 μm or less, more preferably 1000 μm or less, even more preferably 800 μm or less, still more preferably 500 μm or less, most preferably 200 μm or less. The lower limit or more could promote the crystal growth from the linear opening, and the upper limit or less could reduce the influence of the seed crystal on the growing crystal.

Also not specifically limited, the length $L_1$ in the lengthwise direction of the linear opening is preferably 10 mm or more, more preferably 20 mm or more, even more preferably 25 mm or more. The lower limit or more could make it possible to produce a large-size crystal.

Not specifically limited, the lengthwise direction of the linear opening is, for example, in a case where a seed crystal having a {0001} plane as the main plane is used, may be the <11-20>direction in order to obtain a tabular crystal having a {10-10} plane as the main plane, but for obtaining a tabular crystal having a {11-20} plane as the main plane, the lengthwise direction of the opening may be the <10-10> direction.

Similarly, in a case where a seed crystal having a {10-10} plane as the main plane is used, the lengthwise direction of the opening may be the <11-20> direction for obtaining a tabular crystal having a {0001} plane as the main plane. On the other hand, in a case where a seed crystal having a {11-20} plane as the main plane is used, the lengthwise direction of the opening may be the <10-10> direction for obtaining a tabular crystal having a {0001} plane as the main plane.

The number of the linear openings is not specifically limited. In general, the seed crystal may have one opening, but preferably has 2 or more openings, more preferably 3 or more openings, and has, in general, 100 or less openings. The lower limit or more could make it possible to efficiently form tabular crystals growing from one seed crystal.

In a case where plural linear openings are provided, the number and the configuration of the openings are not defined at all. Plural such linear openings may be formed so as to be nearly parallel to each other. In this case, the pitch of the plural openings to be formed is not defined at all, but is preferably 500 μm or more, more preferably 1 mm or more, even more preferably 2 mm or more, still more preferably 4 mm or more. The lower limit or more could make it possible to prevent contact or coalescence of the growing tabular crystals with each other.

On the other hand, the yield of the tabular crystal is higher when the pitch is narrower, and therefore, the pitch is preferably 50 mm or less, more preferably 20 mm or less.

Figure 6A:
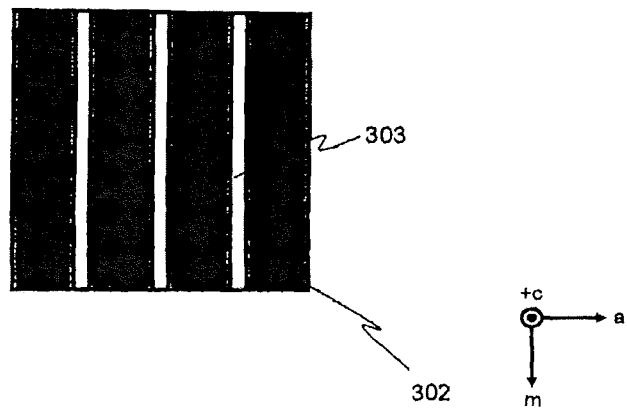
FIG. 6A to FIG. 6C are conceptual views for showing specific examples of providing plural linear openings.
Figure 6B:
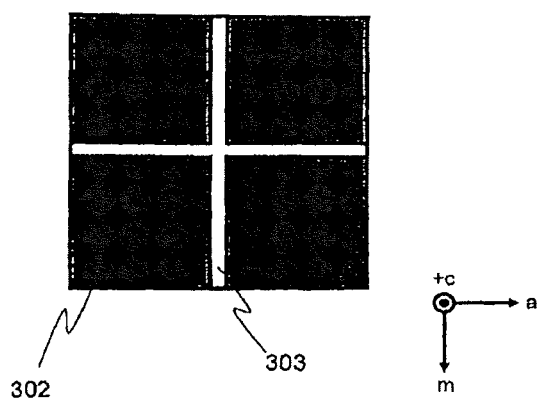
Figure 6C:
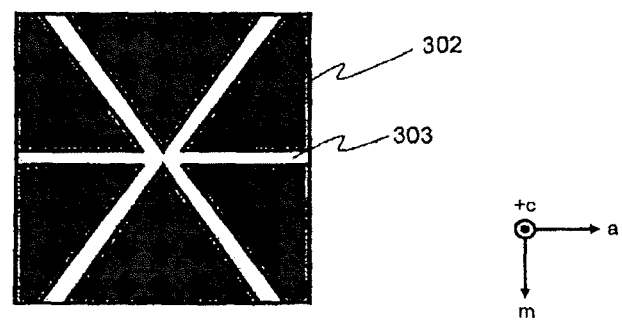

Specific examples of providing plural linear openings are shown in FIG. 6A to FIG. 6C. FIG. 6A shows an example where plural stripe type growth-inhibiting materials 302 are provided in parallel to each other, and plural linear openings 303 are formed in parallel to each other. These plural linear openings are so formed that the lengthwise direction thereof is parallel to the m-axis, and therefore in this example, plural tabular crystals tend to be formed each having an A-plane as the main plane. FIG. 6B shows an example where plural square growth-inhibiting materials 302 are provided in parallel to the a-axial direction and are also provided in parallel to the m-axial direction to thereby form a cross type (lattice-type) opening 303. The cross type (lattice-type) opening is so configured that the linear opening of which the lengthwise direction is parallel to the m-axis and the linear opening of which the lengthwise direction is parallel to the a-axis intersect with each other, and therefore in this example, a tabular crystal having an A-plane as the main plane and a tabular crystal having an M-plane as the main plane tend to be grown at the same time. Further, FIG. 6C shows an example where plural trapezoidal growth-inhibiting materials 302 and plural triangular growth-inhibiting materials 302 are provided as combined, thereby forming an asterisk type opening 303. The asterisk type opening is so configured that the linear openings all parallel to the a-axis but extending in three directions different from each other by 60° are crossed at one point, and therefore, in this example, plural tabular crystals each having an M-plane as the main plane tend to be grown at the same time.

The growth-inhibiting material may be formed only on the main plane of the seed crystal but also on the side face thereof. However, from the viewpoint that the tabular crystals having grown from the plural linear openings are bonded at the side end face of each crystal, it is desirable that the growth-inhibiting material is not provided at least on the side face of the seed crystal adjacent to the linear opening, or that is, it is desirable that the side face is kept exposed out. When the side face of the seed crystal adjacent to the linear opening is kept exposed out, the lateral growth from the side face could be promoted so that the crystal having grown in the lateral direction from the side face and the tabular crystal having grown from the linear opening formed on the main plane could be well bonded. Preferably, the ratio of the length of the side face of the seed crystal adjacent to the linear opening to the minimum width $W_1$ of the opening is 100 or more, more preferably 200 or more, even more preferably 400 or more. The lower limit or more tends to promote the growth in the lateral direction from the side face. The length of the side face of the seed crystal adjacent to the opening means the maximum length of the side face in the direction parallel to the main plane. The plane orientation of the side face of the seed crystal adjacent to the opening is not specifically limited, but is preferably a polar plane such as a +C-plane, −C-plane or the like; a nonpolar plane such as an M-plane, an A-plane or the like; or a semipolar plane such as a (10-1-1) plane, a (10-1-1) plane or the like.

Further, the growth-inhibiting material may be provided on the outer periphery of the main plane of the seed crystal, but it is desirable that the growth-inhibiting material is not provided in the region of 0.1 mm toward the center from the outer periphery, or that is, it is desirable that the region of 0.1 mm toward the center from the outer periphery is kept as an exposed part. More preferably, the region of 5 mm from toward the center from the outer periphery is an exposed part. When the area near the outer periphery is made an exposed part in that manner, the crystal growth may be promoted in such a way that the side end face of the tabular crystal having grown from the linear opening is bonded to the crystal having grown from the side face and the exposed area near the outer periphery of the seed crystal.

The proportion of the area covered with the growth-inhibiting material of the main plane of the seed crystal is not specifically limited. Preferably, the proportion is 90% or more, more preferably 95% or more, and is generally 99.99% or less. The lower limit or more tends to inhibit the propagation of warp and crystal defects from the seed crystal to the grown tabular crystal.

[Growth Step]

The growth step in the production method for a crystal of a nitride of a Group-13 metal on the Periodic Table of the present invention is a step for "crystal growth of a tabular crystal of a nitride of a Group-13 metal on the Periodic Table, from the linear opening not covered with the growth-inhibiting material in the main plane of the seed crystal, in the direction vertical to the main plane of the seed crystal according to a liquid-phase growth method".

The shape of the tabular crystal to be grown is not specifically limited, but preferably, the width $W_1$ of the linear opening and the minimum width $W_2$ of the tabular crystal in the direction parallel to the main plane of the seed crystal satisfy a relationship of $W_2 > W_1$. Satisfying the relationship tends to promote lateral growth of the crystal in the initial stage of growth to reduce the formation of crystal defects. From this viewpoint, the ratio of the minimum width $W_2$ of the tabular crystal in the direction parallel to the main plane of the seed crystal to the width $W_1$ of the linear opening is preferably 5 or more, more preferably 10 or more, even more preferably 20 or more, and is generally 1000 or less.

Also preferably, the ratio of the minimum length $L_2$ of the tabular crystal in the direction parallel to the main plane of the seed crystal, to the length $L_1$ of the linear opening is 0.3 or more, more preferably 0.5 or more, even more preferably 0.6 or more, still more preferably 0.8 or more, and is generally 2 or less. The lower limit or more tends to increase more the main plane area of the tabular crystal to be obtained. In a case of crystal growth where the tabular crystals having been grown from plural linear openings are bonded at the side end face thereof, tabular crystals satisfying the lower limit or more tend to be obtained in a more simplified manner.

Also preferably, the ratio of the maximum height H of the tabular crystal in the direction vertical to the main plane of the seed crystal, to the length $L_1$ of the linear opening is 0.1 or more, more preferably 0.2 or more, even more preferably 0.3 or more, still more preferably 0.5 or more, and is generally 2 or less. The lower limit or more tends to further increase the main plane area of the tabular crystal to be obtained.

The number of the tabular crystals to be grown is not specifically limited. The same number of tabular crystals as the number of the openings can be grown. For example, in a case where a seed crystal with plural openings formed therein is used, a tabular crystal can be grown from each of the openings in the direction vertical to the main plane of the seed crystal.

Figure 7A:
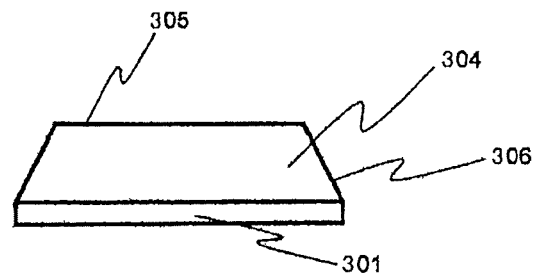
FIG. 7A to FIG. 7E are conceptual views for showing specific examples of a case of crystal growth where tabular crystals bond to each other at the side end faces thereof.
Figure 7B:
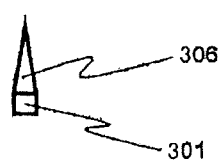

Further, in a case of crystal growth of plural tabular crystals, it is desirable that the tabular crystals bond to each other at the side end face thereof. For example, as shown in FIG. 7A and FIG. 7B, in a case where a tabular crystal is grown in the direction vertical to the main plane of the seed crystal 301 from the opening formed in the main plane of the seed crystal, the side end face 306 adjacent to the main growth plane 305 of the tabular crystal to be grown is a stable plane, as in FIG. 7A, though depending on the plane orientation of the main plane of the seed crystal, and with the growth, the area of the main growth plane 305 may decrease. FIG. 7B is a side view of FIG. 7A. As in FIG. 7B, the width of the side end face 306 may decrease with the growth of the crystal, or that is, the thickness of the tabular crystal may decrease with the growth. The main growth plane of the growing tabular crystal means the plane thereof that is parallel to the main plane of the seed crystal, among the growth planes of the tabular crystal.

Figure 7C:
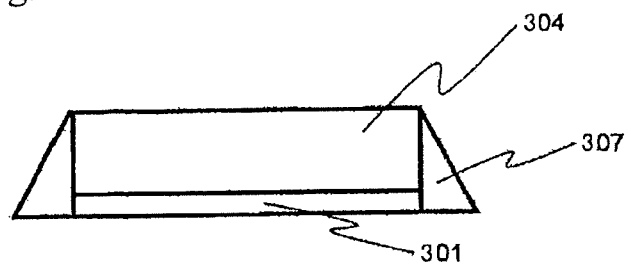
Figure 7D:
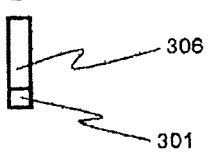
Figure 7E:
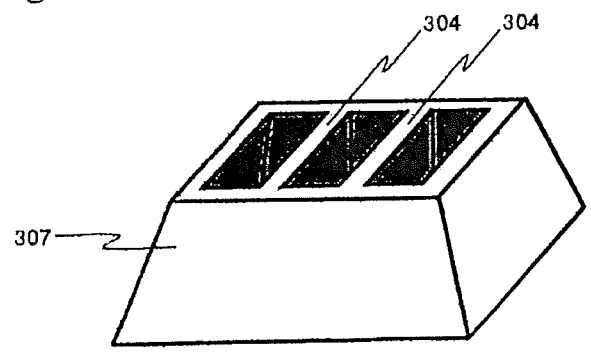

On the other hand, as in FIG. 7C, FIG. 7D and FIG. 7E, in a case of crystal growth not only from the opening but also from the side face of the seed crystal 301, the tabular crystals having grown from plural openings may be made to bond to each other at the side end face thereof. In this case, the side end face of the tabular crystal bond to the other via the lateral-growing crystal 307 that has grown in the lateral direction from the side face of the seed crystal. The lateral-growing crystal 307 thus formed may play a role as a guide, and, as in FIG. 7C, the side end face of the tabular crystal could not be a stable plane and the area of the main growth plane can be prevented from reducing, or as in FIG. 7D, the reduction in the width of the side end face can be prevented from reducing with the growth, and further, the main growth direction of the tabular crystal could be in the direction vertical to the main plane of the seed crystal to increase the growth rate. For effectively forming the crystal 307 growing in the lateral direction, the region of from 0.1 to 5 mm or so toward the center from the outer periphery of the main plane of the seed crystal may be exposed out to be an exposed part, as described above.

Not specifically limited, the crystal growth method may be any liquid-phase growth method capable of forming a tabular crystal of a nitride of a Group-13 metal on the Periodic Table. For example, any known growth method such as a liquid-phase epitaxial method (LPE method), a flux method, an ammonothermal method or the like may be suitably employed. Above all, preferably employed here is the above-mentioned ammonothermal method, in which the crystal growth rate in the −c-axial direction can be high.

(Substrate (Wafer) of Nitride of Group-13 Metal on Periodic Table)

The crystal of a nitride of a Group-13 metal on the Periodic Table having grown on a ground substrate may be post-treated by slicing, cutting or polishing to give a substrate of the nitride of a Group-13 metal on the Periodic Table.

(Device)

The substrate of a crystal of a nitride of a Group-13 metal on the Periodic Table obtained according to the production method of the present invention is favorably used in various devices, or that is, for applications to light-emitting elements, electronic devices, power devices, etc. The light-emitting element in which the crystal of a nitride of a Group-13 metal on the Periodic Table of the present invention or a wafer thereof is used includes a light-emitting diode, a laser diode, a light-emitting element comprising any of these and a fluorescent material, etc. The electronic device in which the crystal of a nitride of a Group-13 metal on the Periodic Table of the present invention or a wafer thereof is used includes a radio frequency device, a high-voltage high-power element, etc. Examples of the radio frequency device include transistors (HEMT, HBT); and examples of the high-voltage high-power element include thyristors (SCR, GTO), insulating gate bipolar transistors (IGBT), Schottky barrier diodes (SBD). The epitaxial wafer of the present invention is characterized by having a characteristic excellent in pressure resistance, and is therefore suitable to any of the above-mentioned applications.

EXAMPLES

The characteristics of the present invention are described further concretely with reference to Examples and Comparative Examples given below. In the following Examples, the material used, its amount and ratio, the details of the treatment and the treatment process may be suitably modified or changed not overstepping the spirit and the scope of the present invention. Accordingly, the scope of the present invention should not be limitatively interpreted by the Examples mentioned below.

Examples 1-1 to 1-8

[Preparation of Ground Substrate]

In this Example, first carried out was crystal growth for preparing a ground substrate using the reaction apparatus shown in FIG. 2. For the crystal growth, used was an autoclave 1 made of a nickel-based alloy as the pressure-tight vessel, and a capsule 20 made of Pt—Ir was used as the reactor.

As a feedstock 8, polycrystalline GaN particles were set into the lower zone (feedstock dissolution zone 9) of the capsule, and as a mineralizer, high-purity $NH_4F$ was put into the capsule. Further, between the lower feedstock dissolution zone 9 and the upper crystal growth zone 6, there was arranged a platinum baffle plate 5. As a seed crystal 7, C-plane substrates each having a diameter of 50 mm, which had been prepared according to an HVPE method, were arranged in the crystal growth zone 6 of the upper area of the capsule, while kept hung therein using a platinum wire and a seed supporting frame. On the main plane (N-plane) surface of the seed crystal 7, formed was a mask of a TiW alloy in such a manner that long and thin linear openings each having a width of 100 μm ($W_1$) and kept arranged so that the lengthwise direction thereof could be parallel to the a-axial direction (parallel to the M-plane), at an interval (pitch) of 1000 μm, and a part of the CMP-finished region of the main plane (N-plane) surface was kept exposed out via the thin and long openings. Next, according to the process shown below, crystal growth was carried out toward the −c-axial direction (<000-1>, N-direction) from the thin and long opening so as to expand the M-plane of the growing crystal.

A cap made of Pt—Ir was connected to the upper part of the capsule 20 by welding, the lower part of the capsule 20 was cooled with liquid nitrogen, then the valve was opened and the capsule was charged with HI not brought into contact with open air. Next, the capsule 20 was connected to an $NH_3$ gas line, and filled with $NH_3$ not brought into contact with open air. Based on flow rate control, $NH_3$ was introduced into the capsule as a liquid corresponding to about 55% of the effective volume of the capsule (in terms of the $NH_3$ density at −33° C.), and then the valve was again closed. Subsequently, the tube at the top of the cap was sealed up and cut out using a welder. The F concentration introduced into the capsule 20 was 0.5 mol % relative to $NH_3$ and the I concentration was 2.0 mol %.

Next, the capsule 20 was inserted into the autoclave, and the autoclave was sealed up.

Subsequently, the valve was opened for vacuum deaeration, and while the vacuum state was kept as such, the autoclave 1 was cooled with a dry ice-ethanol solvent, a duct was connected to the $NH_3$ cylinder 12 and $NH_3$ was charged in the autoclave 1 not brought into contact with open air, and thereafter the valve 10 was again closed.

The autoclave 1 was set in an electric furnace composed of plural divided heater sections.

The autoclave 1 was so heated, while controlling by the outer surface temperature of the autoclave 1, that the mean temperature inside the autoclave 1 could be 600° C. and the temperature difference ($|\Delta T|$) inside it could be 20° C., and after having reached the preset temperature, the autoclave was kept at that temperature for 20 days. The pressure inside the autoclave 1 was 215 MPa. During the heating, the outer surface controlled temperature fluctuation of the autoclave was ±0.3° C. or less.

While the autoclave 1 was cooled, the valve 10 attached to the autoclave 1 was opened, and $NH_3$ inside the autoclave 1 was removed.

The autoclave 1 was metered and discharge of $NH_3$ was confirmed, and then the cap of the autoclave 1 was opened, the capsule 20 was taken out, and further the crystal inside it was taken out. Tabular gallium nitride crystals growing in the −c-axial direction (<000-1>, hereinafter referred to as N-direction) were formed on the seed crystal, and the growing thickness in the N-direction was 7 mm.

From the gallium nitride crystal, gallium nitride wafers having an M-plane as the main plane along the c-axis were cut out. Both the front side and the back side of M-planes which are main planes and all the four side faces of the wafer were etched to remove the damage, and further, both the surface and the back of the M-plane were mirror-polished. The resultant, both surfaces-polished crystal was analyzed through X-ray diffractiometry, which confirmed that the crystal was a hexagonal system crystal and did not contain a cubic GaN crystal.

[Growth Step for Homo-Growth on the Main Plane of Ground Substrate]

The wafer having a size of 35 mm long side×7 mm short side and a thickness of 330 μm and having an M-plane as the main plane thus produced in the manner as above, was used here as a ground substrate. On the ground substrate, a Group-13 metal nitride crystal was grown. As the ground substrate, used was one that had been CMP-finished on the entire surface of the main plane (M-plane) for homo-growth mainly on the M-plane as the growth plane. The growth of the Group-13 metal nitride crystal was carried out according to the same ammonothermal method as that for the crystal growth in the above-mentioned [Preparation of Growth Substrate]. In each Example for crystal growth, the oxygen concentration in the feedstock, the type of the mineralizer, the halogen concentration therein relative to the ammonia solvent, the growth temperature and the growth pressure are as shown in Table 1.

The crystal taken out was observed, and was a gallium nitride crystal having an M-plane as the main plane. The size was around 10 mm in c-axis×40 mm in a-axis×6 mm in m-axis.

Plural tabular crystals each having an M-plane as the main plane were cut out of the resultant gallium nitride crystal. Both the front side and the back side of M-planes which are main planes and the four side faces were etched to remove damages. Further, the surface and the back of the M-plane were mirror-finished to give a GaN crystal A. The resultant GaN crystal A was analyzed through X-ray diffractiometry, which confirmed that the crystal was a hexagonal system crystal and did not contain a cubic GaN crystal.

[Annealing Treatment]

The surface-polished GaN crystal A having an M-plane as the main plane, which had been produced in the manner as above, was put on a graphite-based surface-coated susceptor and introduced into an annealing furnace. Subsequently, the atmosphere inside the annealing furnace was changed from air to nitrogen. With that, the atmospheric gas inside the furnace was made to be composed of 90% nitrogen and 10% ammonia, and the heater was switched on, the temperature controlling program was started, and the furnace was heated up to 1000° C. In this stage, the heating rate was within a range of from 100 to 1000° C./hr. After having reached 1000° C., the furnace was kept as such for 50 hours, and then cooled at a cooling rate of from 100 to 300° C./hr. The atmospheric gas inside the furnace was kept having the same composition all the time from the start of heating to cooling to 300° C. When the annealing furnace temperature reached 300° C., ammonia supply was stopped, and when the temperature inside the furnace reached room temperature, the annealing furnace was opened, and the gallium nitride crystal was taken out to be a GaN crystal B.

The crystal that had been yellowed in visual observation before the annealing became pale, and the transparency thereof increased, from which it was confirmed that the annealing could have a discoloration-relaxing effect.

[Analysis Evaluation of Gallium Nitride Crystal]

The GaN crystal A and the GaN crystal B obtained before and after annealing treatment were evaluated in point of the physical properties thereof mentioned below.

<Impurity Concentration Analysis>

In the GaN crystal B, the gallium nitride crystal after the annealing treatment in Examples 1-1 to 1-8 was subjected to quantitative analysis through SIMS for the H and 0 concentration therein. As the apparatus, used was a secondary ion mass spectrometer (SIMS) IMS4f by CAMECA. Regarding the analysis condition, the primary ion beam was Cs, the primary ion energy was 14.5 keV, and the secondary ion polarity was negative. The detection limit under the condition was from $1\times10^{17}$ to $2\times10^{17}$ atoms/cm$^3$ for H, and from $1\times10^{16}$ to $2\times10^{16}$ atoms/cm$^3$ for O. The hydrogen concentration and the oxygen concentration in the resultant gallium nitride crystal are shown in Table 1. In Examples 1-1 to 1-8, the ratio of the hydrogen concentration to the oxygen concentration (H/O) was within a range of from 0.5 to 4.5.

<Stacking Fault Density>

The GaN crystal B obtained in Examples 1-1 to 1-4 and 1-6 was analyzed for the stacking fault density (SFD) thereof, according to the method mentioned below. At 5 kV and 500 pA in a 200-power viewing field, the crystal was evaluated through low-temperature cathode luminescence (LTCL) observation. The stacking fault density (SFD) may also be estimated through low-temperature PL measurement.

The lateral lines existing in the direction parallel to the C-plane of the LTCL image are stacking faults. The measurement was carried out in a few different sites in the M-plane as the main plane, and in every observation, the stacking fault density was 0 cm$^{-1}$.

<Measurement According to Positron Annihilation Spectroscopy>

The GaN crystal A and the GaN crystal B produced according to the method of Example 1-2, and the GaN crystal A obtained in Example 1-6 were analyzed for the S-parameter, the positron diffusion length and the positron lifetime according to the methods described in detail in this specification.

The S-parameter of the GaN crystal A produced according to the method of Example 1-2 was 0.454, and the positron diffusion length thereof was 30±1 nm. On the other hand, the S-parameter of the GaN crystal B was 0.452, and the positron diffusion length thereof was 32±1 nm, or that is, the data changed little from those before the annealing.

The GaN crystal A obtained in Example 1-6 was analyzed in two different points for the S-parameter and the positron diffusion length thereof. The S-parameter in each point was 0.452 or 0.453, and the positron diffusion length was 29±3 nm or 35±4 nm. The positron lifetime τ1 was 136.7±6 ps, and τ2 was 214.5±4 ps.

As described above, the S-parameter of the gallium nitride crystal before and after annealing that had been obtained according to the method of Example 1-2, and the gallium nitride crystal before annealing in Example 1-6 was 0.448 or more, and the positron diffusion length thereof was from 15 to 50 nm. In Example 1-6, i is the time constant of the attenuation curve of the positron lifetime spectrum. τ1 is for the case where positrons annihilate interstitially, and in the case, the positrons annihilates in a short period of time. τ2 is for the case where vacancy-type defects exist and where positrons are trapped by the defects to annihilate. Of the crystals of Examples, the value of the positron lifetime expressed by τ2 was calculated, and the time was longer as compared with τ1. From this, it is known that the crystals contain point defects on a certain level or more. From the values obtained in the measurements, the vacancy-type point defect density contained in the crystal was calculated, and in terms of the single atom, the density was estimated to be from $1\times10^{17}$ to $9\times10^{17}$ atoms/cm$^3$ or so.

<Half-Value Width of X-ray Rocking Curve (XRC)

The X-ray rocking curve (XRC) was measured with a high-resolution X-ray diffractometer by PANalytical. As shown in FIG. 4, the sample was irradiated with a Cu-Kα (emission) line from the X-ray source 200, while on the incident side, an X-ray mirror 201 and a Ge (220) double crystal hybrid monochromator 203 or a Ge (440) four-crystal monochromator 204 were arranged, and on the detector side, an open detector 205 was used. Using the optical system, rocking curve measurement was carried out for GaN (100) reflection and GaN (102) reflection with the former dispersive crystal, while for GaN (200) reflection and GaN (102) reflection with the latter dispersive crystal, and the crystal orientation distribution in the tilt and twist direction of the crystal 250 was evaluated. Here, (100), (200) and (102) each represent the X-ray diffraction plane.

The half-value width of XRC measured with the former dispersive crystal was referred to as "XRC half-value width", while the half-value width of XRC measured with the latter dispersive crystal was referred to as "high-resolution XRC half-value width". The results in Examples 1-1 to 1-8 are shown in Table 2.

The smaller half-value width of the X-ray rocking curve (XRC) means that the crystal has few dislocations and the crystal orientation is good. The crystal having an XRC half-value width of 25 arcsec or less is presumed to have a high-resolution XRC half-value width of 25 arcsec or less, which is preferably 15 arcsec or less.

The XRC half-value width for GaN (100) reflection of the GaN crystal A obtained in Example 1-2 was 21.0 arcsec, and the XRC half-value width for GaN (102) reflection thereof was 22.3 arcsec, and both were good values not higher than the resolution of the apparatus used. With that, the high-resolution XRC half-value width of the GaN crystal A produced according to the method of Example 1-2 was measured. The high-resolution XRC half-value width for GaN (200) reflection of the crystal was 7.4 arcsec, and the high-resolution XRC half-value width for GaN (102) reflection thereof was 8.8 arcsec, which confirmed extremely good crystallinity of the crystal.

The XRC half-value width of the gallium nitride crystal before and after annealing in Example 1-3, the GaN crystal A and the GaN crystal B was measured. The XRC half-value width for GaN (100) reflection of the GaN crystal A was 23.8 arcsec, the XRC half-value width for GaN (102) reflection thereof was 22.3 arcsec, the XRC half-value width for GaN (100) reflection of the GaN crystal B was 28.2 arcsec, the XRC half-value width for GaN (102) reflection thereof was 20.6 arcsec, and thus, there was no significant change before and after annealing. All were good values on the level of resolution of the apparatus, and therefore it is presumed that the high-resolution XRC half-value width of those crystals would be further smaller.

The high-resolution XRC half-value width of the GaN crystal A obtained in Example 1-6 was measured. The high-resolution XRC half-value width for GaN (200) reflection of the crystal was 6.9 arcsec, and the high-resolution XRC half-value width for GaN (102) reflection thereof was 9.2 arcsec, which confirmed extremely good crystallinity of the crystal.

The XRC half-value width for GaN (100) reflection of the GaN crystal B, the gallium nitride crystal after annealing in Example 1-6 was 25.4 arcsec, and the XRC half-value width for GaN (102) reflection thereof was 28.4 arcsec, and thus the crystallinity of the crystal did not change before and after annealing and it was known that the crystallinity of the crystal was sufficiently good.

The XRC half-value width for GaN (100) reflection and GaN (102) reflection of the GaN crystal B obtained in Examples 1-1 to 1-8 was less than 30 arcsec except only one case, from which it is known that all these crystals had extremely good crystallinity.

The GaN crystal B in Example 1-5 in which the oxygen concentration in the crystal was relatively high as compared with that in the others had an XRC half-value width for GaN (100) reflection of 34.2 arcsec and was somewhat large, but the XRC half-value width for GaN (102) reflection of the crystal was 24.3 arcsec and was a good value. Thus, it was confirmed that the crystal had sufficient crystallinity for use as a semiconductor substrate.

<Radius of Curvature)

The radius of curvature was measured, using a high-resolution X-ray diffractometer by PANalytical equipped with a monoaxial stage (x-axis) or biaxial stage (x-y) high-definition cradle. Concretely, the sample was moved in the monoaxial direction (x-direction) at intervals of from 0.5 to 5 mm, and the X-ray rocking curve was determined at every point. From the found data, the ω-value to give the maximum intensity was calculated, and the co-value was plotted relative to the moving distance x. According to the least-square method, the inclination k of the graph was calculated. From the inclination k, the radius of curvature R [m] was calculated according to the following equation.

$$R=1/k\times 180\times \pi/1000$$

Of the gallium nitride crystal of Examples 1-1 to 1-6, the radius of curvature was measured in the a-axial direction and the c-axial direction, and the data are shown in Table 2. In those having a larger radius of curvature, the crystal lattices aligned evenly, and it may be said that the crystals of the type are good crystals not having defects such as dislocations and cracks, etc.

<Absorption Coefficient>

An absorption coefficient is related with the impurity concentration and the point defect density of a crystal, and is an index that indicates the transparency of a crystal. An absorption coefficient for a wavelength of 445 nm falling within a range of 1 or less means that the impurity concentration and the point defect density of the crystal each are within a desired range, and the crystallinity of the crystal is on a certain level or more.

Put in an integrating sphere, the gallium nitride crystal after annealing in Examples 1-1 to 1-3 and 1-6 to 1-8 was irradiated with a laser ray at 405 nm or 445 nm, and the absorption characteristics of the crystal were evaluated. From the Lambert-Beer law, the absorption coefficient of the crystal was calculated. Measurement in the integrating sphere can remove the loss factor except absorption. The results are shown in Table 2. The thickness of the gallium nitride crystal tested here was about 275 μm.

<Dislocation Density (DSD)>

In CL observation, the dark spot density in the crystal was determined to calculate the dislocation density (DSD) of the crystal.

Of the gallium nitride crystal before and after annealing obtained according to the method of Example 1-2, the dislocation density was measured. For measurement of the dislocation density, the sample was observed at 3 kV and 100 pA in a 1000-power viewing field through cathode luminescence (CL) observation, in which the number of the dark spots was counted and the density was calculated for evaluation of the sample.

A small dark spot density means that the dislocation density in the crystal is small and means that the crystal does not have strain therein. Preferably, the dislocation density (DSD) is $2\times10^5$ or less.

The dislocation density of the GaN crystal A obtained according to the method of Example 1-2 was $1.9\times10^5$ cm$^{-2}$, and the dislocation density of the GaN crystal B was $1.2\times10^5$ cm$^{-2}$. There was not any significant change in the dislocation density before and after annealing, or that is, the crystal thus had a low dislocation density in any state and was good.

Comparative Examples 1-1 to 1-5

[Preparation of Ground Substrate]

On a sapphire substrate, gallium nitride (GaN) was grown according to an organic metal chemical vapor deposition (MOCVD) method. A non-doped GaN template having a C-plane as the main plane was prepared, a mask of $Si_3N_4$ was formed on the template, and a C-plane-GaN layer was grown through epitaxial lateral overgrowth via the opening of the mask, thereby preparing a seed substrate.

Figure 3:
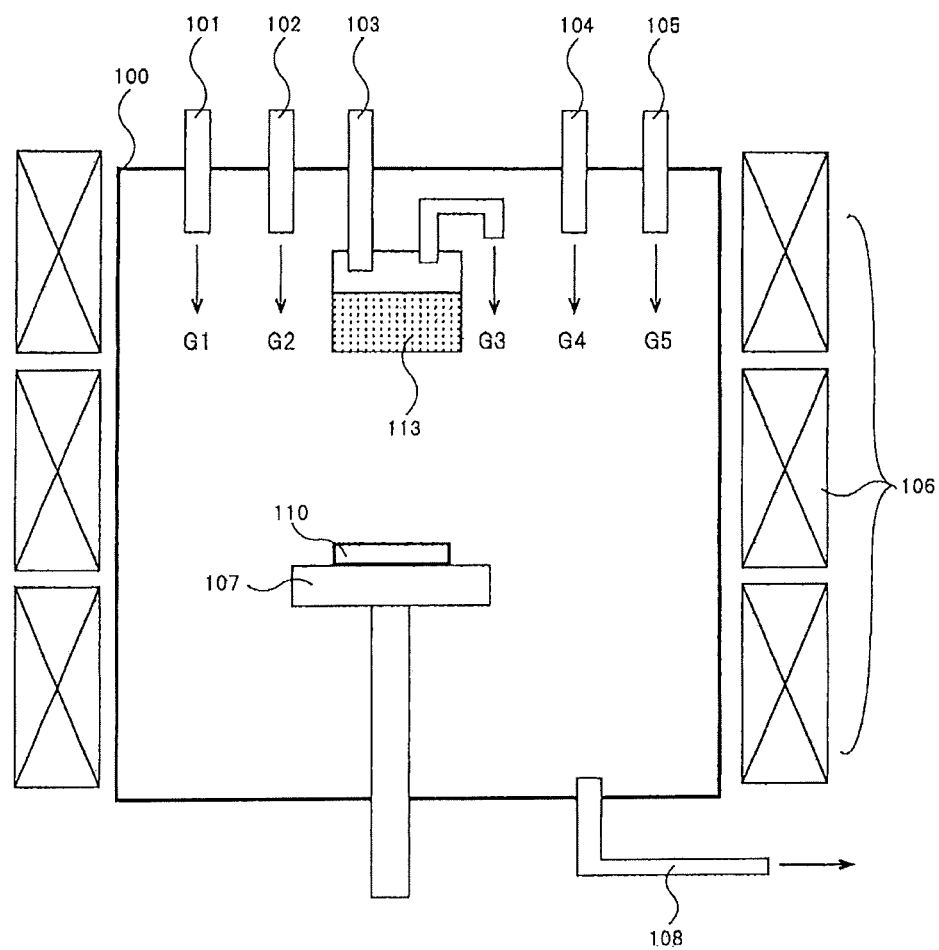
FIG. 3 is a schematic view of a crystal production apparatus for use in the HVPE method in Comparative Examples.

Next, using an HVPE apparatus as shown in FIG. 3, the seed substrate 110 was set on the susceptor 107 in such a manner that the C-plane-GaN layer of the seed substrate 110 could be exposed out as the top thereof. The distance between the tip of the gas-introducing duct 104 and the ground substrate was 9 cm. Subsequently, the temperature in the reactor was elevated up to 1010° C., in which a GaN single-crystal was grown. In this growth step, the growth pressure was $1.01\times10^5$ Pa, the partial pressure of the GaCl gas was $6.55\times10^2$ Pa, and the partial pressure of the $NH_3$ gas was $7.58\times10^3$ Pa. The growth time was 64 hours.

After the growth, the reactor was cooled to room temperature to give a GaN single-crystal. Thus, a GaN single-crystal having a thickness of 8.3 mm and having a C-plane as the main plane (hereinafter referred to as C-plane-GaN single-crystal) was formed on the seed substrate. From the thickness of the C-plane-GaN single-crystal and the growth time for the crystal, the growth rate was calculated and was 130 μm/hr.

The resultant C-plane-GaN single-crystal was sliced in such a manner that the main plane could have an off angle of −2° in the [0001] direction from the (10-10) plane, and 0° in the [−12-10] direction, thereby giving plural small pieces of the substrate. Of those, a single-crystal GaN (self-supporting) having a quadrangular size of 50 mm in long side×5 mm in short side and a thickness of 330 μm was prepared as a ground substrate.

The resultant double-side polished crystal was analyzed through X-ray diffractiometry, which confirmed that the crystal was a hexagonal system crystal and did not contain a cubic GaN.

[Growth Step for Homo-Growth on the Main Plane of Ground Substrate]

Of the ground substrate samples produced as described above, a single-crystal GaN having a quadrangular size of 20 mm in long side×10 mm in short side and a thickness of 330 μm was used as a ground substrate. Using the reaction apparatus shown in FIG. 2, a nitride crystal was grown on the ground substrate.

In each Comparative Examples, the crystal growth was carried out in the same manner as in Examples 1-1 to 1-8 except that the ground substrate as above was used and that the oxygen concentration in the feedstock, the type of the mineralizer, the halogen concentration thereof relative to the ammonia solvent, the growth temperature and the growth pressure were changed as in Table 1.

The collected crystal was observed. A gallium nitride crystal having an M-plane as the main plane was grown, and its size was around 11 mm in c-axis×20 mm in a-axis×1.8 mm in m-axis.

Plural tabular crystals each having an M-plane as the main plane were cut out of the resultant gallium nitride crystal. Both the front side and the back side of M-planes which are main planes and the four side faces were etched to remove damages. Further, the surface and the back of the M-plane were mirror-finished to give a GaN crystal A. The resultant GaN crystal A was analyzed through X-ray diffractiometry, which confirmed that the crystal was a hexagonal system crystal and did not contain a cubic GaN crystal.

[Annealing Treatment]

In the same manner as in the "annealing treatment" described in Examples 1-1 to 1-8, the resultant, surface-polished GaN crystal A having an M-plane as the main plane was annealed to give a GaN crystal B.

[Analysis Evaluation of Gallium Nitride Crystal]

The GaN crystal A and the GaN crystal B obtained before and after annealing treatment were evaluated in point of the physical properties thereof mentioned below.

<Impurity Amount Analysis>

The GaN crystal B, the gallium nitride crystal after the annealing treatment in Comparative Examples 1-1 to 1-5 was subjected to quantitative analysis through SIMS for the H and O concentration therein. As the apparatus, used was a secondary ion mass spectrometer (SIMS) IMS4f by CAMECA. Regarding the analysis condition, the primary ion beam was Cs, the primary ion energy was 14.5 keV, and the secondary ion polarity was negative. The detection limit under the condition was from $1\times10^{17}$ to $2\times10^{17}$ atoms/cm$^3$ for H, and from $1\times10^{16}$ to $2\times10^{16}$ atoms/cm$^3$ for O. The hydrogen concentration and the oxygen concentration in the resultant gallium nitride crystal are shown in Table 1. In Comparative Examples 1-1 to 1-5, the ratio of the hydrogen concentration to the oxygen concentration (H/O) was less than 0.5, or more than 4.5.

<Stacking Fault Density (SFD)>

The GaN crystal B obtained according to the method of Comparative Example 1-5 was evaluated through low-temperature cathode luminescence (LTCL) observation at 5 kV and 500 pA in a 200-power viewing field. The lateral lines existing in the direction parallel to the C-plane of the LTCL image are stacking faults. The measurement was carried out only in one site, and the stacking fault density was 100 cm$^{-1}$. The GaN crystal B obtained in Comparative Examples 1-1 to 1-5 was analyzed similarly, and the stacking fault density was also 100 cm$^{-1}$ or so.

<Half-Value Width of X-Ray Rocking Curve (XRC)>

According to the same method as in Examples 1-1 to 1-8, the XRC half-value width of the GaN crystals A and B, the gallium nitride crystals before and after annealing that had been obtained according to the method of Comparative Example 1-5, was measured.

The XRC half-value width of for GaN (100) reflection of the GaN crystal A was 22.4 arcsec, the XRC half-value width for GaN (102) reflection thereof was 24,1 arcsec, the XRC half-value width for GaN (100) reflection of the GaN crystal B was 85.3 arcsec and the XRC half-value width for GaN (102) reflection of the GaN crystal B was 105.4 arcsec. From these, it is known that the GaN crystal obtained according to the method of Comparative Example 1-5 worsened through the annealing treatment in the crystal orientation in the tilt direction and the twist direction thereof, and it is therefore known that the GaN crystals A and B are crystals poor in stability as having residual stress therein.

In addition, the GaN crystal A obtained in Comparative Example 1-1 and Comparative Example 1-4 and the GaN crystal B obtained in Comparative Example 1-3 were analyzed for measurement of the XRC half-value width thereof. The XRC half-value width for GaN (100) reflection and for GaN (102) reflection of the crystal was more than 40 arcsec, from which it was confirmed that the crystallinity of the crystal was not good.

<Radius of Curvature>

According to the same method as in Examples 1-1 to 1-8, the radius of curvature of the GaN crystal B obtained in Comparative Example 1-3 and that of the GaN crystals A and GaN crystal B, the gallium nitride crystals before and after annealing that had been obtained according to the method of Comparative Example 1-3, were measured. The results of the measurement are shown in Table 2.

<Absorption Coefficient>

According to the same method as in Examples 1-1 to 1-3 and 1-6 to 1-8, the absorption coefficient of the GaN crystal before annealing that had been obtained according to the method of Comparative Example 1-5, was measured. The results of the measurement are shown in Table 2.

Comparative Examples 1-6 and 1-7

The crystal that had been prepared according to the same method as that for "Preparation of Ground Substrate" in Comparative Examples 1-1 to 1-5 was sliced in such a manner that the main plane could have an off angle of 0° in the [0001] direction from the (10-10) plane, and 0° in the [−12-10] direction, thereby giving plural small pieces of the substrate. Subsequently, both the front side and the back side of M-planes which are main planes and the four side faces were etched to remove damages. Further, the surface and the back of the M-plane were mirror-finished to give a GaN crystal A. The resultant GaN crystal A was analyzed through X-ray diffractiometry, which confirmed that the crystal was a hexagonal system crystal and did not contain a cubic GaN crystal. In Comparative Example 1-6, the homo-growth step was omitted and the sample was analyzed and evaluated for the physical properties thereof.

The GaN crystal in Comparative Examples 1-6 and 1-7 was subjected to quantitative analysis through SIMS for the H and O concentration therein. As the apparatus, used was a secondary ion mass spectrometer (SIMS) IMS4f by CAM-ECA. Regarding the analysis condition, the primary ion beam was Cs, the primary ion energy was 14.5 keV, and the secondary ion polarity was negative. The detection limit under the condition was from $1 \times 10^{17}$ to $2 \times 10^{17}$ atoms/cm$^3$ for H, and from $1 \times 10^{16}$ to $2 \times 10^{16}$ atoms/cm$^3$ for O. In Comparative Examples 1-6 and 1-7, the hydrogen concentration and the oxygen concentration were not higher than the detection limit, and the ratio of the hydrogen concentration to the oxygen concentration (H/O) could not be calculated.

[Analysis and Evaluation of Gallium Nitride Crystal]

The GaN crystal A was evaluated for the physical data of the following items thereof.

<Stacking Fault Density (SFD)>

The GaN crystal A obtained in Comparative Examples 1-6 and 1-7 was evaluated through low-temperature cathode luminescence (LTCL) observation at 5 kV and 500 pA in a 200-power viewing field. The lateral lines existing in the direction parallel to the C-plane of the LTCL image are stacking faults. The stacking fault density was also from 80 to 100 cm$^{-1}$ or so.

<Half-Value Width of X-Ray Rocking Curve (XRC)>

According to the same method as in Examples 1-1 to 1-6, the XRC half-value width of the GaN crystal A, the gallium nitride crystal before and after annealing that had been obtained according to the method of Comparative Example 1-6, was measured.

The XRC half-value width of for GaN (100) reflection of the GaN crystal A was 42.3 arcsec, and the XRC half-value width for GaN (102) reflection thereof was 32.5 arcsec. This confirmed that the crystallinity of the GaN crystal obtained in Comparative Example 1-6 was not good.

<Measurement According to Positron Annihilation Spectroscopy>

The GaN crystal produced in Comparative Examples 1-6 and 1-7 was analyzed for the S-parameter, the positron diffusion length and the positron lifetime according to the methods described in detail in this specification.

The S-parameter of the GaN crystal A produced in Comparative Example 1-6 was 0.441 to 0.444, and the positron diffusion length thereof was 99 nm. The S-parameter of the other GaN crystal A produced in Comparative Example 1-7 was 0.438, the positron lifetime τ1 in the crystal was 147.4 ps, and the value of the positron lifetime represented by τ2 was not detected. Accordingly, the vacancy-type point defect density calculated from these values was estimated to be less than the detection limit, $1 \times 10^{16}$ atoms/cm$^3$. From this, it is presumed that the crystal would be a crystal that does not almost and substantially contain a vacancy-type point defect density.

Comparative Examples 1-8

[Preparation of Ground Substrate]

The crystal that had been prepared according to the same method as that for "Preparation of Ground Substrate" in Comparative Examples 1-1 to 1-5 was sliced in such a manner that the main plane could have an off angle of 0° in the [0001] direction from the (10-10) plane, and 0° in the [-12-10] direction, thereby giving plural small pieces of the substrate. Subsequently, both the front side and the back side of M-planes which are main planes and the four side faces were etched to remove damages. Further, the surface and the back of the M-plane were mirror-finished to give a ground substrate. The resultant ground substrate was analyzed through X-ray diffractiometry, which confirmed that the crystal was a hexagonal system crystal and did not contain a cubic GaN crystal.

[Growth Step for Homo-Growth on the Main Plane of Ground Substrate]

The ground substrate thus produced in the manner as above was set on the susceptor 107 in the HVPE apparatus shown in FIG. 3, then the temperature in the reaction chamber was elevated up to 850° C. and kept as such for 15 minutes. Subsequently, GaCl of a feedstock of a Group-13 metal on the Periodic Table and NH$_3$ of a nitrogen material were supplied in the main plane direction, then the temperature was elevated up to a growth temperature 950° C. (heating rate: 21° C./min), and after the system reached the temperature, GaN was grown for 30 hours. In this growth step, the growth pressure was $1.01 \times 10^5$ Pa, the partial pressure of the GaCl gas was $3.54 \times 10^2$ Pa, the partial pressure of the NH$_3$ gas was $1.13 \times 10^4$ Pa, and the proportion of the inert gas (N$_2$) relative to the entire gas flow rate was 48% by volume. After the growth step, the system was cooled to room temperature to give a gallium nitride crystal.

The thickness in the m-axial direction of the resultant gallium nitride crystal was about 0.8 mm. Plural tabular crystal each having an M-plane as the main plane were cut out of the resultant gallium nitride crystal. Both the front side and the back side of M-planes which are main planes and the four side faces were etched to remove damages. Further, the surface and the back of the M-plane were mirror-finished to give a GaN crystal A. The resultant GaN crystal A was analyzed through X-ray diffractiometry, which confirmed that the crystal was a hexagonal system crystal and did not contain a cubic GaN crystal.

[Analysis Evaluation of Gallium Nitride Crystal]

The GaN crystal A was evaluated in point of the physical properties thereof mentioned below.

<Impurity Concentration Analysis>

The gallium nitride crystal in Comparative Example 1-8 was subjected to quantitative analysis through SIMS for the H and O concentration therein. As the apparatus, used was a secondary ion mass spectrometer (SIMS) IMS4f by CAM-ECA. Regarding the analysis condition, the primary ion beam was Cs, the primary ion energy was 14.5 keV, and the secondary ion polarity was negative. The detection limit under the condition was from $1 \times 10^{17}$ to $2 \times 10^{17}$ atoms/cm$^3$ for H, and from $1 \times 10^{16}$ to $2 \times 10^{16}$ atoms/cm$^3$ for O. The hydrogen concentration and the oxygen concentration in Comparative Example 1-8 were not higher than the detection limit, and the ratio of the hydrogen concentration to the oxygen concentration (H/O) could not be calculated.

<Stacking Fault Density (SFD)>

The GaN crystal A obtained in Comparative Example 1-8 was evaluated through low-temperature cathode luminescence (LTCL) observation at 5 kV and 500 pA in a 200-power viewing field. The lateral lines existing in the direction parallel to the C-plane of the LTCL image are stacking faults. The stacking fault density was $1.5 \times 10^2$ cm$^{-1}$.

<Measurement According to Positron Annihilation Spectroscopy>

The GaN crystal produced in Comparative Example 1-8 was analyzed for the S-parameter, the positron diffusion length and the positron lifetime according to the methods described in detail in this specification.

The S-parameter of the GaN crystal A produced in Comparative Example 1-8 was 0.441 to 0.444, and the positron diffusion length thereof was 86 nm. The vacancy-type point defect density calculated from these values was estimated to be less than $1 \times 10^{16}$ atoms/cm$^3$. From this, it is presumed that the crystal would be one not almost and substantially containing a vacancy-type point defect density.

<Dislocation Density (DSD)>

The dislocation density in the GaN crystal A produced in Comparative Example 1-8 was measured in the same manner as in Examples 1-1 to 1-6. For measurement of the dislocation density, the sample was observed at 3 kV and 100 pA in a 1000-power viewing field through cathode luminescence (CL) observation, in which the number of the dark spots was counted and the density was calculated for evaluation of the sample.

The dislocation density in the GaN crystal A in Comparative Example 1-8 was $1.5 \times 10^6$ cm$^2$.

In Comparative Examples 1-6 to 1-8, the S-parameter was less than 0.448, and the positron diffusion length was more than 80 nm.

Comparative Example 1-9

[Preparation of Ground Substrate]

On a sapphire substrate, gallium nitride (GaN) was grown according to an organic metal chemical vapor deposition (MOCVD) method. A non-doped GaN template having a C-plane as the main plane was prepared, a mask of $Si_3N_4$ was formed on the template, and a C-plane-GaN layer was grown through epitaxial lateral overgrowth via the opening of the mask, thereby preparing a seed substrate.

Next, using the HYPE apparatus as shown in FIG. 3, the seed substrate 110 was set on the susceptor 107 in such a manner that the C-plane-GaN layer thereof could be exposed out as the top thereof. The distance between the tip of the gas-introducing duct 104 and the ground substrate was 9 cm. Subsequently, the temperature in the reactor was elevated up to 1010° C., in which a GaN single-crystal was grown. In this growth step, the growth pressure was $1.01 \times 10^5$ Pa, the partial pressure of the GaCl gas was $6.55 \times 10^2$ Pa, and the partial pressure of the NH$_3$ gas was $7.58 \times 10^3$ Pa. The growth time was 64 hours.

After the growth, the reactor was cooled to room temperature to give a GaN single-crystal. Thus, a GaN single-crystal having a thickness of 8.3 mm and having a C-plane as the main plane (hereinafter referred to as C-plane-GaN single-crystal) was formed on the seed substrate. From the thickness of the C-plane-GaN single-crystal and the growth time for the crystal, the growth rate was calculated and was 130 µm/hr.

The resultant C-plane-GaN single-crystal was sliced to give plural small-piece substrates in which the C-plane could be the main plane. Of those, a single-crystal GaN (self-supporting) having a quadrangular size of 10 mm in long side×5 mm in short side and a thickness of 330 µm was prepared as a ground substrate.

The resultant double-side polished crystal was analyzed through X-ray diffractiometry, which confirmed that the crystal was a hexagonal system crystal and did not contain a cubic GaN.

[Growth Step for Homo-Growth on the Main Plane of Ground Substrate]

Using the reaction apparatus shown in FIG. 2, a nitride crystal was grown on the single-crystal GaN having the C-plane as the main plane and having a quadrangular size of 10 mm in long side×5 mm in short side and a thickness of 330 µm, which had been prepared in the above and served here as a ground substrate.

Here, the crystal growth was carried out in the same manner as in Examples 1-1 to 1-8 except that the oxygen concentration in the feedstock, the type of the mineralizer, the halogen concentration thereof relative to the ammonia solvent, the growth temperature and the growth pressure were changed as in Table 1.

The collected crystal was observed. A gallium nitride crystal grew on the ground substrate in both the Ga-plane direction and the N-plane direction thereof, and the thickness of the crystal in the c-axial direction was 2 mm or so. In visual observation, the crystal colored in brown and had a number of crevasse-like grooves in the surface thereof.

The resultant GaN crystal A was analyzed through X-ray diffractometry, which confirmed that the crystal was a hexagonal system crystal and did not contain a cubic GaN crystal.

[Analysis Evaluation of Gallium Nitride Crystal]

The crystal obtained in Comparative Example 1-9 was evaluated in point of the physical properties thereof mentioned below, without being subjected to annealing treatment.

<Impurity Amount Analysis>

The GaN crystal obtained in Comparative Example 1-9 was subjected to quantitative analysis through SIMS for the H and O concentration therein. As the apparatus, used was a secondary ion mass spectrometer (SIMS) IMS4f by CAMECA. Regarding the analysis condition, the primary ion beam was Cs, the primary ion energy was 14.5 keV, and the secondary ion polarity was negative. The detection limit under the condition was from $1 \times 10^{17}$ to $2 \times 10^{17}$ atoms/cm$^3$ for H, and from $1 \times 10^{16}$ to $2 \times 10^{16}$ atoms/cm$^3$ for O. The hydrogen concentration and the oxygen concentration in the resultant gallium nitride crystal are shown in Table 2. The ratio of the hydrogen concentration to the oxygen concentration (H/O) in the crystal obtained in Comparative Example 1-9 was 5.4, and was a value exceeding 4.5.

<Half-Value Width of X-Ray Rocking Curve (XRC)>

According to the same method as in Examples 1-1 to 1-6, the XRC half-value width of the GaN crystal A, the gallium nitride crystal before annealing that had been obtained in Comparative Example 1-9, was measured.

The XRC half-value width of for GaN (002) reflection of the GaN crystal A was 34.9 arcsec, and the XRC half-value width for GaN (102) reflection thereof was 36.8 arcsec. These confirmed that the crystallinity of the GaN crystal obtained in Comparative Example 1-9 was not good.

The results in measurement through SIMS analysis for the H concentration and the concentration in the gallium nitride crystals obtained in the above-mentioned Examples and Comparative Examples, and the results in positron annihilation measurement and in positron lifetime measurement are shown in Table 1.

TABLE 1

| | Mineralizer | | Growth Condition | | | |
|---|---|---|---|---|---|---|
| | Composition | Concentration | Oxygen Concentration in GaN crystal material (cm$^{-3}$) | Growth Temperature Difference \|ΔT\| (feedstock filling zone - crystal growth zone) (° C.) | Mean Temperature (° C.) | Growth Pressure (MPa) |
| Example 1-1 | NH$_4$I GaF$_3$ | 2 | $3.0 \times 10^{18}$ | 18 | 626 | 210 |
| Example 1-2 | NH$_4$I GaF$_3$ | 2 | $4.6 \times 10^{18}$ | 18 | 626 | 210 |
| Example 1-3 | NH$_4$I GaF$_3$ | 2 | $4.6 \times 10^{18}$ | 18 | 626 | 210 |
| Example 1-4 | HI NH$_4$F | 2 | $1.8 \times 10^{19}$ | 17 | 604.5 | 215 |
| Example 1-5 | HI NH$_4$F | 2.5 | $4.6 \times 10^{18}$ | 18 | 615 | 212 |
| Example 1-6 | HI NH$_4$F | 2 | $4.6 \times 10^{18}$ | 10 | 605 | 210 |
| Example 1-7 | HI NH$_4$F | 2 | $2.5 \times 10^{18}$ | 13 | 614.5 | 222.4 |
| Example 1-8 | HI NH$_4$F | 2 | $2.5 \times 10^{18}$ | 8.8 | 610.2 | 216.3 |
| Comparative Example 1-1 | NH$_4$Cl | 3 | $4.6 \times 10^{18}$ | 30 | 609.5 | 250 |
| Comparative Example 1-2 | GaF$_3$ | 1 | $4.6 \times 10^{18}$ | 30 | 609.5 | 250 |
| Comparative Example 1-3 | GaF$_3$ NH$_4$I | 1.1 | $4.6 \times 10^{18}$ | 70 | 610 | 210 |
| Comparative Example 1-4 | GaF$_3$ NH$_4$Br | 1.5 | $4.6 \times 10^{18}$ | 20 | 610 | 245 |
| Comparative Example 1-5 | GaF$_3$ NH$_4$I | 1.5 | $4.6 \times 10^{18}$ | 20 | 610 | 240 |
| Comparative Example 1-6 | | | | | | |
| Comparative Example 1-7 | | | | | | |
| Comparative Example 1-8 | | | | | | |
| Comparative Example 1-9 | NH$_4$Cl GaF$_3$ | 3.05 | $4.6 \times 10^{18}$ | 30 | 610 | 245 |

| | Positron Annihilation Measurement | Positron Lifetime Measurement | Physical Properties | | |
|---|---|---|---|---|---|
| | before annealing | | | | |
| | Positron | | | Impurity Concentration (atoms/cm$^3$) | | H Concentration/ O Concentration |
| | S-parameter | diffusion length (nm) | Positron Lifetime (ps) | H | O | H/O |
| Example 1-1 | | | | $3.37 \times 10^{18}$ | $1.34 \times 10^{18}$ | 2.5 |
| Example 1-2 | 0.454 | 30 ± 1 | | $4.34 \times 10^{18}$ | $2.29 \times 10^{18}$ | 1.9 |
| Example 1-3 | | | | $1.44 \times 10^{19}$ | $8.73 \times 10^{18}$ | 1.6 |
| Example 1-4 | | | | $1.34 \times 10^{19}$ | $9.87 \times 10^{18}$ | 1.4 |

TABLE 1-continued

| | | | | | | |
|---|---|---|---|---|---|---|
| Example 1-5 | | | | $1.14 \times 10^{19}$ | $1.28 \times 10^{19}$ | 0.9 |
| Example 1-6 | 0.452 | 29 ± 3 | τ1 = 136.7 ± 6 | $1.1 \times 10^{19}$ | $7.4 \times 10^{18}$ | 1.5 |
| | 0.453 | 35 ± 4 | τ2 = 214.5 ± 4 | | | |
| Example 1-7 | | | | $7.22 \times 10^{17}$ | $5.73 \times 10^{17}$ | 1.3 |
| Example 1-8 | | | | $1.45 \times 10^{18}$ | $1.05 \times 10^{18}$ | 1.4 |
| Comparative Example 1-1 | | | | $6.2 \times 10^{19}$ | $1.26 \times 10^{18}$ | 49.1 |
| Comparative Example 1-2 | | | | $6.91 \times 10^{18}$ | $1.62 \times 10^{17}$ | 42.7 |
| Comparative Example 1-3 | | | | $2.59 \times 10^{18}$ | $7.46 \times 10^{18}$ | 0.3 |
| Comparative Example 1-4 | | | | $2.22 \times 10^{19}$ | $1.31 \times 10^{18}$ | 17.0 |
| Comparative Example 1-5 | | | | $1.25 \times 10^{19}$ | $3.05 \times 10^{17}$ | 41.0 |
| Comparative Example 1-6 | 0.441-0.444 | 99 | | $<2 \times 10^{17}$ | $<2 \times 10^{16}$ | N.D. |
| Comparative Example 1-7 | 0.438 | 67 | τ1 = 147.4 | $<2 \times 10^{17}$ | $<2 \times 10^{16}$ | N.D. |
| Comparative Example 1-8 | 0.441-0.444 | 86 | | $<2 \times 10^{17}$ | $<2 \times 10^{16}$ | N.D. |
| Comparative Example 1-9 | | | | $1.11 \times 10^{20}$ | $2.06 \times 10^{19}$ | 5.4 |

The above-mentioned results of the physical properties evaluation in Examples and Comparative Examples are summarized in Table 2.

TABLE 2

| | Analysis Evaluation | | | | | | | | | |
|---|---|---|---|---|---|---|---|---|---|---|
| | XRC Half-Value Width (arcsec) | | High-Resolution XRC Half-Value Width (arcsec) | Radius of Curvature (m) | | | | Absorption Coefficient (cm$^{-1}$) | | Stacking Fault Density (SFD) (cm$^{-2}$) |
| | | | | before annealing | | after annealing | | | | |
| | before annealing | after annealing | before annealing | a-axial direction | c-axial direction | a-axial direction | c-axial direction | 405 nm | 445 nm | after annealing |
| Example 1-1 | | 23.5(100) 19.2(102) | | 41.0 | 94.4 | 24.5 | 66.8 | 2.28 | 0.7 | 0 |
| Example 1-2 | 21.0(100) 22.3(102) | 21.3(100) 19.6(102) | 7.4(200) 8.8(102) | — | 26.4 | 18.6 | 16.0 | 1.93 | 0.72 | 0 |
| Example 1-3 | 23.8(100) 22.3(102) | 28.2(100) 20.6(102) | | 2.9 | 11.4 | 7.8 | 14.8 | 6.32 4.49 | 0.92 0.88 | 0 |
| Example 1-4 | | 23.4(100) 20.6(102) | | | | 81.9 | 85.9 | | | 0 |
| Example 1-5 | | 34.2(100) 24.3(102) | | | | 111.4 | 66.8 | | | |
| Example 1-6 | | 25.4(100) 28.4(102) | 6.9(200) 9.2(102) | 83.0 | 95.5 | 67.1 | 68.4 | 6.59 | 0.98 | 0 |
| Example 1-7 | | 21.3(100) 18.8(102) | | | | | | 2.44 | 0.82 | |
| Example 1-8 | | 21.7(100) 18.6(102) | | | | | | 2.86 | 0.74 | |
| Comparative Example 1-1 | 43.1(100) 41.7(102) | | | | | | | | | |
| Comparative Example 1-3 | | 46.9(100) 51.4(102) | | | | 2.5 | 5.8 | | | |
| Comparative Example 1-4 | 44.1(100) 194.0(102) | | | | | | | | | |
| Comparative Example 1-5 | 22.4(100) 24.1(102) | 85.3(100) 105.4(102) | | 16.6 | −12.0 | −0.6 | −1.4 | 15.5 | 2.92 | $1.0 \times 10^2$ |
| Comparative Example 1-6 | 42.3(100) 32.5(102) | | | 32.3 | 37.0 | | | | | 80-100 |
| Comparative Example 1-7 | | | | | | | | | | 80-100 |
| Comparative Example 1-8 | | | | | | | | | | $1.5 \times 10^2$ |
| Comparative Example 1-9 | 34.9(002) 36.8(102) | | | | | | | | | |

In Examples 1-1 to 1-8, the ratio of the hydrogen concentration to the oxygen concentration (H/O) is from 0.5 to 4.5, and therefore it is known that the XRC half-value width is not more than 35 arcsec and the crystallinity is good.

In addition, it is also known that the radius of curvature is large and the crystals warp little. Further, the value of the dislocation density (DSD) and the stacking fault density (SFD) are both small, and it is known that the dislocation density is low and the crystallinity are good. In particular, in Examples 1-2 and 1-6, the high-resolution XRC half-value width value is less than 10 arcsec, and it is known that the crystallinity is extremely good.

In Examples 1-2 and 1-6, the S-parameter is not less than 0.448, and the positron diffusion length is from 15 to 50 nm, and therefore it is known that the XRC half-value width is not more than 30 arc and the crystallinity is good. In general, GaN crystals that have grown on a ground substrate according to an HVPE method as in Comparative Examples 1-6 to 1-8 could have an XRC half-value width of from 35 to 50 arcsec or so at most, even in a case that the crystallinity thereof is the best, and in consideration of the fact, it is known that the GaN crystal of the present invention is excellent in X-ray crystallographic crystallinity.

In Examples, the S-parameter and the positron diffusion length both fall within the above-mentioned range before and after annealing. Also in Examples, there was not any significant change before and after annealing in point of the found data in analysis for the XRC half-value width, etc. From these, it is known that the crystals obtained in Examples maintained high crystallinity even after annealing treatment, or that is, the crystals have high stability.

On the other hand, in Comparative Example 1-5, the XRC half-value width and the radius of curvature before annealing were good in some degree like in Examples, but it is known that, after annealing, the XRC half-value width significantly increased, and after annealing, the radius of curvature decreased. Accordingly, it is known that the crystallinity of the crystal in Comparative Example 1-5 significantly worsens through annealing treatment. In other words, the stability of the crystallinity is poor, and through annealing treatment, the balance of the entire crystal worsens.

The absorption coefficient in Comparative Examples is high as compared with that in Examples.

In addition, in Examples 1-1, 1-4, 1-6 and 1-9, the XRC half-value width of the crystals before annealing is more than 30 arcsec, which confirms that the crystallinity in those Comparative Examples is not good as compared with that in Examples.

From the above, it is known that the crystals obtained in Examples of the present invention have a low dislocation density the generation of strain in the crystals has been reduced. In addition, the crystals have high thermal stability and have extremely excellent crystallinity.

Example 2-1

In this Example, a nitride crystal was grown using the reaction apparatus shown in FIG. 2.

(1) For the crystal growth, used was an autoclave 1 made of a nickel-based alloy as the pressure-tight vessel, and a capsule 20 made of Pt—Ir was used as the reactor.

As a feedstock 8, polycrystalline GaN particles were set into the lower zone (feedstock dissolution zone 9) of the capsule, and as a mineralizer, high-purity $NH_4F$ was put into the capsule. Further, between the lower feedstock dissolution zone 9 and the upper crystal growth zone 6, there was arranged a platinum baffle plate 5. As a seed crystal 7, C-plane substrates, which had been prepared according to an HVPE method, were arranged in the crystal growth zone 6 of the upper area of the capsule, while kept hung therein using a platinum wire and a seed supporting frame. On the main plane (N-plane) surface of the seed crystal 7, formed was a mask of a TiW alloy in such a manner that long and thin linear openings each having a width of 100 μm ($W_1$) and kept arranged so that the lengthwise direction thereof could be parallel to the a-axial direction (parallel to the M-plane), at an interval (pitch) of 1000 μm, and a part of the CMP-finished region of the main plane (N-plane) surface was kept exposed out via the thin and long openings. Next, according to the process shown below, crystal growth was carried out toward the −c-axial direction (<000-1>, N-direction) from the thin and long opening so as to expand the M-plane of the growing crystal.

(2) A Pt-made cap was connected to the upper part of the capsule 20 by welding, the lower part of the capsule was cooled with liquid nitrogen, then the valve was opened and the capsule was charged with HI not brought into contact with open air. Next, the capsule was connected to an $NH_3$ gas line, and filled with $NH_3$ not brought into contact with open air. Based on flow rate control, $NH_3$ was introduced into the capsule as a liquid corresponding to about 55% of the effective volume of the capsule (in terms of the $NH_3$ density at −33° C.), and then the valve was again closed. Subsequently, the tube at the top of the cap was sealed up and cut out using a welder. The F concentration introduced into the capsule was 0.6 mol % relative to $NH_3$ and the I concentration was 1.2 mol %.

(3) The capsule was inserted into the autoclave, and the autoclave was sealed up.

(4) The valve was opened for vacuum deaeration, and while the vacuum state was kept as such, the autoclave 1 was cooled with a dry ice-methanol solvent, and charged with $NH_3$ not brought into contact with open air. $NH_3$ was introduced into the autoclave 1 as a liquid corresponding to about 56% of the effective volume of the autoclave (volume of autoclave−volume of charged substance) (in terms of the $NH_3$ density at −33° C.), and then the valve 10 was again closed.

(5) The autoclave 1 was set in an electric furnace composed of plural divided heater sections. The autoclave 1 was so heated, based on the outer surface temperature of the autoclave, that the mean temperature inside the autoclave could be 620° C. and the temperature difference inside it could be 20° C., and after having reached the preset temperature, the autoclave was kept at that temperature for 15.4 days. The pressure inside the autoclave was 210 MPa.

(6) While the autoclave 1 was cooled, the valve 10 attached to the autoclave was opened, and $NH_3$ inside the autoclave was removed.

(7) The cap of the autoclave was opened, the capsule 20 was taken out, and further the grown crystal was taken out. A gallium nitride crystal grew on the seed crystal. The growth thickness in the N-direction (referred to as a N dimension) was 6.5 mm, the growth rate in the N-direction was 422 μm/day, or that is, the crystal grew at such a high growth rate. The crystal growth was not only in the N-direction but also in the a-axial direction parallel to the main plane of the seed crystal, whereby the N-plane region expanded. The crystal grew also on the expanded N-plane region in the N-direction, and the tabular crystal parts having grown from the linear openings were integrated with the crystals having grown on the expanded N-plane regions existing on both sides in the N-direction (laterally-growing crystals).

(8) The pectinate crystals having grown from the gallium nitride crystal could be readily peeled from the mask, and plural gallium nitride wafers (tabular crystals) each having an M-plane as the main plane along the c-axis could be cut out, in which no cracks were found.

This suggests that the adhesion between the mask material and the crystal is not firm and there is a possibility that the grown crystal would have peeled away from the mask during the growth and therefore the stress therein would be relaxed.

Of the resultant tabular crystal, the minimum width $W_2$ in the m-axial direction was 2 mm, the minimum length $L_2$ in the a-axial direction was 32 mm, and the maximum height H in the c-axial direction was 5 mm.

According to the method of Example 2-1, the crystal growth was repeated plural times and, as a result, a tabular M-plane crystal was also produced having a length in the a-axial direction of 52 mm and having a length in the c-axial direction of 52 mm.

Not polished but as grown, the gallium nitride wafer produced in Example 2-1 was analyzed for the X-ray rocking curve half-value width and the radius of curvature of the M-plane thereof.

<X-Ray Rocking Curve (XRC) Half-Value Width of>

The X-ray rocking curve (XRC) was measured with a high-resolution X-ray diffractometer by PANalytical. Rocking curve measurement was carried out for GaN (100) reflection and GaN (102) reflection, and the crystal orientation distribution in the tilt and twist direction of the crystal was evaluated. Here, (100) and (102) each represent the X-ray diffraction plane.

Not polished but as grown, the M-plane of the gallium nitride wafer produced in Example 2-1 was analyzed, and the XRC half-value width thereof for GaN (100) reflection was 22.9 arcsec and the XRC half-value width thereof for GaN (102) reflection was 18.8 arcsec, from which it is known that the crystallinity of the crystal is good.

<Radius of Curvature)

The radius of curvature was measured, using a high-resolution X-ray diffractometer by PANalytical equipped with a monoaxial stage (x-axis) or biaxial stage (x-y) high-definition cradle. Concretely, the sample was moved in the monoaxial direction (x-direction) at intervals of from 0.5 to 5 mm, and the X-ray rocking curve was determined at every point. From the found data, the co-value to give the maximum intensity was calculated, and the co-value was plotted relative to the moving distance x. According to the least-square method, the inclination k of the graph was calculated. From the inclination k, the radius of curvature R [m] was calculated according to the following equation.

$$R = 1/k \times 180 \times \pi/1000$$

Not polished but as grown, the M-plane of the gallium nitride wafer produced in Example 2-1 was analyzed, and the radius of curvature in the a-axial direction thereof was 19.1 m, and that in the direction parallel to the c-axial was 61.7 m and was large. From the data, it is known that the crystal is a good crystal containing neither defects such as dislocations, nor cracks, etc.

Both the front side and the back side of M-planes which are main planes and all the four side faces of the wafer were etched to remove the damage, and further, both the surface and the back of the M-plane of the main plane were mirror-polished. The resultant, both surfaces-polished crystal was analyzed through X-ray diffractiometry, which confirmed that the crystal was a hexagonal system crystal and did not contain a cubic GaN crystal.

Examples 2-2 to 2-21

A gallium nitride crystal was grown in the same manner as in Example 2-1 except that the mask pattern to be on the seed crystal and the crystal growth condition were changed as in Table 3.

In Examples 2-2 to 2-19, the crystal grew not only in the N-direction but also in the a-axial direction from the edge of the seed crystal, like in Example 2-1, and while the N-plane region became expanded, the crystal further grew in the N-direction on the expanded region whereby the tabular crystal parts having grown from the linear openings were integrated with the crystals having grown on the expanded N-plane regions existing on both sides in the N-direction (laterally-growing crystals).

Further, in Examples 2-2 to 2-19, when the line direction was gradually tilted from the M-plane to the A-plane, and while the tilt angle became greatly close to the A-plane, the crystal growth was promoted not only in the N-direction but also in the a-axial and m-axial directions so that the minimum width of the resultant seed crystal in the direction parallel to the main plane of the seed crystal increased (that is, the thickness of the resultant tabular crystal increased). In particular, the tendency was remarkable in the line direction tilted by at least 3° from the M-plane.

In Examples 2-20 and 2-21, the mask pattern was an asterisk (*) type. For this, the mask was so designed as to have a 50-μm wide ($W_1$) linear opening of which the lengthwise direction was parallel to the a-axial direction or the m-axial direction and to have two other 50-μm width ($W_I$) linear openings intersecting with the linear opening at one point and at an angle of 60 degrees or 120 degrees relative to that linear opening. In Examples 2-20 and 2-21, the crystal growth was retarded at the part where the three openings intersected with each other and therefore the crystals growing on the openings were not integrated together, but at those openings, there were formed crystals having similarly grown in the N-direction. The crystal parts were integrated with the crystals having grown in the N-direction on the expanded C-plane region from the edges of the seed crystal (laterally-growing crystals). No crack was found in all the crystals.

TABLE 3

| | Seed Main Plane | Masked Plane | Line Direction | Mask Width (μm) | Window Width (μm) | N Dimension (mm) | N-Direction Growth Rate (μm/day) | Reduction in M-plane Region with Growth | Growth Time (days) | Mineralizer Concentration Ratio F/I | Mean Temperature (° C.) | Pressure (MPa) |
|---|---|---|---|---|---|---|---|---|---|---|---|---|
| Example 2-1 | C | N | //M-plane | 1000 | 100 | 6.5 | 422 | no | 15.4 | 0.5 | 620 | 210 |
| Example 2-2 | C | N | //A-plane | 1000 | 100 | 6.2 | 403 | no | 15.4 | 0.5 | 620 | 210 |

TABLE 3-continued

| | Seed Main Plane | Masked Plane | Line Direction | Mask Width (μm) | Window Width (μm) | N Dimension (mm) | N-Direction Growth Rate (μm/day) | Reduction in M-plane Region with Growth | Growth Time (days) | Mineralizer Concentration Ratio F/I | Mean Temperature (° C.) | Pressure (MPa) |
|---|---|---|---|---|---|---|---|---|---|---|---|---|
| Example 2-3 | C | N | //A-plane | 2000 | 50 | 8.5 | 411 | no | 20.8 | 0.17 | 619 | 218 |
| Example 2-4 | C | N | //M-plane | 2000 | 100 | 5.6 | 379 | no | 14.9 | 0.3 | 600 | 210 |
| Example 2-5 | C | N | //M-plane | 2000 | 50 | 4.9 | 294 | no | 16.8 | 0.3 | 599 | 215 |
| Example 2-6 | C | N | //M-plane | 4000 | 50 | 7.1 | 202 | no | 35.1 | 0.3 | 620 | 218 |
| Example 2-7 | C | N | //M-plane | 6000 | 50 | 5.5 | 204 | no | 27 | 0.17 | 611 | 220 |
| Example 2-8 | C | N | //M-plane | 10000 | 50 | 4.4 | 163 | no | 27 | 0.17 | 611 | 220 |
| Example 2-9 | C | N | 3° from M-plane | 2000 | 50 | 7.5 | 278 | no | 27 | 0.13 | 608 | 215 |
| Example 2-10 | C | N | 3° from M-plane | 4000 | 50 | 9.6 | 357 | no | 27 | 0.13 | 608 | 215 |
| Example 2-11 | C | N | 5° from M-plane | 2000 | 50 | 9.3 | 448 | no | 20.8 | 0.17 | 619 | 218 |
| Example 2-12 | C | N | 5° from M-plane | 4000 | 50 | 9.7 | 359 | no | 27 | 0.13 | 608 | 215 |
| Example 2-13 | C | N | 6° from M-plane | 2000 | 50 | 3.0 | 110 | no | 27 | 0.13 | 610 | 220 |
| Example 2-14 | C | N | 7° from M-plane | 2000 | 50 | 3.8 | 158 | no | 24 | 0.29 | 613 | 220 |
| Example 2-15 | C | N | 7° from M-plane | 4000 | 50 | 9.4 | 347 | no | 27 | 0.13 | 608 | 215 |
| Example 2-16 | C | N | 8° from M-plane | 2000 | 50 | 4.3 | 200 | no | 21.7 | 0.25 | 619 | 215 |
| Example 2-17 | C | N | 11° from M-plane | 2000 | 50 | 4.1 | 169 | no | 24 | 0.29 | 613 | 220 |
| Example 2-18 | C | N | 15° from M-plane | 1000 | 100 | 5.8 | 377 | no | 15.4 | 0.5 | 620 | 210 |
| Example 2-19 | C | N | 23° from M-plane | 2000 | 50 | 6.1 | 280 | no | 21.7 | 0.25 | 619 | 215 |
| Example 2-20 | C | N | //M-axis | asterisk (*) | 50 | 4.7 | 218 | no | 21.5 | 0.8 | 621 | 218 |
| Example 2-21 | C | N | //A-axis | asterisk (*) | 50 | 5.3 | 250 | no | 21.1 | 0.3 | 621 | 218 |
| Comparative Example 2-1 | M | — | — | — | — | 3.7 | 248 | yes | 14.9 | 0.3 | 600 | 210 |
| Comparative Example 2-2 | M | — | — | — | — | 2.4 | 84 | yes | 28.6 | 0.7 | 620 | 220 |
| Comparative Example 24 | M strip | — | — | — | — | 2.6 | 250 | yes | 10.5 | 0.1 | 605 | 215 |

Comparative Examples 2-1 and 2-2

In Comparative Examples 2-1 and 2-2, the crystal growth was carried out in the same manner as in Example 2-1, except that a substrate having an M-plane as the main plane (10 mm in a-axial direction x 7 mm in c-axial direction, thickness 330 μm), which had been prepared according to an HVPE method, was used as the seed crystal 7 with formation of no mask pattern thereon, the type of the mineralizer and the concentration ratio therein, and the mean temperature and the growth pressure inside the furnace during the growth were changed as in Table 3.

The crystal taken out of the furnace was observed. A gallium nitride crystal having an M-plane as the main plane grew on the main plane of the seed crystal, but the crystal had plural internal cracks. This would be because no mask was used so that the entire surface of the seed formed through HVPE was kept exposed out, and therefore the growing crystal would have been strongly influenced by the warpage of the seed.

Plural tabular crystals each having an M-plane as the main plane were cut out of the resultant gallium nitride crystal. Both the front side and the back side of M-planes which are main planes and all the four side faces of the tabular crystal were etched to remove the damage, and further, both the surface and the back of the M-plane were mirror-polished to give a GaN crystal. The resultant GaN crystal was analyzed through X-ray diffractiometry, which confirmed that the crystal was a hexagonal system crystal and did not contain a cubic GaN crystal.

The grown crystals in Examples 2-1 to 2-21 and Comparative Examples 2-1 and 2-2 were compared. In Examples 2-1 to 2-21, the crystal having grown on the expanded C-plane region (laterally-growing crystal) and the crystal having grown from the linear opening were integrated during the crystal growth, and therefore the size of the crystal in the lengthwise direction of the line did not change and there was found little contraction in the lengthwise direction of the line along with the growth in the N-direction. $L_2/L_i$ was almost 0.8 or more.

On the other hand, in Comparative Examples 2-1 and 2-2, a semipolar plane appeared in the part having grown on the N-plane of the seed along with the crystal growth in the −c-axial direction, and therefore, the length in the a-axial direction become short and the area of the M-plane region became small.

Example 2-4 and Comparative Example 2-1 demonstrate simultaneous growth in one reactor. Between Example 2-4 and Comparative Example 2-1, the growth rate in the −c-axial direction was compared, and the rate in mask growth in Example 2-4 was higher. This would be because, in Example 2-4, the crystal having grown on the C-plane region that had expanded through growth in the a-axial direction from the side faces of the seed crystal (laterally-growing crystal, guide) and the tabular crystal having grown from the linear opening were integrated during the crystal growth, and therefore the tabular crystal having grown from the opening would further grow at the growth rate on the N-plane. On the other hand, in the crystal growth on the M-plane as the main plane in Comparative Example 2-1, the crystal could expand also in the N-direction but the growth in the N-axial direction could be growth on the semipolar plane because of the appearance of the semipolar plane, (10-1-1) plane, and as a result, the growth rate would be therefore low as corresponding to the growth rate on the semipolar plane.

analyzed for the measurement of the X-ray rocking curve half-value width in the M-plane thereof. The XRC half-value width for GaN (100) reflection of the wafer was 23.8 arcsec and the XRC half-value width for GaN (102) reflection thereof was 20.7 arcsec. Thus, this was a good crystal with neither defects such as dislocations nor cracks, etc.

TABLE 4

|  | Seed Crystal | Seed Plane | Seed Surface Finishing | M-Direction Growth Rate (μm/day) | Growth Time (days) | Mineralizer Concentration Ratio F/I | Mean Temperature (° C.) | Pressure (MPa) |
| --- | --- | --- | --- | --- | --- | --- | --- | --- |
| Example 2-22 | Crystal of Example 2-1 | M | as grown | 376 | 14.9 | 0.3 | 600 | 210 |
| Example 2-23 | Crystal of Example 2-1 | M | as grown | 168 | 28.6 | 0.7 | 620 | 220 |

Examples 2-22 and 2-23

Here, the crystal growth for gallium nitride was carried out in the same manner as in Example 2-1, except that, under the condition shown in Table 4, one gallium nitride wafer (tabular crystal) having an M-plane as the main plane, which had been produced in Example 2-1, was used as a seed crystal without being polished and while having an as-grown surface.

The crystal taken out of the furnace was observed, and it was confirmed that a gallium nitride crystal having an M-plane as the main plane grew on the main plane of the seed crystal.

The M-plane crystal growth rate of the crystal in Example 2-22 was 376 μm/day, and the M-plane crystal growth rate in Example 2-23 was 168 μm/day.

Not polished but kept as grown, the M-plane of the gallium nitride crystal obtained in Examples 2-22 and 2-23 was analyzed for measurement of the X-ray rocking curve half-value width thereof. Of the crystal in Example 2-22, the XRC half-value width for GaN (100) reflection was 23.1 arcsec and the XRC half-value width for GaN (102) reflection was 18.8 arcsec. Of the crystal in Example 2-23, the XRC half-value width for GaN (100) reflection was 23.0 arcsec and the XRC half-value width for GaN (102) reflection was 18.7 arcsec.

Both the crystals in Examples 2-23 and 2-23 had an X-ray half-value width on the same level as that of the crystal of Example 2-1 that had been used as the seed crystal therein, from which it was confirmed that those crystals had good crystallinity.

The crystal obtained in Example 2-22 was sliced in the direction parallel to the M-plane thereof, and polished to give 8 single-crystal wafers.

All the 8 wafers were analyzed for measurement of the radius of curvature of the M-plane thereof. Except that of one wafer, the radius of curvature of those wafers was from 20 m to 120 m in the a-axial direction and from 20 to 220 m in the c-axial direction, or that is, there were obtained good crystals with no warpage. One of those wafers was

Example 2-24

In Example 2-24, a GaN single crystal having an M-plane as the main plain and having an area of the M-plane of 2 cm² or more was produced through crystal growth according to the same method as in Examples 2-22 and 2-23. The single crystal was sliced in the direction parallel to the M-plane thereof and then was polished. Using a high-resolution X-ray diffractometer having a goniometer accuracy of $\frac{1}{10000}$, the sliced crystal was analyzed for measurement of the X-ray rocking curve thereof. Of the crystal, the XRC half-value width for GaN (200) reflection was 6.9 arcsec and the XRC half-value width for GaN (102) reflection was 9.2 arcsec.

In addition, the radius of curvature of the sample was measured, and was 83 m in the a-axial direction and 95 m in the c-axial direction, and both were large. Thus, it is known that the crystal has little warpage.

The resultant GaN crystal was evaluated through low-temperature cathode luminescence (LTCL) observation at 5 kV and 500 pA in a 200-power viewing field. The lateral lines existing in the direction parallel to the C-plane of the LTCL image are stacking faults. The stacking fault density was 0 cm$^{-1}$. From these, it was confirmed that the crystal was a good crystal with neither defects such as dislocations nor cracks, etc.

Comparative Example 2-3

As the seed crystal 7, used here was a seed crystal produced according to an HYPE method but not having a mask pattern on the main plane, M-plane substrate thereof, and the crystal growth was carried out according to Comparative Example 2-1.

The grown crystal was sliced in the direction parallel to the M-plane and polished to give 10 single-crystal wafers.

All these 10 wafers were analyzed for measurement of the radius of curvature and the X-ray rocking curve half-value width in the M-plane thereof.

In eight of the ten wafers, the radius of curvature of the M-plane was less than 5 m in the a-axial direction. In five of the ten wafers, the radius of curvature of the M-plane in the c-axial direction was less than 20 m. That is, all these values were low. In only one of the ten wafers, the radius of curvature was 20 m or more in both the a-axial direction and the c-axial direction. As compared with the data in Example 2-22, it is known that the crystal obtained herein had significant warpage.

These ten wafers were analyzed for measurement of the X-ray rocking curve half-value width in the M-plane thereof. The XRC half-value width for GaN (100) reflection was from 25 to 80 arcsec and the XRC half-value width for GaN (102) reflection was 30 arcsec or more. Some crystals had plural peaks. It is known that the wafer in Comparative Example 2-3 had large warpage and had many cracks and defects such as dislocations and the like, as compared with the wafer in Example 2-22.

Comparative Example 2-4

As the seed crystal 7, used here was a substrate having an M-plane as the main plane (strip-like seed having an a-axial direction of 50 mm, a c-axial direction of 3 mm and a thickness of 300 μm), which had been produced according to an HYPE method but which did not have a mask pattern thereon. In an attempt to increase the M-plane, the crystal growth was carried out according to Comparative Example 2-1, but with growth in the N-direction, plural cracks formed in the direction parallel to the c-axial direction. This would be because, no mask was used here, the entire surface of the seed produced through HVPE was exposed out, and therefore the crystal growth would be greatly influenced by the warpage of the seed.

In addition, with growth in the N-direction, the length in the a-axial direction became shortened.

Comparative Example 2-5

Here, the crystal growth was carried out using, as the seed, the C-plane substrate produced according to an HVPE method but not forming a mask pattern thereon. However, the C-plane (N-plane) did not grow flatly, and plural grooves formed in the surface. Accordingly, an M-plane substrate having a large area could not be cut out. One reason why the C-plane (N-plane) could not grow flatly would be because a part of the ground crystal would have a high defect (dislocation) density, and therefore on that part, the crystal growth would be retarded, and another reason would be because of the influence of the warpage (<10 m) of the ground substrate.

While the present invention has been described in detail and with reference to specific embodiments thereof, it will be apparent to one skilled in the art that various changes and modifications can be made therein without departing from the spirit and scope thereof. The present application is based upon a Japanese patent application filed Feb. 22, 2013 (Patent Application 2013-33533), a Japanese patent application filed Feb. 22, 2013 (Patent Application 2013-33534) and a Japanese patent application filed Mar. 26, 2013 (Patent Application 2013-64732), and the contents thereof are incorporated herein by reference.

INDUSTRIAL APPLICABILITY

According to the present invention, there can be obtained a crystal of a nitride of a Group-13 metal on the Periodic Table that has extremely good crystallinity. Accordingly, the crystal of a nitride of a Group-13 metal on the Periodic Table of the present invention is excellent in semiconductor characteristics, and in addition to its application for light-emitting devices, the crystal is also favorably used for power semiconductor device (power devices). The industrial applicability of the present invention is high.

In addition, according to the present invention, there can be provided a production method for a crystal of a nitride of a Group-13 metal on the Periodic Table that has few crystal defects, warpage and cracks and can be prevented from cracking during processing treatment.

REFERENCE SIGNS LIST

1 Autoclave (pressure-tight vessel)
2 Autoclave Inner Surface
3 Lining
4 Wire
5 Baffle Plate
6 Crystal Growth Zone
7 Ground Substrate (seed crystal)
8 Feedstock
9 Feedstock dissolution zone
10 Valve
11 Vacuum Pump
12 Ammonia Gas ($NH_3$) Cylinder
13 Nitrogen Gas Cylinder
14 Mass Flow Meter
20 Capsule (inner cylinder)
100 Reactor
101 Pipeline for $H_2$ Carrier Gas
102 Pipeline for $N_2$ Carrier Gas
103 Pipeline for Periodic Table Group-13 Material
104 Pipeline for Nitrogen Material
105 Pipeline for Etching Gas
106 Heater
107 Susceptor
108 Exhaust Pipe
110 Seed Substrate
113 Reservoir for Periodic Table Group-13 Material
G1 $H_2$ Carrier Gas
G2 $N_2$ Carrier Gas
G3 Periodic Table Group-13 Material Gas
G4 Nitrogen Material Gas
G5 Etching Gas
200 X-Ray Source
201 X-Ray Mirror
203 Ge (220) Double Crystal Hybrid Monochromator
204 Ge (440) Four-Crystal Monochromator
205 Open Detector
250 Crystal (sample)
301 Seed Crystal
302 Growth-Inhibiting Material
303 Opening
304 Tabular Crystal
305 Main Growth Plane of Tabular Crystal
306 Side End Face of Tabular Crystal
307 Laterally-Growing Crystal

The invention claimed is:

1. A GaN crystal, having a high-resolution XRC half-value width in (200) reflection of 10 arcsec or less and a high-resolution XRC half-value width in (102) reflection of 15 arcsec or less.

2. The GaN crystal according to claim 1, which is a tabular crystal having an M-plane surface as a main surface.

3. The GaN crystal according to claim 1, having an S-parameter as measured according to a positron annihilation spectroscopy of 0.448 or more.

4. The GaN crystal according to claim 3, having a positron diffusion length ranging from 15 to 50 μm.

5. The GaN crystal according to claim 1, having a dislocation density of $5 \times 10^5$ $cm^{-2}$ or less.

6. The GaN crystal according to claim 1, which is a tabular crystal having an M-plane surface as a main surface and having a main surface area of 1 $cm^2$ or more.

7. The GaN crystal according to claim 1, having a stacking fault density (SFD) of $1 \times 10^1$ cm$^{-1}$ or less.

8. The GaN crystal according to claim 1, having an in-plane average stacking fault density (SFD) of $1 \times 10^2$ cm$^{-1}$ or less, when measured at 4 or more points arranged in line at intervals of 5 mm in one and the same plane of the GaN crystal.

9. A GaN substrate, comprising the GaN crystal according to claim 1.

* * * * *